United States Patent
Onozawa et al.

(10) Patent No.: US 7,102,598 B2
(45) Date of Patent: Sep. 5, 2006

(54) PREDRIVE CIRCUIT, DRIVE CIRCUIT AND DISPLAY DEVICE

(75) Inventors: Makoto Onozawa, Kawasaki (JP); Tomokatsu Kishi, Kawasaki (JP); Shigetoshi Tomio, Kawasaki (JP); Tetsuya Sakamoto, Kawasaki (JP); Haruo Koizumi, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 448 days.

(21) Appl. No.: 10/410,177

(22) Filed: Apr. 10, 2003

(65) Prior Publication Data

US 2003/0197696 A1  Oct. 23, 2003

(30) Foreign Application Priority Data

Apr. 19, 2002 (JP) .............................. 2002-117953
Jul. 29, 2002 (JP) .............................. 2002-220010

(51) Int. Cl.
G09G 3/28 (2006.01)
G09G 3/34 (2006.01)
G09G 3/10 (2006.01)

(52) U.S. Cl. ...................... 345/61; 345/100; 315/169.4
(58) Field of Classification Search ............ 345/60–73, 345/211–212; 315/169.1–169.4
See application file for complete search history.

(56) References Cited

U.S. PATENT DOCUMENTS 5,714,844 A * 2/1998 Sato ........................ 315/169.4
6,291,941 B1 * 9/2001 Zimlich et al. ........... 315/169.1
6,509,894 B1 * 1/2003 Maekawa et al. ............ 345/211
6,538,633 B1 * 3/2003 Ito .............................. 345/99
6,590,570 B1 * 7/2003 Maki .......................... 345/204
6,670,939 B1 * 12/2003 Yang et al. .................. 345/98
2003/0006712 A1 * 1/2003 Chae et al. .............. 315/169.1

FOREIGN PATENT DOCUMENTS

EP    1 065 650 A2    1/2001
JP    11-133378       5/1999

OTHER PUBLICATIONS

Chinese Office Action dated Jun. 10, 2005 corresponding to Chinese Application No. 03110643.9.
T. Kishi, et al. "49.4: A New Driving Technology for PDPs with Cost Effective Sustain Circuit", *SID 01 DIGEST*, pp. 1236-1239.

* cited by examiner

Primary Examiner—Richard Hjerpe
Assistant Examiner—M. Fatahiyar
(74) Attorney, Agent, or Firm—Staas & Halsey LLP

(57) ABSTRACT

A predrive circuit, a drive circuit and a display device which are capable of driving output elements so as to transmit control signals stably even when reference potentials generated on the output elements side turn to high voltage. A first level shift circuit outputs a flow signal which is an input signal according to a first level shift potential. A second level shift circuit outputs a flow signal which is the flow signal output from the first level shift circuit, according to a second reference potential. A level shift power supply circuit supplies the level shift potential based on a prescribed power supply voltage and the second reference potential to the first level shift circuit and the second level shift circuit.

31 Claims, 26 Drawing Sheets

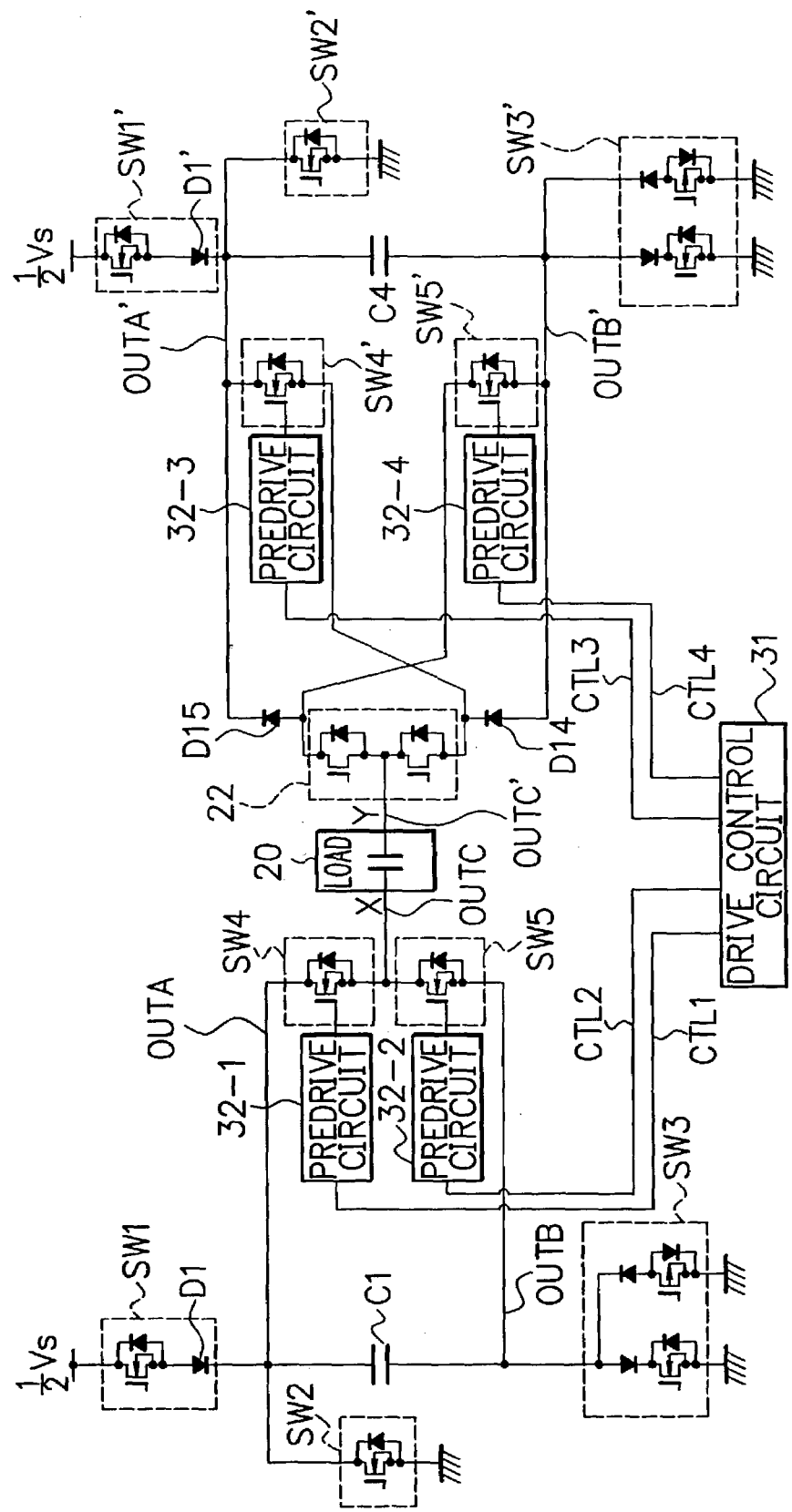
F I G. 1

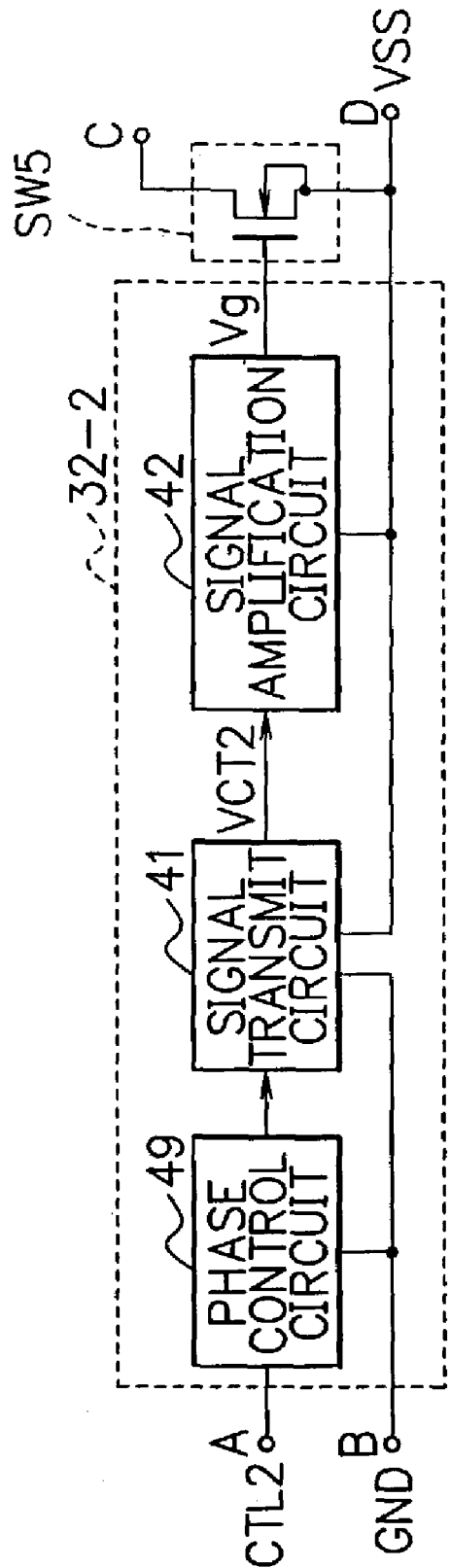

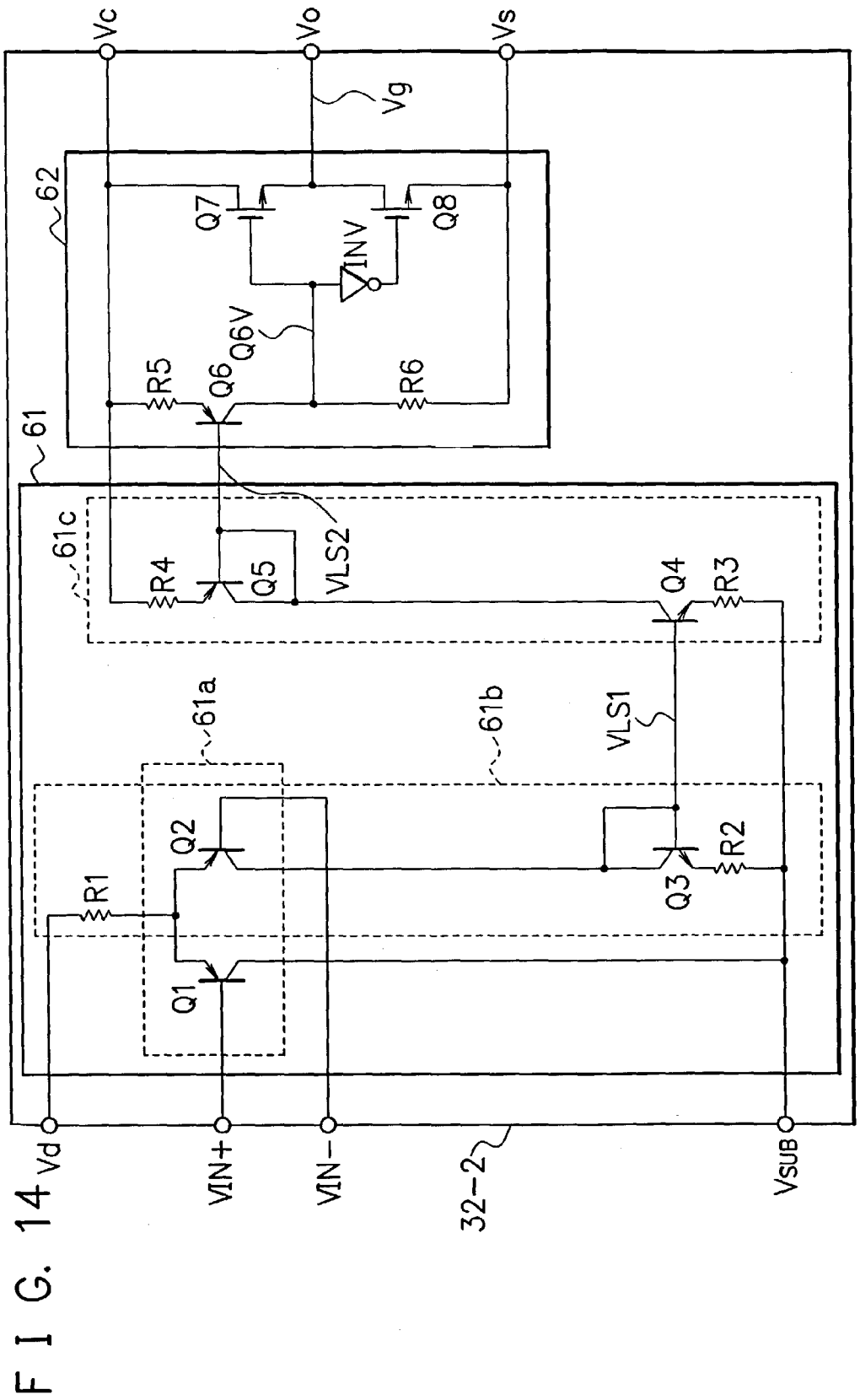
F I G. 14

RECTANGULAR WAVE  →  RAMP WAVE

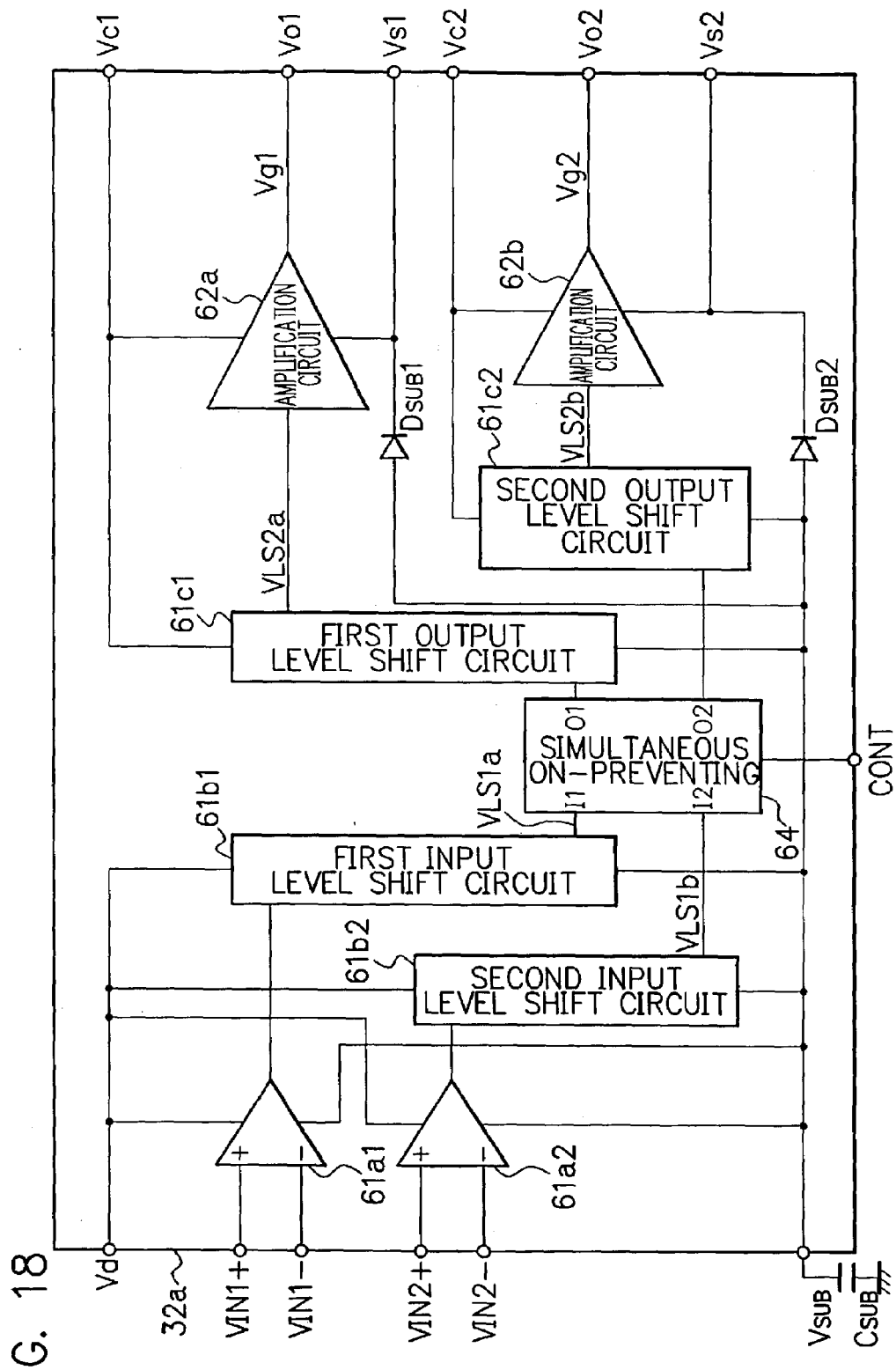
F I G. 18

US 7,102,598 B2

PREDRIVE CIRCUIT, DRIVE CIRCUIT AND DISPLAY DEVICE

CROSS-REFERENCE TO RELATED APPLICATIONS

This application is based upon and claims the benefit of priority from the prior Japanese Patent Application Nos. 2002-117953, filed on Apr. 19, 2002 and 2002-220010, filed on Jul. 29, 2002, the entire contents of which are incorporated herein by reference.

BACKGROUND OF THE INVENTION

1. Field of the Invention

The present invention relates to a predrive circuit which drives output elements such as power MOS (Metal-Oxide Semiconductor) FET and IGBT (Insulated Gate Bipolar Transistor), and a display device using the predrive circuit.

2. Description of the Related Art

Conventionally, "A New Driving Technology for PDPs with Cost Effective Sustain Circuit" has been disclosed in the "SID 01 DIGEST", page 1236–1239, as a method of reducing circuit cost of plasma display device, which is one of the flat panel display devices. As a similar reference, Japanese Patent Application Laid-open No. 2002-062844 (Patent No. 3201603) has disclosed substantially the same contents.

Furthermore, for example, one of the plasma display devices, AC-Plasma Display Panel (AC-PDP) is classified into a 2-electrode type which carries out selection (address) discharge and sustaining discharge by two electrode, and a 3-electrode type which carries out address discharge using a third electrode. Generally, there have been two structure types for the above 3-electrode type. The one type has the third electrode being formed on a same side of the substrate that includes a first electrode and a second electrode which carries out sustaining discharge. Another type has the third electrode being formed on the other side of the substrate.

Since both the PDP devices described above are based on a same principle of operation, the structure of the 3-electrode type with the first electrode and the second electrode being formed on a first substrate and with the third electrode being formed on a second substrate will be explained below.

FIG. 22 is a diagram showing an overall structure of an AC-PDP device. The AC-PDP device 1 in FIG. 22 comprises plural cells, each cell representing one pixel of a displayed image and being arranged in a matrix form. The respective cells are arranged in a matrix with m rows and n columns, as can be seen by cells Cmn in the drawing. Additionally, in the AC-PDP device 1, scan electrode Y1 to Yn and common electrodes X are installed in parallel to each other on the first substrate, and address electrodes A1 to Am are installed orthogonally to these electrodes Y1 to Yn and electrodes X on the second substrate oppose the first substrate. The common electrodes X are arranged adjacent to the respective scanning electrodes Y1 to Yn, and one ends of which are connected to each other.

A common terminal of the common electrodes X is connected to an output terminal of an X-side circuit 2, and the scanning electrodes Y1 to Yn are respectively connected to output terminals of a Y-side circuit 3. The address electrodes A1 to Am are connected to output terminals of an address-side circuit 4. The X-side circuit 2 comprises a circuit that conducts discharge continuously. The Y-side circuit 3 comprises a circuit that conducts line-sequential scanning and a circuit that discharges continuously. The address-side circuit 4 comprises a circuit that selects which column to display.

These X-side circuit 2, Y-side circuit 3, and address-side circuit 4 are controlled by control signals supplied from a drive control circuit 5. Namely, the address-side circuit 4 and the circuit which conducts line-sequential scanning in the Y-side circuit determine which cell to be lighted. Then the X-side circuit 2 and the Y-side circuit 3 conduct discharge continuously to carry out a display operation of the PDP device.

The drive control circuit 5 generates the control signals based on a display data D, a clock CLK which indicates a timing to read the display data D, a horizontal synchronization signal HS, and a vertical synchronization signal VS, all being supplied externally. Then these control signals will be supplied to the X-side circuit 2, the Y-side circuit 3, and the address-side circuit 4.

FIG. 23A is a diagram showing a cross sectional structure of a cell at row i and column j as one pixel. In FIG. 23A, a common electrode X and a scan electrode Yi are formed on a front glass substrate 11. Over them, a dielectric layer 12 is deposited as insulation against a discharge space 17. Further, an MgO (magnesium oxide) protective film 13 is deposited over the dielectric layer 12.

On the other hand, an address electrode Aj is formed on a rear glass substrate 14 which is placed oppose the front glass substrate 11. Over the electrode Aj, there is deposited a dielectric layer 15. Further, a phosphor 18 is deposited over the dielectric layer 15. Ne+Xe penning gas or the like is enclosed between the MgO protective film 13 and the dielectric layer 15.

FIG. 23B is a diagram for describing a capacity Cp of the AC-PDP device. As shown in FIG. 23B, there are capacitive components Ca, Cb, and Cc in the discharge space 17, between the common electrode X and the scan electrode Yi, and on the front glass substrate 11, respectively. By adding these capacitive components, a capacity Cpcell of a cell will be defined (Cpcell=Ca+Cb+Cc). A sum of the capacity Cpcell of every cell defines a panel capacity Cp.

FIG. 23C is a diagram for describing an emission of fluorescence of the AC-PDP device. As shown in FIG. 23C, red, blue, and green phosphors 18 are arranged in a stripe pattern and painted between ribs 16. The phosphor 18 emits fluorescence when it is excited by discharge between the common electrode X and the scan electrode Y.

As one method of driving such AC-PDP device, use of a driving system shown in FIG. 24 is suggested. This device conducts discharge between electrodes utilizing a potential difference produced by applying a positive voltage to one electrode and a negative voltage to the other electrode.

FIG. 24 is a diagram showing a circuitry example of the driving system of the AC-PDP device.

In FIG. 24, a capacitive load 20 (hereinafter, referred to as a "load 20") is a sum of capacity of every cell being formed between one common electrode X and one scan electrode Y. The common electrode X and the scan electrode Y are formed on the load 20. Here, scan electrode Y is any electrode of the scan electrodes Y1 to Yn.

First, on the common electrode X side, switches SW1 and SW2 are connected serially between a power supply line of voltage (Vs/2) supplied from a power supply not shown in the diagram and ground (GND). A point of interface between the two switches SW1 and SW2 is connected to one terminal of a capacitor C1, and a switch SW3 is connected between the other terminal of the capacitor C1 and the GND.

Switches SW4 and SW5 are connected serially to the both terminal of the capacitor C1. Then a point of interface between these switches SW4 and SW5 is connected to the common electrode X of the load 20 through an output line OUTC from its middle and further connected to a power recovery circuit 21. A switch SW6 with a resistor R1 is connected between a second signal line OUTB and a power supply line which generates a write voltage Vw.

The power recovery circuit 21 comprises two coils L1 and L2 which are both connected to the load 20, a diode D2 and a transistor Tr1 which are both connected serially to one coil L1, and a diode D3 and a transistor Tr2 which are both connected serially to the other coil L2. Furthermore, the power recovery circuit 21 comprises a capacitor C2 which is connected between a point of interface of the two transistors Tr1 and Tr2, and the second signal line OUTB.

Then there are configured two systems of serial resonance circuits by the capacitive load 20 and the coils L1 and L2 which are both connected to this load 20. In other words, this power recovery circuit 21 has two systems of L-C resonance circuit supplying an electric charge to the panel by resonance between the coil L1 and the load 20, and recovering the electric charge by resonance between the coil L2 and the load 20.

On the other hand, on the scan electrode Y side, switches SW1' and SW2' are connected serially between a power supply line of voltage (Vs/2) supplied from a power supply not shown in the diagram and the GND. A point of interface between these two switches SW1' and SW2' is connected to one terminal of a capacitor C4, and a switch SW3' is connected between the other terminal of this capacitor C4 and the GND.

A switch SW4' which is connected to the one terminal of the capacitor C4 is connected to a cathode of a diode D7. An anode of the diode D7 is connected to the other terminal of the capacitor C4. A switch SW5' which is connected to the other terminal of the capacitor C4 is connected to an anode of a diode D6. A cathode of the diode D6 is connected to the one terminal of the capacitor C4.

Then, one end of the switch SW4' which is connected to the cathode of the diode D7 and one end of the switch SW5' which is connected to the anode of the diode D6 are both connected to the load 20 through a scan driver 22, and further connected to a power recovery circuit 21'. A switch SW6' with a resistor R1' is connected between a fourth signal line OUTB' and a power supply line which generates a write voltage Vw.

The power recovery circuit 21' comprises two coils L3 and L4 which are both connected from the load 20 through the scan driver 22, a diode D4 and a transistor Tr3 which are both connected serially to one coil L3, and a diode D5 and a transistor Tr4 which are both connected serially to the other coil L4. Furthermore, the power recovery circuit 21' comprises a capacitor C3 which is connected between a common terminal of the transistors Tr3 and Tr4, and the fourth signal line OUTB'.

This power recovery circuit 21' also has two systems of L-C resonance circuit, supplying an electric charge by resonance between the coil L4 and the load 20, and recovering this electric charge by resonance between the coil L3 and the load 20.

In addition to the above configuration, the scan electrode Y side also comprises three transistors Tr5, Tr6, and Tr7, and two diodes D6 and D7. When the transistor Tr5 is turned on, an effect of a resistor R2 connected to this transistor slacks a waveform of a pulse voltage which is applied to the scan electrode Y. The transistor Tr5 and resistor R2 are connected in parallel to the switch SW5'.

The transistors Tr6 and Tr7 also have a purpose of applying a potential difference of (Vs/2) to both ends of the scan driver 22 during an address period which will be described later. When the switch SW2' and the transistor Tr6 are both turned on, a voltage of a topside of the scan driver 22 becomes ground level. When the transistor Tr7 is turned on, a negative voltage (−Vs/2) which is output to the fourth signal line OUTB' according to an electric charge stored in the capacitor C4 will be applied to a downside of the scan driver 22. That enables the scan driver 22 to apply the negative voltage (−Vs/2) to the scan electrode Y when a scan pulse is output.

The above-mentioned switches SW1 to SW6, SW1' to SW6' and transistors Tr1 to Tr7 are controlled by control signals respectively supplied from a drive control circuit 31. The drive control circuit 31 is configured using a logic circuit, etc., and it generates the control signals based on a display data D, a clock CLK, a horizontal synchronization signal HS, and a vertical synchronization signal VS, all being supplied externally. Then these control signals will be supplied to the switches SW1 to SW6, SW1' to SW6', and the transistors Tr1 to Tr7.

FIG. 24 only shows control lines from the drive control circuit 31 which are connected to the switches SW4, SW5, SW4', SW5', and transistors Tr1 to Tr4. However, the other switches SW1 to SW6, SW1' to SW6', and transistors Tr1 to Tr7 are also connected to the drive control circuit 31 by control lines.

FIG. 25 is a time chart showing drive waveforms of the driving system of the AC-PDP device as configured in FIG. 24 and it shows one sub-field among plural sub-fields which compose one frame. One sub-field is divided into a reset period which includes a total write period and a total erase period, an address period, and a sustain discharge period.

In FIG. 25, during the reset period, the switches SW2 and SW5 are turned on, while the switches SW1, SW3, SW4, and SW6 are turned off on the common electrode X side. Accordingly, a voltage of the signal line OUTB decreases to the voltage (−Vs/2) according to an electric charge stored in the capacitor C1. Then the voltage (−Vs/2) is output to the output line OUTC through the switch SW5 and applied to the common electrode X.

On the other hand, on the scan electrode Y side, the switches SW1', SW4', and SW6' are turned on, while the switches SW2', SW3', and SW5' are turned off. Then a sum of the voltage Vw and a voltage (Vs/2) stored in the capacitor C4 is applied to the output line OUTC'. Accordingly, this voltage (Vs/2+Vw) is applied to the scan electrode Y of the load 20. At this time, by an effect of the resistor R1' in the switch SW6', the voltage gradually increases over time.

As a result, a potential difference between the common electrode X and the scan electrode Y becomes (Vs+Vw), causing discharge on all cells of all display lines regardless of a prior display status, and there are formed wall charges (total write).

Next, the voltage of the common electrode X and the scan electrode Y are returned to the ground level by controlling each switches appropriately, to reverse the status of the common electrode Y side and the scan electrode X side. Namely, on the common electrode X side, the switches SW1, SW4, and SW6 are turned on while the switches SW2, SW3, and SW5 are turned off, and on the scan electrode Y side, the switches SW2' and SW5' are turned on while the switches SW1', SW3', SW4', and SW6' are turned off.

Then the applied voltage of the common electrode X increases gradually over time from the ground level to the voltage (VS/2+Vw), while the applied voltage of the scan electrode Y decreases to the voltage (−Vs/2). Accordingly, the voltages of their wall charges of all cells reach and exceed the firing potential to thereby start discharge. At this time, by gradually increasing the applied voltage to the common electrode X over time as mentioned above, weak discharge is conducted so as to erase the wall charges except some part (total erase).

Next, during the address period, line-sequential address discharge is conducted in order to turn on and/or off each cell according to the display data. At this time, on the common electrode X side, the switches SW1, SW3, and SW4 are turned on, and the switches SW2, SW5, and SW6 are turned off, thereby increasing a voltage of a first signal line OUTA to a voltage (Vs/2) which is supplied through the switch SW1. This voltage (Vs/2) is output to the output line OUTC through the switch SW4 and applied to the common electrode X on the load 20.

When applying a voltage to a scan electrode Y which corresponds to one display line, the switch SW2' and the transistor Tr6 are turned on, so that the voltage of the topside of the scan driver 22 becomes ground level. Then the transistor Tr7 is turned on to apply the negative voltage (−Vs/2), which is output to the fourth signal line OUTB' according to the electric charge stored in the capacitor C4, will be applied to the downside of the scan driver 22. Consequently, the negative voltage (−Vs/2) is applied to the scan electrodes Y on the load 20 which are line-sequentially selected, and the ground level voltage is applied to the scan electrodes Y on the load 20 which are not line-sequentially selected.

At this time, address pulses of voltage Va are selectively applied to address electrodes Aj between address electrodes A1 to Am, corresponding to cells which conduct sustaining discharge, i.e., cells to be lighted. Then discharges occur between the address electrodes Aj of the cells to be lighted and the line-sequentially selected scan electrodes Y. Using these discharges as priming, other discharges occur immediately between the common electrodes X and the scan electrodes Y. As a result, wall discharges needed for next sustaining discharges are stored in the MgO protective film above the common electrodes X and the scan electrodes Y of the selected cells.

Next, during the sustain discharge period, on the common electrode X side, the switches SW1 and SW3 are turned on first, while the other switches SW2 and SW4 to SW6 are turned off. The voltage of the first signal line OUTA becomes (+Vs/2), and the voltage of the second signal line OUTB becomes ground level. The transistor Tr1 in the power recovery circuit 21 is turned on to conduct L-C resonance between the coil L1 and the load 20, and then the electric charge stored in the capacitor C2 is supplied to the load 20 through the transistor Tr1, the diode D2, and the coil L1.

An electric current which is supplied from the capacitor C2 to the common electrode X through the switch SW3 on the common electrode X side is further supplied to the GND of the scan electrode Y side through a diode in the scan driver 22, the diode D6, a third signal line OUTA', and the switch SW2' by turning on the switch SW2'. This electric current flow causes the voltage of the common electrode X to increase gradually as shown in FIG. 25. At around a peak voltage which occurs during this resonance, the SW4 is turned on to clamp the voltage of the common electrode X on the voltage (Vs/2).

On the scan electrode Y side, the transistor Tr3 in the power recovery circuit 21' is turned on. Then L-C resonance occurs between the coil L3 and the load 20, so that an electric current, which is supplied from the switch SW3 and the capacitor C1 to the electrode X through the first signal line OUTA and the switch SW4 on the common electrode X side, is supplied to the GND of the scan electrode Y side through the diode in the scan driver 22, the diode D4 in the power recovery circuit 21', and further through the transistor Tr3, the capacitor C3, the capacitor C4, and the switch SW2'. This electric current flow causes the voltage of the scan electrode Y to decrease gradually as shown in FIG. 25. At this time, a part of the electric charge is recovered in the capacitor C3. At around a peak voltage which occurs during this resonance, the switch SW5' is turned on to clamp the voltage of the scan electrode Y on the voltage (−Vs/2).

Similarly, when the applied voltage (−Vs/2) of the common electrode X and the scan electrode Y are increased to the ground level (0(zero) V), the applied voltage is increased gradually by supplying the electric charges recovered in the capacitor C2 and C3 in the power recovery circuit 21 and 21'.

On the other hand, when the applied voltage (Vs/2) of the common electrode X and the scan electrode Y are decreased to the ground level (0(zero) V), the applied voltage is decreased gradually by supplying the electric charge stored in the load 20 to the GND, and a part of the electric charge is recovered to each capacitor C2, C3 in the power recovery circuit 21 and 21'.

As described above, during the sustain discharge period, the sustaining discharge is conducted by alternatively applying the voltages with different polarity (+Vs/2, −Vs/2) to the common electrode X and the scan electrode Y of each display line, in order to display one sub-field of a picture.

Additionally, in the driving circuit of the AC-PDP device, the drive control circuit 31 which is configured by logic circuits, etc., has a reference potential of the GND level. This drive control circuit 31 supplies control signals to output elements, in other words, the switches SW4, SW5, SW4' SW5', and transistors Tr1 to Tr4 in the power recovery circuit 21 and 21', so that they apply the voltages to the common electrode X and the scan electrode Y. However, reference potentials for these output elements will change according to the driving operation. Accordingly, there has been a problem such as, for example, when the drive control circuit 31 generates the control signals and supplies them to the output elements, there is a possibility of a back flow of a voltage variation from the output elements to the drive control circuit 31, thereby impressing a high voltage.

As a solution to solve this problem, conversion of the reference potentials by level shifting the control signals output from the control circuit using a level shift circuit is conceivable. For example, a method of using a predrive circuit between the drive control circuit 31 and the output elements will be explained. This predrive circuit outputs control signals with converted reference potentials to the output elements which apply voltage. In particular, this predrive circuit level shifts the reference potentials of the control signals according to the reference potentials of the output elements (−Vs/2 to Vs/2), thereby outputting these level-shifted control signals to the output elements.

FIG. 26 is a diagram showing an example of the predrive circuit which corresponds to a variation of the reference potential of the output elements side. This predrive circuit P1 shown in FIG. 26 is an integrated circuit (semiconductor circuit) which will be inserted between the drive control circuit 31 and the switch SW4 as an output element shown in FIG. 24. In FIG. 26, an amplification/level shift circuit P10 level shifts and amplifies a reference potential (GND) of a control signal CLT1 which is output from the drive control circuit 31 to the reference potential of the output elements side (−Vs/2 to Vs/2). The output circuit P11 drives the switch SW4 according to the signal output from the amplification/level shift circuit P10.

An input terminal of the amplification/level shift circuit P10 is connected to an input terminal VIN of the predrive circuit P1, in which the control signal CTL1 is input. A p-type substrate P13 is a semiconductor substrate to which a p-type impurity is added. The substrate P13 is connected to a reference potential terminal K1 of the predrive circuit P1, in which the reference potential (GND) of the control signal CTL1 is input.

The output circuit P11 is also configured by n-channel MOSFETs Tr11 and Tr12, and an inverter circuit INV13 as shown in FIG. 26. The Tr11 is a transistor which is turned on and/or off by control signals output from the amplification/level shift circuit P10, which controls whether or not to output a voltage Vcc supplied from a power supply terminal V1 to the output terminal Vo. The Tr12 is a transistor which is turned on and/or off by the control signals supplied from the amplification/level shift circuit P10 and inverted by the INV13, which controls whether or not to output a reference potential (−Vs/2 to Vs/2) supplied from a reference potential terminal K2.

A parasitic diode 12 visually represents a parasitic diode which is generated at a pn junction point formed by a part of the substrate P13 and a part of the Tr12. Through the parasitic diode 12, the substrate P13 is connected to the reference potential terminal K2 to which the reference potential (−Vs/2) of the control signal output from the predrive circuit P1 is applied. An anode terminal of the parasitic diode is connected to the substrate P13.

However, in the driving circuit of the AC-PDP device, the drive control circuit 31 which is configured by logic circuits, etc., has a reference potential of the GND level. This drive control circuit 31 supplies control signals to output elements, in other words, the switches SW4, SW5, SW4' SW5', and the transistors Tr1 to Tr4 in the power recovery circuit 21 and 21', so that they apply the voltages to the common electrode X and the scan electrode Y. However, reference potentials for these output elements will change according to the driving operation. Accordingly, for example, when the drive control circuit 31 generates the control signals and supplies them to the output elements, there is a possibility of a back flow of a voltage variation from the output elements to the drive control circuit 31, thereby impressing a high voltage.

As a solution to solve this problem, conversion of the reference potentials by level shifting the control signals output from the control circuit using a level shift circuit is conceivable. However, there has been a problem of using generally available level shift circuits. By using these circuits, there is a possibility that the control signals would not be transmitted adequately when the reference potentials generated on the output elements side turn to high voltage.

In addition, as described above, when supplying the control signals generated by the drive control circuit 31 to the output elements, there is a possibility that a high voltage is impressed to the drive control circuit 31 due to the voltage variation of the output elements, so that the control signals would not be stably transmitted to the output elements.

To prevent the high voltage impression to the drive control circuit 31, the above described predrive circuit P1 can generate control signals, based on the control signals having reference potential of 0(zeoro) V, in order to drive the switch SW4 whose reference potential changes from −Vs/2 to Vs/2. However, there has been a problem when the GND is applied to the reference potential terminal K1, and the negative voltage −Vs/2 is applied to the reference potential terminal K2, it is possible that an abnormal current Ip, due to the parasitic diode 12, occurs and disturbs the normal operation of the predrive circuit P1.

The present invention has been made considering the problems described above, and its object is to provide a predrive circuit, a drive circuit, and a display device which are capable of driving the output elements so as to transmit the control signals stably even when the reference potentials generated on the output elements side turn to high voltage.

The present invention has been made considering the problems described above, and its object is to provide a predrive circuit and a display device which are capable of driving the output elements so as to transmit the control signals stably even when the reference potentials generated on the output elements side turn to high voltage.

Another object of the present invention is to provide a predrive circuit and a display device both of which are suitable for an integrated circuit which is capable to operate normally even when the reference potentials generated on the output elements side turn to negative voltages.

SUMMARY OF THE INVENTION

The present invention is made to solve aforementioned problems, and a predrive circuit according to the present invention is so characterized as to drive an output element having a second reference potential which is different from a first reference potential of an input signal. The predrive circuit comprises a signal transmit circuit for converting the input signal having the first reference potential to a signal corresponding to the second reference potential and outputting the signal to the output element.

By adopting the predrive circuit of the present invention configured as above, when the reference potential of the input signal is different from the reference potential of the output element as an object to be driven, the predrive circuit can output a signal based on the input signal and having the reference potential corresponding to the second reference potential, which is the reference potential of the output element, by processing through the signal transmit circuit.

Furthermore, the predrive circuit according to the present invention is so characterized as to drive the output element having the second reference potential which is different from the first reference potential of the input signal. The predrive circuit comprises a comparison circuit for comparing the input signal with a reference voltage signal as a reference for comparison, an input level shift circuit for converting the input signal having the first reference potential, according to a result of comparison, to a second signal corresponding to the substrate potential and outputting this second signal, an output level shift circuit for converting the second signal output from the input level shift circuit to a third signal corresponding to the output power supply voltage and outputting this third signal, and a signal amplification circuit for amplifying the third signal output from the output level shift circuit to a drive signal for driving the output element.

BRIEF DESCRIPTION OF THE DRAWINGS

FIG. 1 is a diagram showing a configuration example of a driving system of an AC-PDP based on a first embodiment;

FIG. 7 is a block diagram showing another configuration example of the predrive circuit 32-2;

FIG. 14 is a diagram showing a circuitry of the predrive circuit 32-2 shown in FIG. 13;

FIG. 18 is a diagram showing a schematic configuration of a predrive circuit 32a as a fourth embodiment;

FIG. 20 is a diagram showing a schematic configuration of a driving system which is configured with an IC-configured predrive circuit 32a;

DETAILED DESCRIPTION OF THE PREFERRED EMBODIMENTS

As one example of a display device with predrive circuits representing one embodiment of the present invention, an embodiment of a plasma display panel will be explained with reference to the drawings.

First Embodiment

Figure 22:
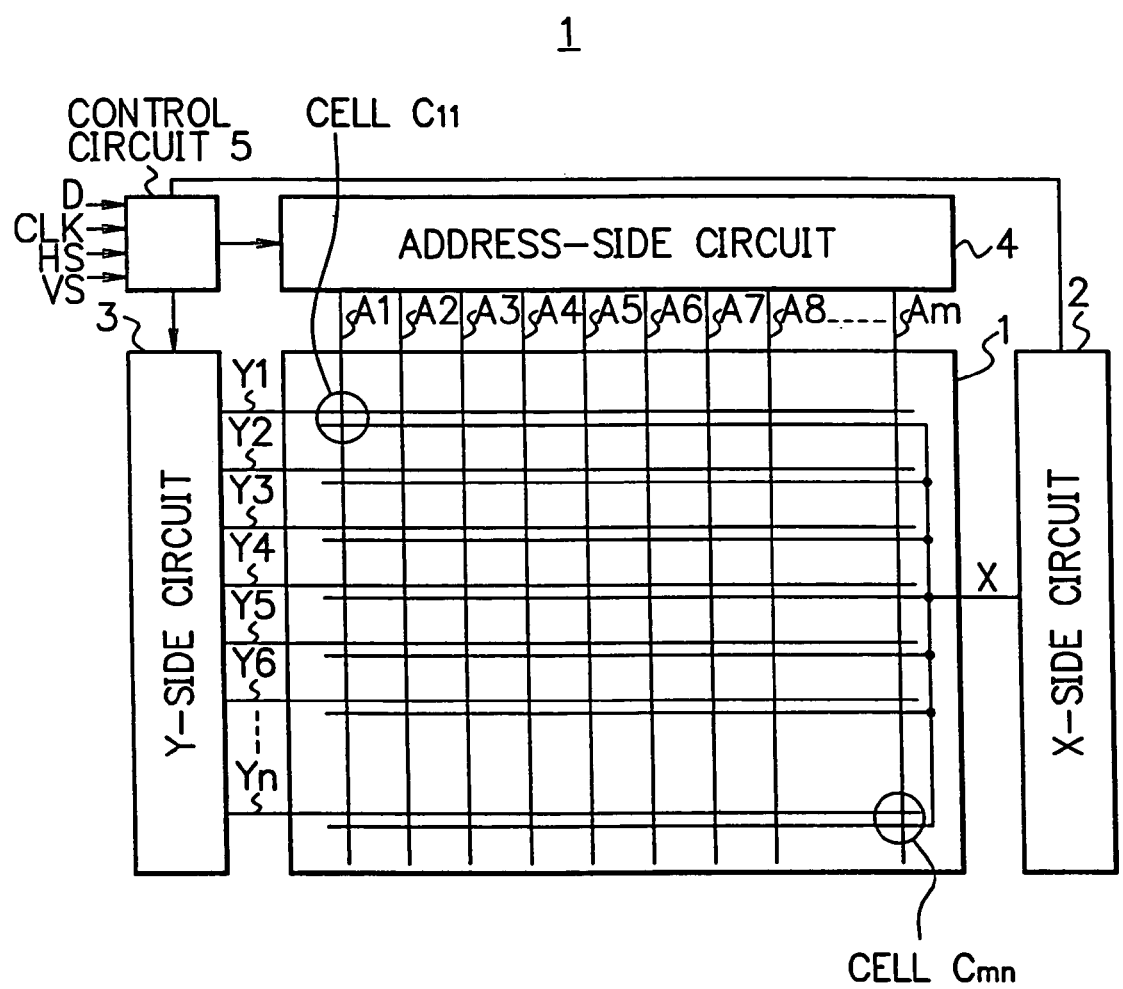
FIG. 22 is a diagram showing an overall structure of a conventional AC-PDP device.
Figure 23A:
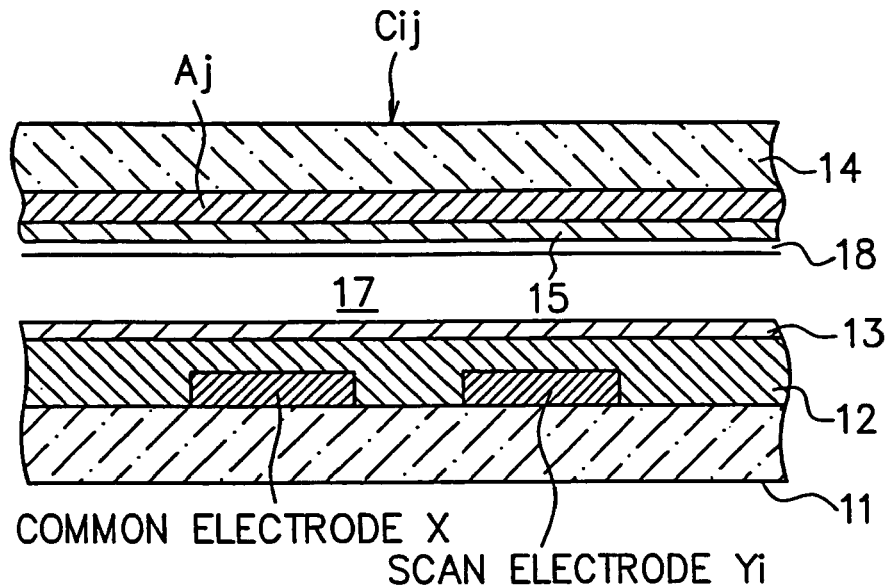
FIG. 23A is a diagram showing a cross sectional structure of a cell at row i and column j as one pixel in the conventional AC-PDP device.
Figure 23B:
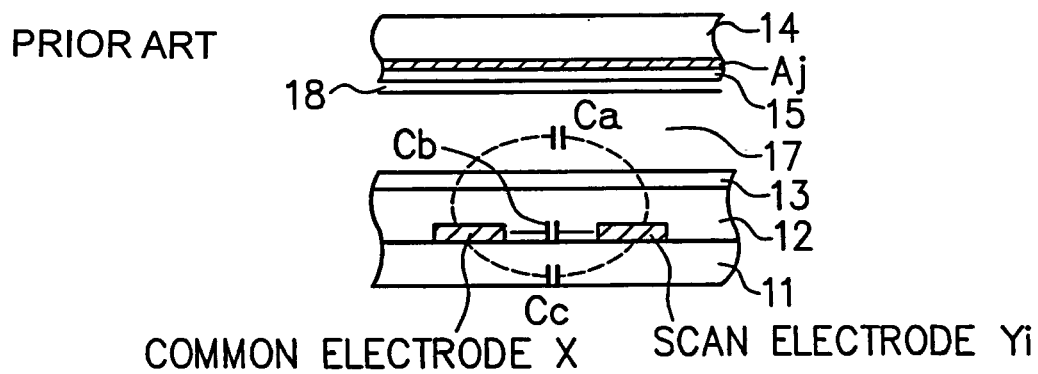
FIG. 23B is a diagram for explaining a capacity of the conventional AC-PDP device.
Figure 23C:
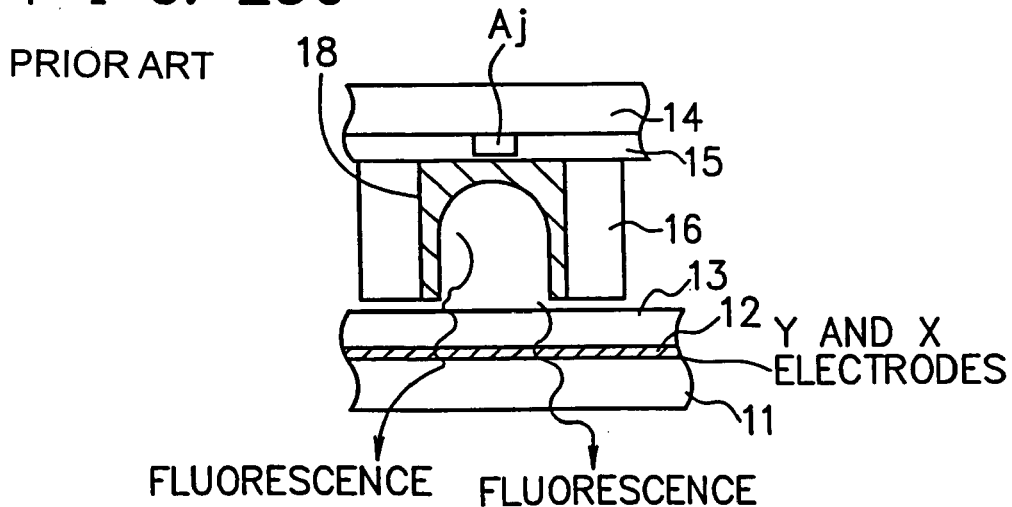
FIG. 23C is a diagram for explaining an emission of fluorescence of the AC-PDP device.

FIG. 1 is a diagram showing a configuration example of a driving system of an AC-PDP based on a first embodiment. Further, the driving system of this embodiment shown in FIG. 1, can be applied to, for example, the AC-PDP device with the overall configuration shown in FIG. 22, and a configuration of one cell which configures one pixel shown in FIG. 23A to FIG. 23C. Additionally, in this FIG. 1, components to which the same reference numerals are designated as those in FIG. 24 exhibit the same functions.

In FIG. 1, a load 20 is a sum of capacity of every cell being formed between one common electrode X and one scan electrode Y. The common electrode X and the scan electrode Y are formed on the load 20.

On the common electrode X side, switches SW1 and SW2 are connected serially between a power supply line of voltage (Vs/2) supplied from a power supply not shown in the diagram and a ground (GND). A point of interface between the two switches SW1 and SW2 is connected to one terminal of a capacitor C1, and a switch SW3 is connected between the other terminal of the capacitor C1 and the GND.

Switches SW4 and SW5 are connected serially to the both terminals of the capacitor C1. The switch SW4 is connected to the one terminal of the capacitor C1 through a first signal line OUTA, and the switch SW5 is connected to the other terminal of the capacitor C1 through a second signal line OUTB. A point of interface between these two switches SW4 and SW5 is connected to the common electrode X of the load 20 through an output line OUTC.

On the other hand, on the scan electrode Y side, switches SW1' and SW2' are connected serially between a power supply line of voltage (Vs/2) supplied from a power supply not shown in the drawing and the GND. A point of interface between these two switches SW1' and SW2' is connected to one terminal of a capacitor C4, and a switch SW3' is connected between the other terminal of this capacitor C4 and the GND.

A switch SW4' which is connected to the one terminal of the capacitor C4 through a third signal line OUTA' is connected to a cathode of a diode D14. An anode of the diode D14 is connected to the other terminal of the capacitor C4. A switch SW5' which is connected to the other terminal of the capacitor C4 through a fourth signal line OUTB' is connected to an anode of a diode D15. A cathode of the diode D15 is connected to the one terminal of the capacitor C4. Then one end of the switch SW4' which is connected to the cathode of the diode D14 and one end of the switch SW5' which is connected to the anode of the diode D15 are both connected to the common electrode X of the load 20 through a scan driver 22.

Incidentally, while only the scan driver 22 is shown in FIG. 1, there are plural scan drivers naturally installed for each of the plural display lines in actual PDP. Other circuits are common circuits installed for all of the plural display lines.

A drive control circuit 31 is configured by logic circuits, etc., and its purpose is to control the switches SW1 to SW5 and SW1' to SW5' which configure this driving system. In other words, the drive control circuit 31 generates control signals to control these switches SW1 to SW5 and SW1' to SW5' based on a display data, a clock, a horizontal synchronization signal, and a vertical synchronization signal, all being supplied externally. Then the drive control circuit 31 supplies these control signals to each of the switches SW1 to SW5 and SW1' to SW5'.

FIG. 1 only shows control lines CTL1 to CTL4 which supply the control signals from the drive control circuit 31 to predrive circuits 32-1, 32-2, 32-3, and 32-4, each predrive circuit being connected to the switches SW4, SW5, SW4', and SW5', respectively. However, there are other control lines, which supply the control signals from the drive control circuit 31, connected to each of the switches SW1 to SW3 and SW1' to SW3'.

The predrive circuits 32-1 to 32-4 convert voltage levels of the control signals, which are supplied from the drive control circuit 31 through the control lines CTL1 to CTL4 and based on the reference potentials (e.g. ground level) of the drive control circuit 31, to voltage levels of the reference potentials of the switches SW1 to SW3 and SW1' to SW3', and then supply these control signals to each of the switches. Further details of the predrive circuits 32-1 to 32-4 will be explained later.

Next, an operation of the driving system will be explained with reference to FIG. 2.

Figure 2:
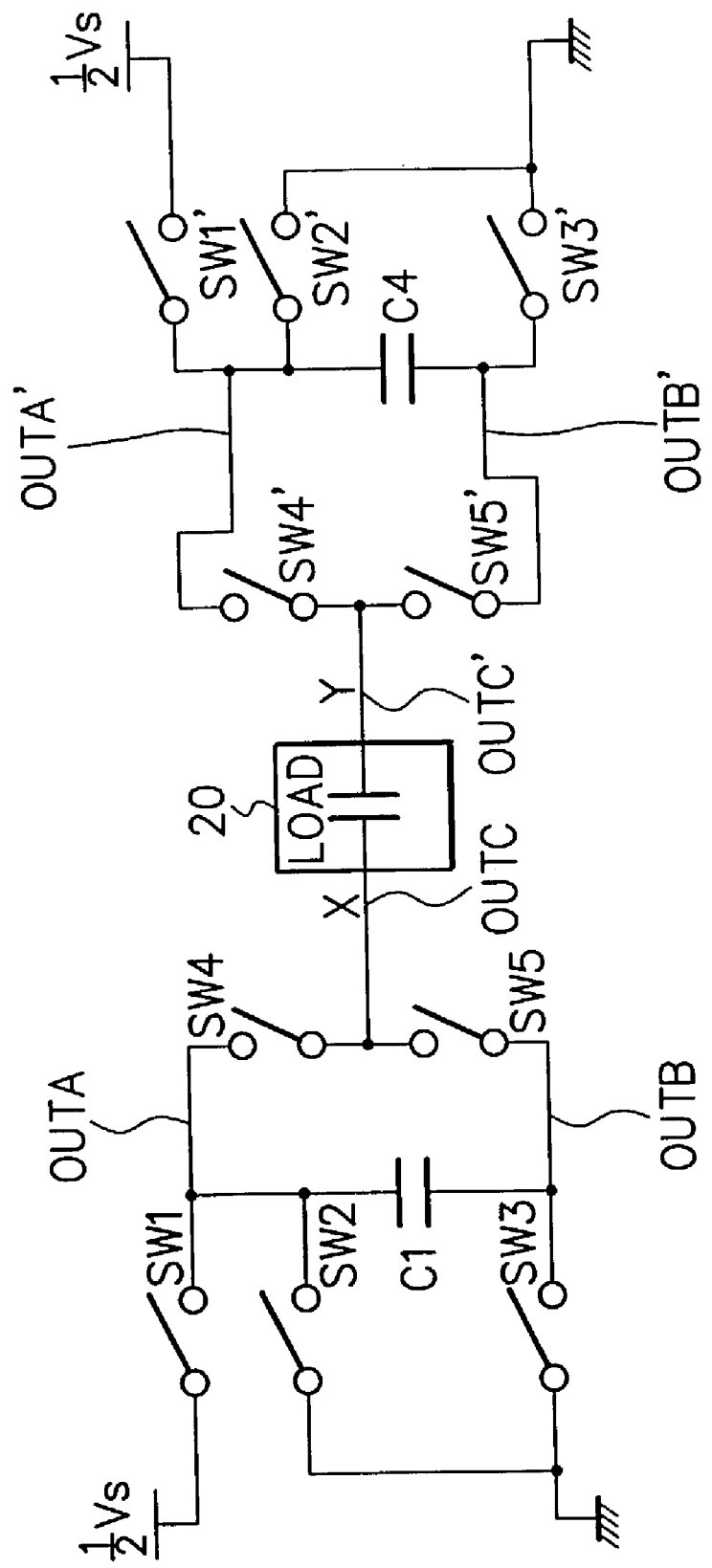
FIG. 2 is a conceptual diagram for explaining an operation of the driving system of the AC-PDP shown in FIG. 1.

FIG. 2 is a conceptual diagram for explaining the operation of the driving system of the AC-PDP shown in FIG. 1. In this FIG. 2, components to which the same reference numerals are designated as those in FIG. 1 exhibit the same functions, so that the repeated description will be omitted.

In FIG. 2, the two switches SW1 and SW3 on the common electrode X side are turned on, and the other switches SW2, SW4, and SW5 are turned off, so that the voltage of the first signal line OUTA will reach voltage level (+Vs/2) which is supplied through the switch SW1 from a power supply not shown in the drawing. After that, the switch SW4 is turned on, and the switches SW4' and SW2' on the scan electrode Y side are also turned on, in order to apply the voltage (+Vs/2) of the first signal line OUTA to the common electrode X on the load 20 through the output line OUTC, thereby the voltage (Vs/2) is applied between the common electrode X and the scan electrode Y.

At this stage, because the switches SW1 and SW3 are turned on, the capacitor C1 is connected to the power supply not shown in the drawing, so the voltage (Vs/2) supplied from the power supply not shown in the drawing through the switches SW1 and SW3 will be stored in the capacitor C1.

Next, the switch SW4 is turned off to interrupt the current route to apply the voltage. The switch SW5 is temporary turn on in pulse form so that the voltage of the output line OUTC is decreased to the ground level. After the switch SW2 is turned on while the other four switches SW1, SW3, SW4, and SW5 are turned off, the switch SW4 is temporary turn on in pulse form. This switch SW4 being turned-on presents the current route for the common electrode X (ground) to apply the voltage to the scan electrode Y.

While the switch SW2 is kept turned-on, the switch SW5 is turned on. At this time, the voltage of the first signal line OUTA is the ground level because the power supply voltage will not be supplied through the SW1 from the power supply not shown in the drawing. Meanwhile, on the second signal line OUTB, since the switch SW2 is turned on, the first signal line OUTA is grounded. Then the voltage of the second signal line OUTB will be decreased by the electric charge stored in the capacitor C1 (Vs/2) from the ground level to potential (−Vs/2).

At this time, since the switch SW5 is turned on, the voltage (−Vs/2) of the second signal line OUTB is applied to the load 20 through the output line OUTC. Meanwhile, the switched SW'3 and SW4' on the scan electrode Y side are turned on, so that the voltage (−Vs/2) of the common electrode X side is applied to the scan electrode Y (Vs/2) side.

Next, the switches SW2 and SW4 are turned on, while the other switches SW1, SW3, and SW5 are turned off. Accordingly, the voltage of the output line OUTC is increased to the ground level. After that, similarly to the first stage, the three switches SW1, SW3, and SW4 are turned on while the other switches SW2 and SW5 are turned off, and the same procedure will be repeated afterwards.

As describe above, the positive voltage (+Vs/2) and the negative voltage (−Vs/2) are alternatively applied to the common electrode X on the load 20. On the other hand, by conducting the same switching controls as the common electrode X side, the positive voltage (+Vs/2) and the negative voltage (−Vs/2) are alternatively applied to the scan electrode Y on the load 20.

The voltage (+Vs/2) and (−Vs/2) which are respectively applied to the common electrode X and scan electrode Y are applied in the way that the phase of the voltage is reversed to each other. Namely, when the positive voltage (+Vs/2) is applied to the common electrode X, the negative voltage (−Vs/2) will be applied to the scan electrode Y. Therefore, the potential difference between the common electrode X and the scan electrode Y is maintained at a level which the sustaining discharge can be conducted between the common electrode X and the scan electrode Y.

Next, a schematic configuration of the predrive circuit 32-2 which is shown in FIG. 1 will be explained with reference to the drawings.

Figure 3A:
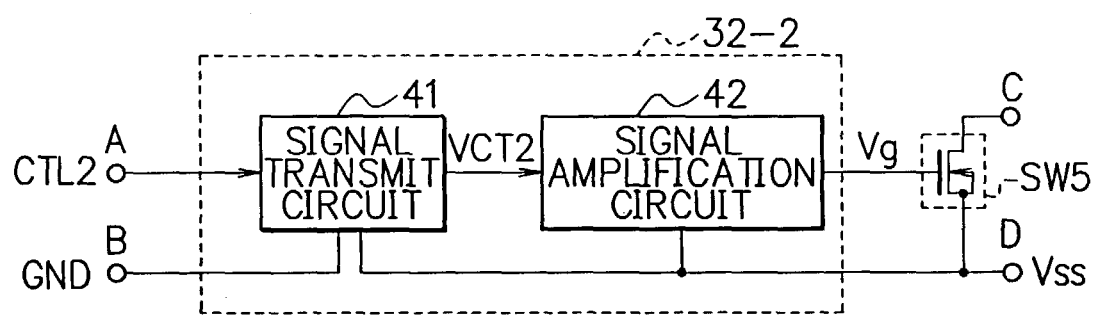
FIG. 3A is a block diagram showing a schematic configuration of a predrive circuit and FIG. 3B is a diagram showing an example of input signals of a predrive circuit, in the first embodiment of the present invention.
Figure 3B:
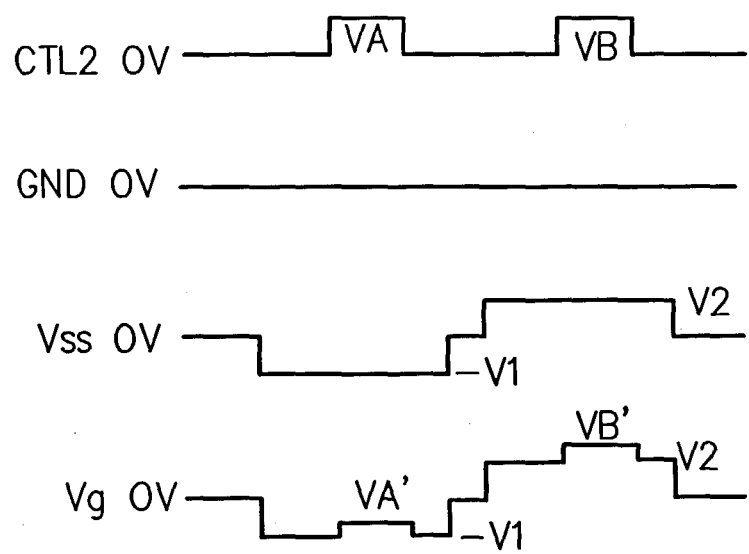

FIG. 3A and FIG. 3B are block diagrams showing a schematic configuration of the predrive circuit 32-2 and an example of input/output signals shown in FIG. 1. The predrive circuit 32-2 shown in FIG. 3A receives CTL2 having a control signal whose reference potential is GND, which is output from the drive control circuit 31 shown in FIG. 1. Then the predrive circuit 32-2 outputs a drive signal Vg to drive the SW5 (output element) whose reference potential Vss (second reference potential) is different from the reference potential GND of the drive control circuit 31. The schematic configuration of predrive circuit 32-2 will be explained as follows.

First, the above-mentioned SW5 will be explained. The SW5 as output element is an n-channel power MOSFET which applies a voltage to the load 20. A gate terminal of this n-channel power MOSFET is connected to an output line of a signal amplification circuit 42, and inputs the drive signal Vg output from the signal amplification circuit 42. A drain terminal of the SW5 is connected to an output terminal C to which the voltage to be applied to the load 20 are output. A source terminal of the SW5 is connected to an input terminal D, which inputs the reference potential Vss.

In FIG. 3A, the control signal CTL2 from the drive control circuit 31 is input to an input terminal A. The reference potential GND (first reference potential) of the control signal CTL2 will be input to an input terminal B. The reference potential Vss of the SW5 from the second signal line OUTB is input to the input terminal D. The output terminal C outputs the voltage which will be applied to the load 20 shown in FIG. 1. A signal transmit circuit 41 comprises an input terminal connected to the input terminal A, to which the control signal CTL2 will be input. The signal transmit circuit 41 also comprises a reference terminal which is connected to the input terminal B, which inputs the reference potential GND (0(zero) V) as the reference potential of the control signal CTL2. Further, the signal transmit circuit 41 comprises a Vss input terminal which is connected to the input terminal D and the source terminal of SW5, which inputs the reference potential Vss of the SW5. By the configuration described above, the signal transmit circuit 41 outputs a flow signal VCT2 which is based on the control signal CTL2 input from the input terminal A, and is level shifted to the voltage of the reference potential Vss of the SW5 input from the input terminal D, through an output line.

Next, the signal amplification circuit 42 comprises an input terminal which is connected to the output line of the signal transmit circuit 41, which inputs the flow signal VCT2 output from the signal amplification circuit 42. The signal amplification circuit 42 comprises a reference terminal which is connected to the input terminal D, which inputs the reference potential Vss of the SW5. The output line of the signal amplification circuit 42 is connected to the gate terminal of the SW5. By the configuration described above, the signal amplification circuit 42 amplifies the flow signal VCT2 input from the signal transmit circuit 41, thereby outputting the drive signal Vg to the gate terminal of the n-channel power MOSFET (SW5).

In addition, if the flow signal VCT2 has adequate amplitude to drive the SW5, the signal amplification circuit 42 can be elided.

Figure 25:
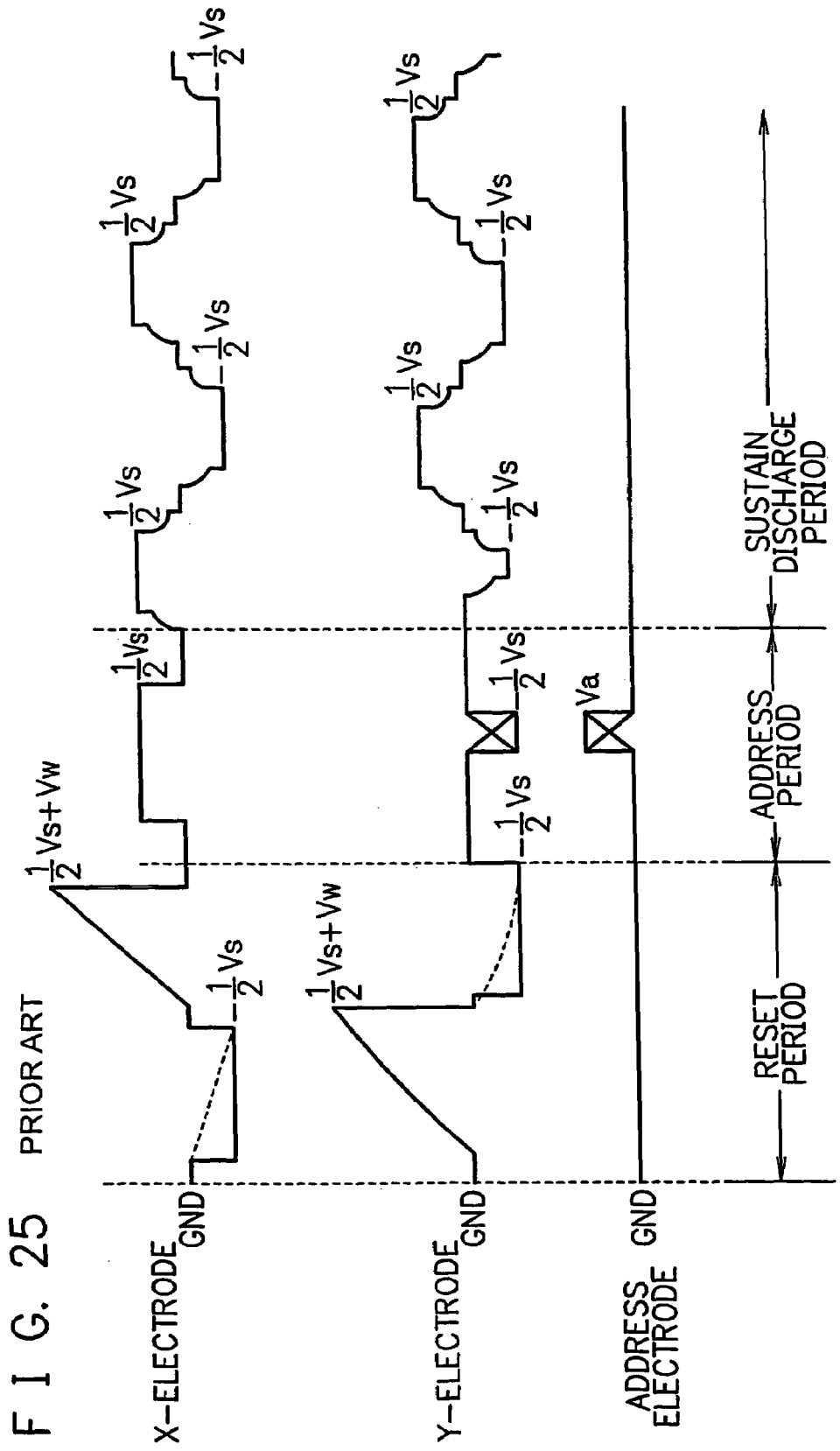
FIG. 25 is a time chart showing drive waveforms of the driving system of the AC-PDP device as configured in FIG. 24.
Figure 26:
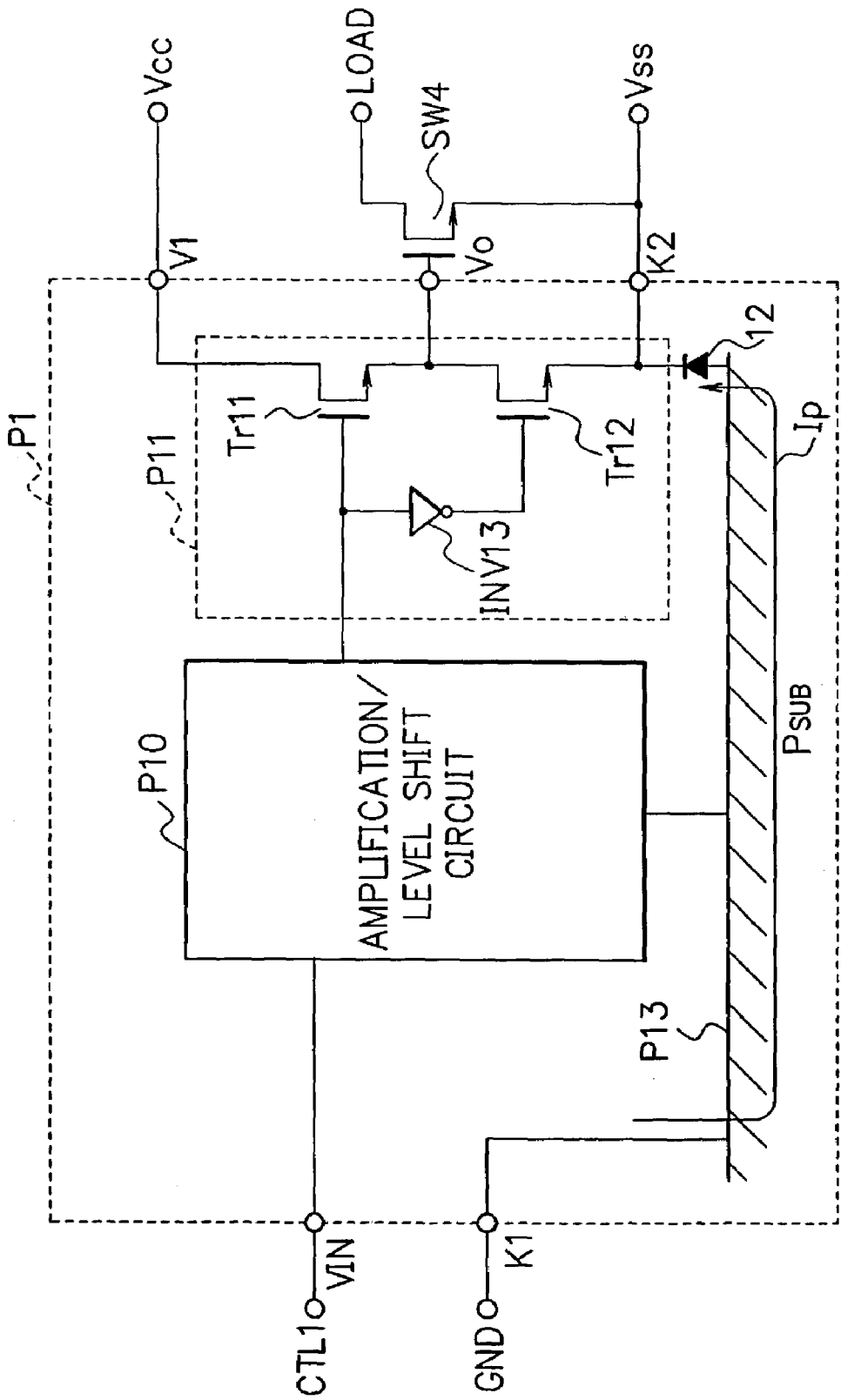
FIG. 26 is a diagram showing an example of a predrive circuit which corresponds to a variation of a reference potential of output elements side.

Next, an example of input signals and output signals of the predrive circuit 32-2 shown in FIG. 3B will be explained. As shown in FIG. 3B, the control signal CTL2 which will be input to the input terminal A is a signal (amplitude is 3 V–5 V) based on the reference potential GND (0(zero) V), which will be input to the input terminal B. The reference potential Vss will be one of three values GND (0(zero) V), voltage −V1 (negative voltage), or voltage V2 (positive voltage). The reference potential Vss periodically changes to one of the above-mentioned values, as shown in FIG. 3B, that it makes outputs of the output elements (SW4, SW5) shown in FIG. 1 form waveforms such as shown in FIG. 25. In other words, the reference potential which is applied to the signal line OUTB shown in FIG. 1 changes from (−Vs/2)=−V1 to (Vs/2)=V2.

As described above, the predrive circuit 32-2 outputs the drive signal Vg, whose reference potential differs according to the input control signal CTL2, as shown in FIG. 3B. Namely, while the CTL2 =0(zero) V is input to the input terminal A, the drive signal Vg outputs the same potential as the reference potential Vss. When the CTL2 is input to the input terminal A as a pulse with prescribed potential, timing, and pulse width, the drive signal Vg exhibits higher potential than the potential of the reference potential Vss by the prescribed potential, and the same pulse width as the CLT2.

Next, a schematic configuration of the signal transmit circuit 41 which is configured in the above described predrive circuit 32-2 will be explained.

Figure 4:
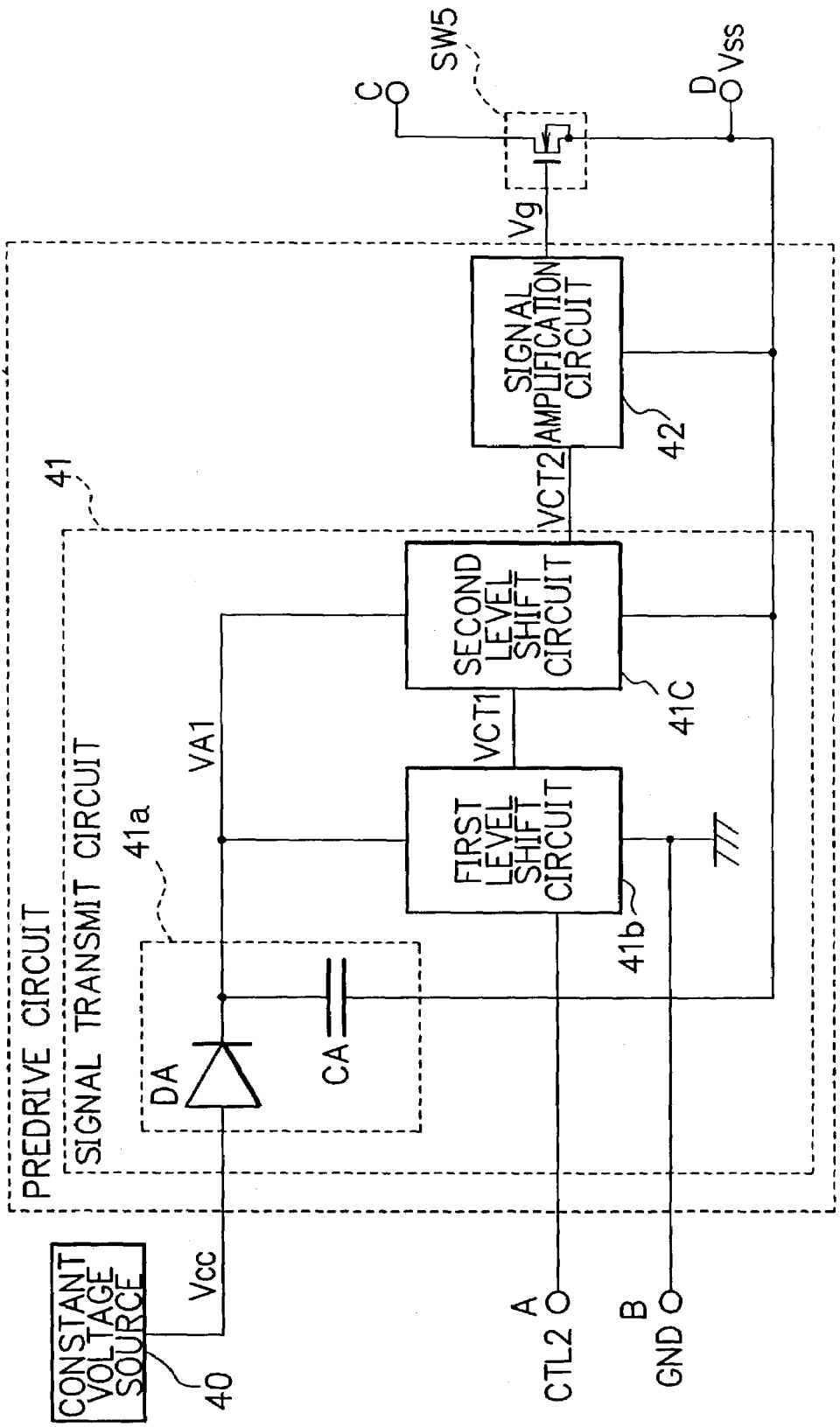
FIG. 4 is a block diagram showing a schematic configuration of a signal transmit circuit 41 shown in FIG. 3A.

FIG. 4 is a block diagram showing the schematic configuration of the signal transmit circuit 41 in FIG. 3A. As shown in the diagram, a level shift power supply circuit 41a is configured with a diode DA (level shift switch) and a capacitor CA (level shift capacitor). An anode terminal (first terminal) of the diode DA is connected to a constant voltage source 40, which inputs the prescribed potential Vcc output from the constant voltage source 40. One terminal of a capacitor CA is connected to the cathode terminal (second terminal) of the diode DA. The other terminal of the capacitor CA is connected to the input terminal D, which inputs the reference potential Vss. Moreover, the level shift power supply circuit 41a outputs level shift potential VA1 from a point of interface between the diode DA and the capacitor CA.

A power supply terminal of a first level shift circuit 41b is connected to the point of interface between the cathode terminal of the diode DA and the one terminal of the capacitor CA configured in the level shift power supply circuit 41a, which inputs the level shift potential VA1. An input terminal of the first level shift circuit 41b is connected to the input terminal A, which inputs the control signal CTL2. A reference potential terminal of the first level shift circuit 41b is connected to the input terminal B, which inputs the reference potential GND of the control signal CTL2. Through the above configuration, the first level shift circuit 41b outputs the flow signal VCT1 (first flow signal) which is level shifted from the control signal CTL2 based on the level shift potential VA1 output from the level shift power supply circuit 41a.

A power supply terminal of a second level shift circuit 41c is connected to the point of interface between the cathode terminal of the diode DA and the one terminal of the capacitor CA configured in the level shift power supply circuit 41a, which inputs the level shift potential VA1. A reference potential terminal of the second level shift circuit 41c is connected to the input terminal D, which inputs the reference potential Vss. An input terminal of the second level shift circuit 41c is connected to an output terminal of the first level shift circuit 41b, which inputs the flow signal VCT1 (first flow signal) Through the above configuration, the second level shift circuit 41c outputs the flow signal VCT2 (second flow signal) which is based on the flow signal VCT1 output from the first level shift circuit 41b and is level shifted according to the reference potential Vss.

As described above, the signal transmit circuit 41, comprising the first level shift circuit 41b and the second level shift circuit 41c, is capable to generate the flow signal VCT2 whose reference potential is VSS, according to the change of the control signal CTL2 whose reference potential is GND. The configuration of the signal amplification circuit 42 and the SW5 as an output element are shown in FIG. 3A. Accordingly, the signal amplification terminal 42 outputs the drive signal Vg, which is amplified to adequate amplitude to drive the SW5, based on the input flow signal VCT2. Then, SW5 outputs a voltage which will be applied to the load 20 through the output terminal C.

Figure 5:
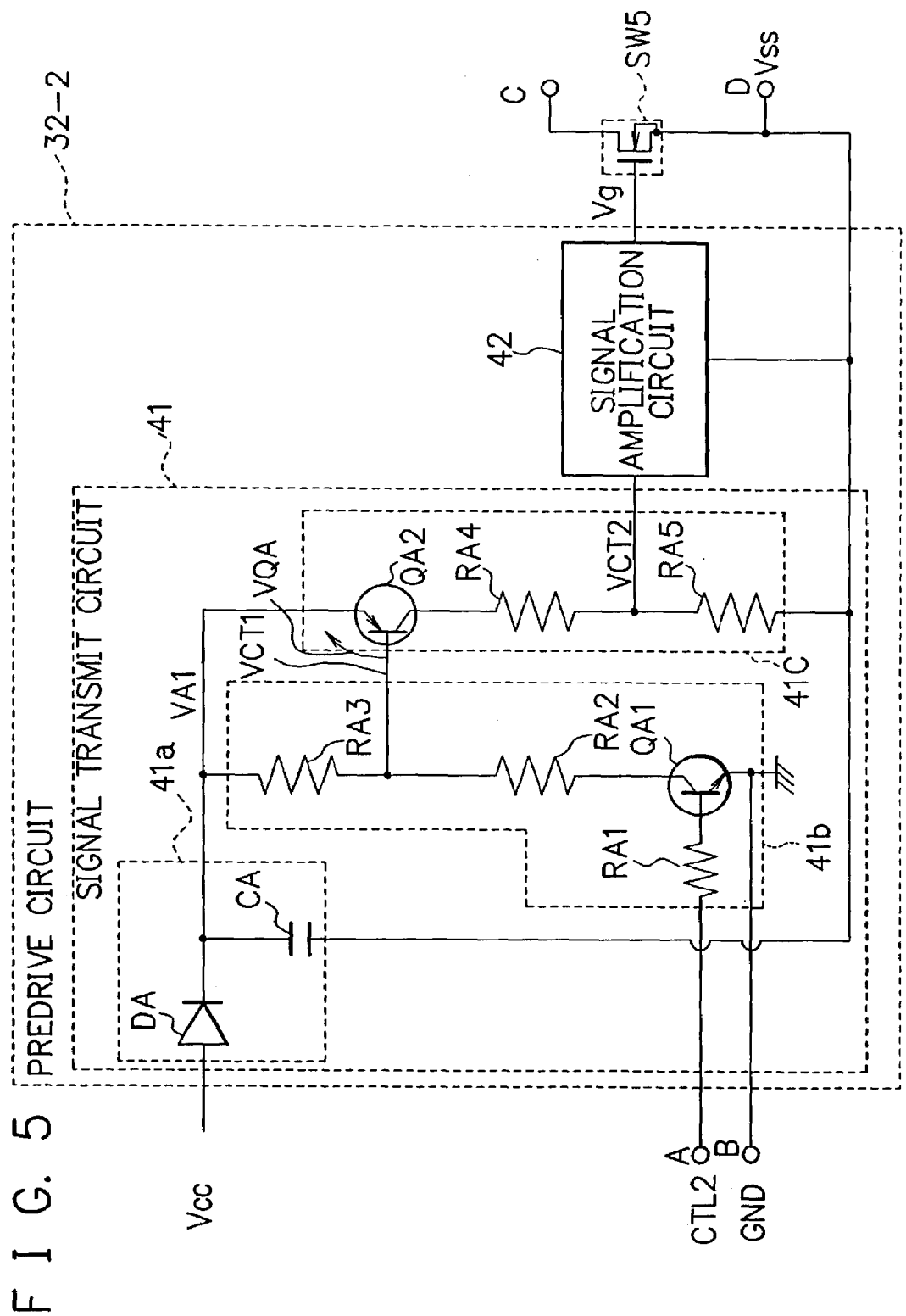
FIG. 5 is a block diagram showing a circuitry of the signal transmit circuit 41 shown in FIG. 4.

FIG. 5 is a block diagram showing a circuitry of the signal transmit circuit 41 shown in FIG. 4. First, a circuitry of the first level shift circuit 41b will be explained. A base terminal of an npn transistor QA1 is connected through a resistor RA1 to the input terminal A, which inputs the control signal CTL2. An emitter terminal of the npn transistor QA1 is connected to the input terminal B, which inputs the reference potential GND. A corrector terminal of the npn transistor QA1 is connected through a series connection of resistors RA2 and RA3 to the output line of the level shift power supply circuit 41a, which outputs the level shift potential. The resistor RA2 is connected in series with the collector terminal of the npn transistor QA1 and inputs the level shift potential VA1 from the resistor RA3 side. In addition, the first level shift circuit 41b outputs the flow signal VCT1 from a point of interface between the resistor RA2 and the resistor RA3.

Next, a circuitry of the second level shift circuit 41c will be explained. A base terminal of a pnp transistor QA2 is connected to the point of interface between the resistors RA2 and RA3, which inputs the flow signal VCT1. An emitter terminal of the pnp transistor QA2 is connected to the output terminal of the level shift power supply circuit 41a, which inputs the level shift potential VA1. A collector terminal of the pnp transistor QA2 is connected to the input terminal D through a series connection of resistors RA4 and RA5. The resistor RA4 is connected in series with the collector terminal of the pnp transistor QA2. The resistor RA5 is connected to the input terminal D, which inputs the reference potential Vss. The second level shift circuit 41c outputs the flow signal VCT2 from a point of interface between the resistors RA4 and RA5. In addition, as shown in FIG. 5, a potential difference between the base terminal and the emitter terminal of the transistor QA2 is referred to as VQA.

Next, an operation of the predrive circuit 32-2 described above will be explained.

Figure 6:
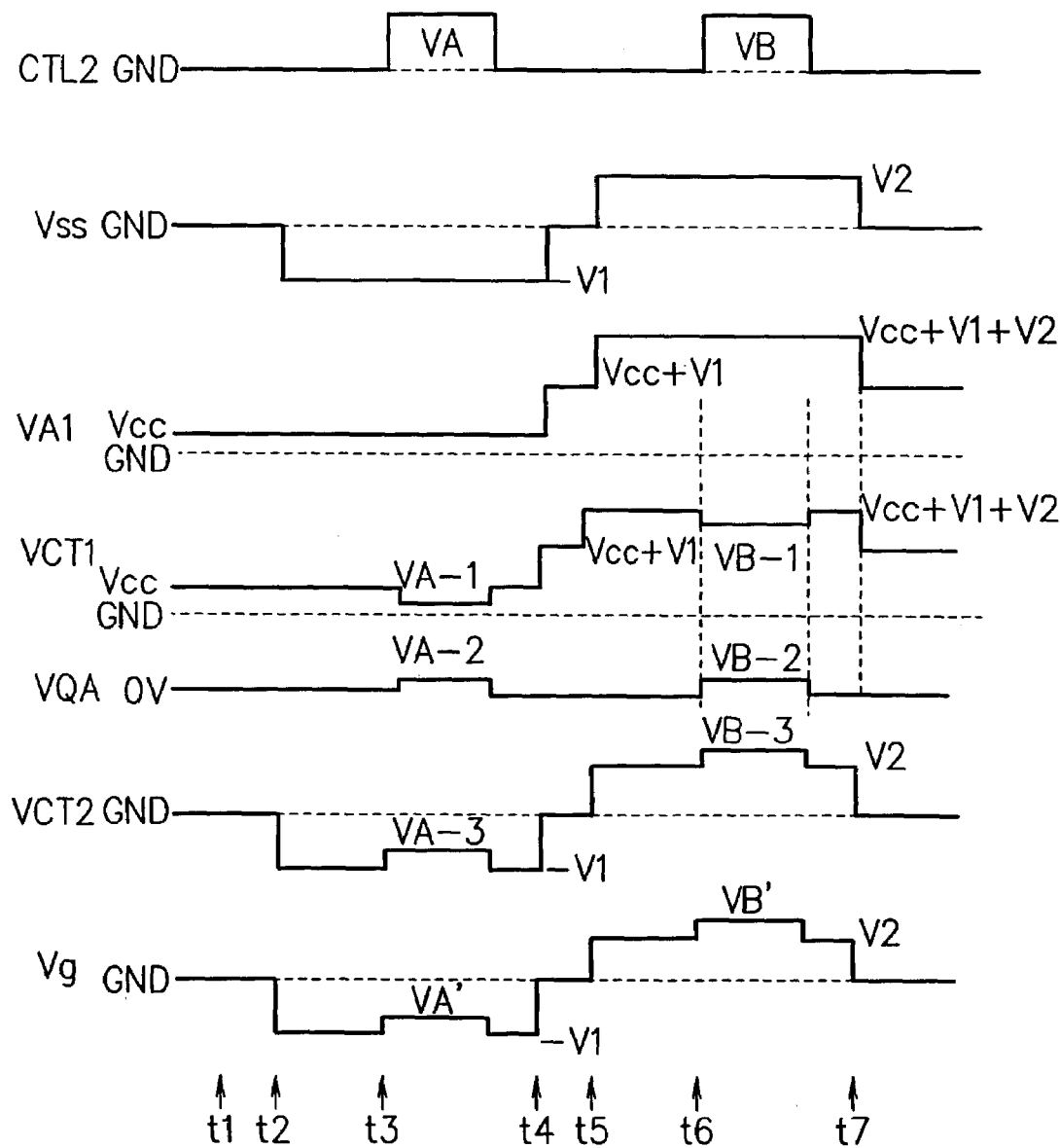
FIG. 6 is a diagram showing an example of input signals and output signals of a predrive circuit 32-2.

FIG. 6 is a diagram showing an example of input signals and output signals of the predrive circuit 32-2. As showing in the diagram, as of the control signal CTL2 whose reference potential is GND, a pulse VA and a pulse VB (amplitude is 3 V to 5 V) are supplied to the predrive circuit 32-2. The reference potential Vss is also supplied, with changes from GND (0(zero) V) to −V1 (−80 V) or V2 (80 V), to the predrive circuit 32-2.

Here, the purpose of the changes of the reference potential Vss shown in FIG. 6 will be explained. In the display device shown in FIG. 1, during the sustain discharge period, the sustaining discharge is needed to be conducted by alternatively applying the voltages of different polarity (+Vs/2, −Vs/2) to the common electrode X and the scan electrode Y for each display line. Thus, the positive voltage (+Vs/2) V2 and the negative voltage (−Vs/2)=−V1 are alternatively applied to the common electrode X on the load 20. In other words, the reference potential Vss of the SW5 as an output element is changed from V1 to V2. On the other hand, the reference potentials of the output element SW5' and the scan driver 22 are changed from −V1 to V2, so that they alternatively apply the positive voltage (+Vs/2) and the negative voltage (−Vs/2) to the scan electrode Y of the load 20.

At this time, the reference potentials Vss (−V1, V2) which are respectively applied to the SW5 and SW5', are applied in the way that the phase of the voltage is reversed to each other. Namely, when the positive voltage (V2) is applied to the switch SW5, the negative voltage (−V1) is applied to the switch SW5'. Therefore, the outputs of the switches SW5 and SW5' maintain the potential difference between the common electrode X and the scan electrode Y at a level which the sustaining discharge can be conducted between the common electrode X and the scan electrode Y. For the purpose described above, the reference potential Vss will be changed by the timing shown in FIG. 6.

In FIG. 6, changes of the VA1, VCT1, VQA, VCT2, and Vg will be explained in a sequential order for time t1 to t7 as shown under the reference potential Vss.

First, at the time t1 and the Vss=0(zero) V, a charge of the voltage Vcc to the capacitor CA is completed in the level shift power supply circuit 41a. Accordingly, the level shift potential VA1, output from the level shift power supply circuit 41a, will be approximate to the Vcc. The npn transistor QA1 remains off since the control signal CTL2=0 (zero) V. Therefore, the first level shift circuit 41b continuously outputs the flow signal VCT1 which is approximate to the Vcc, and the output flow signal VCT1 will be input to the base terminal of the pnp transistor QA2.

At this time, the potential difference VQA between the base terminal and the emitter terminal of the pnp transistor QA2 stays approximate to 0(zero) V, so that the pnp transistor QA2 remains off. The reference potential Vss input to the input terminal D, which is connected to the collector terminal of the pnp transistor QA2 through the resistors RA4 and RA5, is also approximate to 0(zero) V. Consequently, a flow signal VCT2 which is output from the second level shift circuit 41c is 0(zero) V. Then, in the signal amplification circuit 42, the reference potential Vss of 0(zero) V is input to the reference terminal, and the input signal VCT2 of 0(zero) V is input to the input terminal. Accordingly, the signal amplification circuit 42 outputs 0(zero) V as the drive signal Vg.

Next, at the time t2 and the Vss=−V1, voltage Vcc+V1 is charged to the capacitor CA. In the level shift power supply circuit 41a, the level shift potential VA1 is still approximate to the Vcc. The npn transistor QA1 is turned off since the control signal CTL2 is 0(zero) V. As a result, the first level shift circuit 41b continuously outputs the flow signal VCT1 which is approximate to the Vcc, and the output flow signal VCT1 will be input to the base terminal of the pnp transistor QA2.

At this time, the potential difference VQA between the base terminal and the emitter terminal of the pnp transistor QA2 stays approximate to 0(zero) V, so that the pnp transistor QA2 remains off. The reference potential Vss input to the input terminal D, which is connected to the collector terminal of the pnp transistor QA2 through the resistors RA4 and RA5, is changed to −V1. Consequently, a flow signal VCT2 which is output from the second level shift circuit 41c is decreased to −V1 according to the reference potential Vss. Then, in the signal amplification circuit 42, the reference potential Vss=−V1 is input to the reference terminal, and the input signal VCT=−V1 is input to the input terminal, which are both input as the same potential. Accordingly, the signal amplification circuit 42 outputs −V1 as the drive signal Vg.

Next, at the time t3, the CTL2 starts up by the pulse VA. Then, in the first level shift circuit 41b, the pnp transistor QA1 is turned on during the period the pulse VA is input to the base terminal of the pnp transistor QA1 through the resistor RA1. Accordingly, a potential difference between the level shift potential VA1 and the GND (approximate to Vcc) is divided by the resistance value ratio between the resistors RA2 and RA3 connected in series. In other words, the flow signal VCT1, which is output from the first level shift circuit 41b, is decreased by the divided potential and thereby forming a pulse VA−1 shown in FIG. 6. When the pulse VA falls (CTL2 returned to 0(zero) V), the pnp transistor QA1 will be turned off. Consequently, the flow signal VCT1, which is output from the first level shift circuit 41b, returns to Vcc, so that the pulse VA−1 will fall.

Then, in the second level shift circuit 41c, during the pulse VA−1 period described above, there are formed the potential difference VQA by the decreased voltage of the flow signal VCT1 between the base terminal and the emitter terminal of the pnp transistor QA2, thereby forming a pulse VA−2. Due to this potential difference VQA, the npn transistor QA2 will be turned on during the pulse VA−2 period. Accordingly, the potential difference (Vcc+V1) between the reference potential Vcc, which is supplied by the level shift potential VA1 from the resistor RA4 side, and the potential −V1, which is supplied by the reference potential Vss from the resistor RA5 side, is divided by the resistance value ratio between the resistors RA4 and RA5 connected in series. The flow signal VCT2, which is output from the second level shift circuit 41c, is increased by the potential of the resistor RA5 which is divided from the reference potential Vss=−V1 and thereby forming a pulse VA−3. Consequently, the signal amplification circuit 42 outputs a pulse VA' shown in FIG. 6 as the drive signal Vg, which is amplified from the potential difference between the potential of the pulse VA−3 of the flow signal VCT2 and the potential −V1 of the reference potential Vss, which is input to the reference terminal.

Next, at the time t4, when the reference potential Vss is returned to 0(zero) V, the level shift power supply circuit 41a outputs the potential Vcc+V1 charged in the capacitor CA as the level shift potential VA1. The npn transistor QA1 remains off since the control signal CTL2 is 0(zero) V. Accordingly, the flow signal VCT1, which is output from the first level shift circuit 41b, is increased to the same potential as the VA1, which is Vcc+V1. This flow signal VCT1, which is output from the first level shift circuit 41b, will be input to the base terminal of the pnp transistor QA2.

At this time, the potential difference VQA between the base terminal and the emitter terminal of the pnp transistor stays approximate to 0(zero) V, so that the pnp transistor QA2 remains off. The reference potential Vss input to the input terminal D, which is connected to the collector terminal of the pnp transistor QA2 through the resistors RA4 and RA5, is changed to 0(zero) V. Consequently, a flow signal VCT2 which is output from the second level shift circuit 41c will be increased to 0(zero) V according to the reference potential Vss. Then, the drive signal Vg, which is output from the signal amplification circuit 42, will be increased to 0(zero) V as well.

Next, at the time t5, when the reference potential Vss is increased to V2, voltage Vcc+V1+V2 is charged to the capacitor CA in the level shift power supply circuit 41a, thereby outputs the level shift potential VA1 approximate to Vcc+V1+V2. The npn transistor QA1 remains off since the control signal CTL2 is 0(zero) V. Accordingly, the flow signal VCT1, which is output from the first level shift circuit 41b, is increased to the same potential as the VA1, which is Vcc+V1+V2. This flow signal VCT1, which is output from the first level shift circuit 41b, will be input to the base terminal of the pnp transistor QA2.

At this time, the potential difference VQA between the base terminal and the emitter terminal of the pnp transistor stays approximate to 0(zero) V, so that the pnp transistor QA2 remains off. The reference potential Vss input to the input terminal D, which is connected to the collector terminal of the pnp transistor QA2 through the resistors RA4 and RA5, is increased to V2. Consequently, the flow signal VCT2 which is output from the second level shift circuit 41c is increased to V2 according to the reference potential Vss. Then, in the signal amplification circuit 42, the reference potential Vss=V2 is input to the reference terminal, and the input signal VCT=V2 is input to the input terminal, which are both input as the same potential. As a result, the signal amplification circuit 42 outputs V2 as the drive signal Vg.

Next, at the time t6, the CTL2 starts up by the pulse VB. Then, in the first level shift circuit 41b, the pnp transistor QA1 is turned on during the period the pulse VB is input to the pnp transistor QA1 through the resistor RA1. Accordingly, a potential difference between the level shift potential VA1 and the GND (approximate to Vcc+V1+V2) is divided by the resistance value ratio between the resistors RA2 and RA3 connected in series. In other words, the flow signal VCT1, which is output from the first level shift circuit 41b, is decreased by the divided potential and thereby forming a pulse VB−1. When the pulse VB falls (CTL2 returned to 0(zero) V), the pnp transistor QA1 will be turned off.

Consequently, the flow signal VCT1, which is output from the first level shift circuit 41b, returns to Vcc+V1+V2, so that the pulse VA−1 will fall.

Then, in the second level shift circuit 41c, during the pulse VB−1 period described above, there are formed the potential difference VQA by the decreased flow signal VCT1 between the base terminal and the emitter terminal of the pnp transistor QA2, thereby forming a pulse VB−2. Due to this potential difference VQA, the npn transistor QA2 will be turned on during the pulse VA−2 period. Accordingly, the potential difference (Vcc+V1) between the reference potential Vcc+V1+V2, which is supplied by the level shift potential VA1 from the resistor RA4 side, and the potential V2, which is supplied by the reference potential Vss from the resistor RA5 side, is divided by the resistance value ratio between the resistors RA4 and RA5 connected in series. The flow signal VCT2, which is output from the second level shift circuit 41c, is increased by the potential of the resistor RA5 which is divided from the reference potential Vss=V2 and thereby forming a pulse VB−3. Consequently, the signal amplification circuit 42 outputs a pulse VB' shown in FIG. 6 as the drive signal Vg, which is amplified from the potential difference between the potential of the pulse VB−3 of the flow signal VCT2 and the potential V2 of the reference potential Vss, which is input to the reference terminal.

Next, at the time t7, when the reference terminal Vss is returned to 0(zero) V, the potential of the voltage charged in the capacitor CA will be Vcc+V1 in the level shift power supply circuit 41a. Accordingly, the level shift power supply circuit 41a outputs the potential Vcc+V1 as the level shift potential VA1. The npn transistor QA1 remains off since the control signal CTL2 is 0(zero) V. Accordingly, the flow signal VCT1, which is output from the first level shift circuit 41b, is decreased to the potential Vcc+V1. This flow signal VCT1, which is output from the first level shift circuit 41b, will be input to the base terminal of the pnp transistor QA2.

At this time, the potential difference VQA between the base terminal and the emitter terminal of the pnp transistor QA2 stays approximate to 0(zero) V, so that the pnp transistor QA2 remains off. The reference potential Vss input to the input terminal D, which is connected to the collector terminal of the pnp transistor QA2 through the resistors RA4 and RA5, is changed to 0(zero) V. Consequently, a flow signal VCT2 which is output from the second level shift circuit 41c will be decreased to 0(zero) V according to the reference potential Vss. Then, the drive signal Vg, which is output from the signal amplification circuit 42, will be decreased to 0(zero) V as well.

The level shift power supply circuit 41a described above is configured with the diode DA used as a level shift switch and the capacitor CA used as a level shift capacitor. However, the level shift power supply circuit 41a is not limited to this configuration, so that any circuit can be used as long as it is capable of outputting the level shift potential VA1 according to the change of the reference potential Vss as shown in FIG. 6.

As described above, the display device shown in FIG. 1 can be stably driven by using the predrive circuit as the embodiment of the present invention, even when the reference potentials of input signals CTL1, CTL2, CTL3, and CTL4, which are input from the drive control circuit 31, are different from the reference potentials of signal lines OUTB and OUTB' for driving the output elements SW4, SW5, SW4', and SW5'. For example, if the reference potentials of signal lines OUTB and OUTB' for driving the output elements turn to high voltage during the reset period, the SW4 and SW4' are still remains in an active state, thereby still capable to stably supply appropriate reset voltages for the display device (PDP Device).

FIG. 7 is a block diagram showing another configuration example of the predrive circuit 32-2.

The predrive circuit 32-2 shown in FIG. 7 is a predrive circuit shown in FIG. 3A to which a phase control circuit 49 is further installed.

In FIG. 7, the phase control circuit 49 is for adjusting a delay of phase, which occurs when the control signals supplied form the drive control circuit 31 through the predrive circuit 32-2 and further supplied to the output elements, between the predrive circuits 32-1 to 32-4.

Namely, when the control signals supplied from the drive control circuit 31 are converted whose reference potentials by the signal transmit circuit 41 or amplified by the signal amplification circuit 42, the delay of phase occurs to these control signals which are output from the predrive circuit, due to the dispersion of elements which configures the signal transmit circuit 41 and signal amplification circuit 42.

The phase control circuit 49 adjusts the delay of phase caused by the signal transmit circuit 41 and the signal amplification circuit 42, synchronizing the phase between the predrive circuits 32-1 and 32-4, and supplies the control signals to each of the output elements.

The phase control circuit 49 can be configured, for example, by a time constant control circuit which comprises capacitors and resistors. The delay of phase can be adjusted through adjusting capacities and resistance values of these capacitors and resistors. In addition, a reference potential of the phase control circuit 49 is the GND (0(zero) V) supplied from the input terminal B.

Figure 8A:
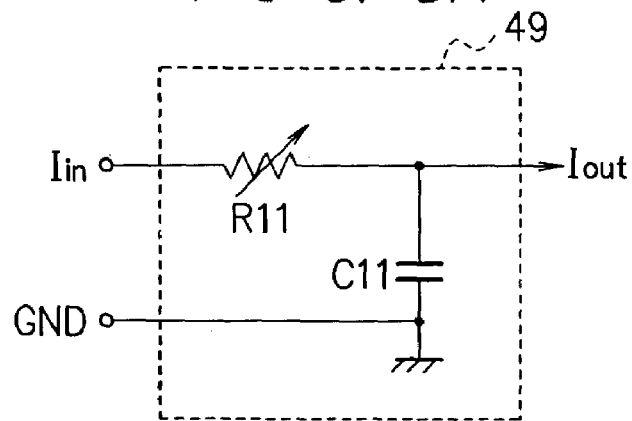
FIGS. 8A to 8C are diagrams showing a configuration example of a phase control circuit 49.
Figure 8B:
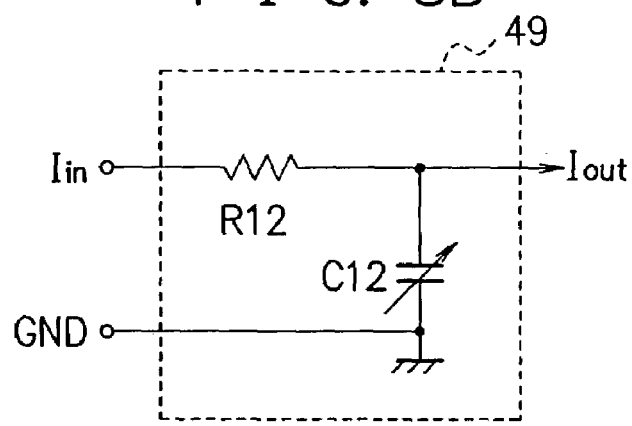
Figure 8C:
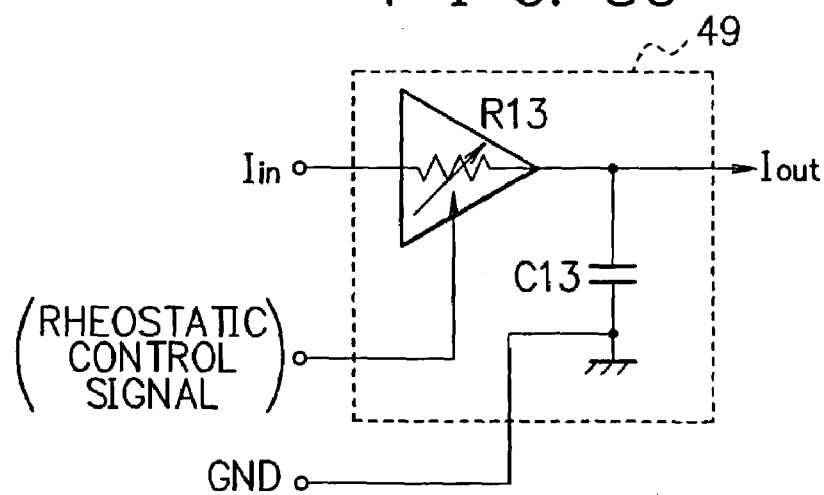

FIG. 8A to FIG. 8C are diagram showing a configuration example of the phase control circuit 49.

In FIG. 8A to FIG. 8C, Iin is an input terminal of the phase control circuit 49, and Iout is an output terminal of the phase control circuit 49.

The phase control circuit 49 shown in FIG. 8A is configured with a variable resistor R11 which is connected between the input terminal Iin and the output terminal Iout, and a capacitor C11 which is connected to a point of interface between the output terminal Iout and the variable resistor R11 and to the GND. The delay of phase is adjusted by changing a resistance value of the variable resistor R11.

The phase control circuit 49 shown in FIG. 8B is configured with a resistor R12 which is connected between the input terminal Iin and the output terminal Iout, and a variable capacitor C12 which is connected to the point of interface between the output terminal Iout and the resistor R12 and to the GND. The delay of phase will be adjusted by changing a capacity of the variable capacitor C12.

The phase control circuit 49 shown in FIG. 8C is configured with an electric volume R13, whose resistance value can be changed electrically, which is connected between the input terminal Iin and the output terminal Iout, and a capacitor C13 which is connected to a point of interface between the output terminal Iout and the electric volume R13 and to the GND. A rheostatic control signal will be input externally and supplied to the electric volume R13 for adjusting the electric volume R13. The delay of phase will be adjusted through changing the resistance value of the electric volume R13 by the rheostatic control signal.

Therefore, the delay of phase due to the dispersion of elements which configures the signal transmit circuit 41 and the signal amplification circuit 42 can be adjusted by installing the phase control terminal 49 in the predrive circuit, thus stabilizing the operation of the output elements.

In the predrive circuit 32-2 shown in FIG. 7, the phase control circuit 49 is installed in front of the signal transmit circuit 41. However, the phase control circuit 49 can be installed downstream the signal transmit circuit 41. In this case, the reference potential for the phase control circuit will be Vss.

Figure 9:
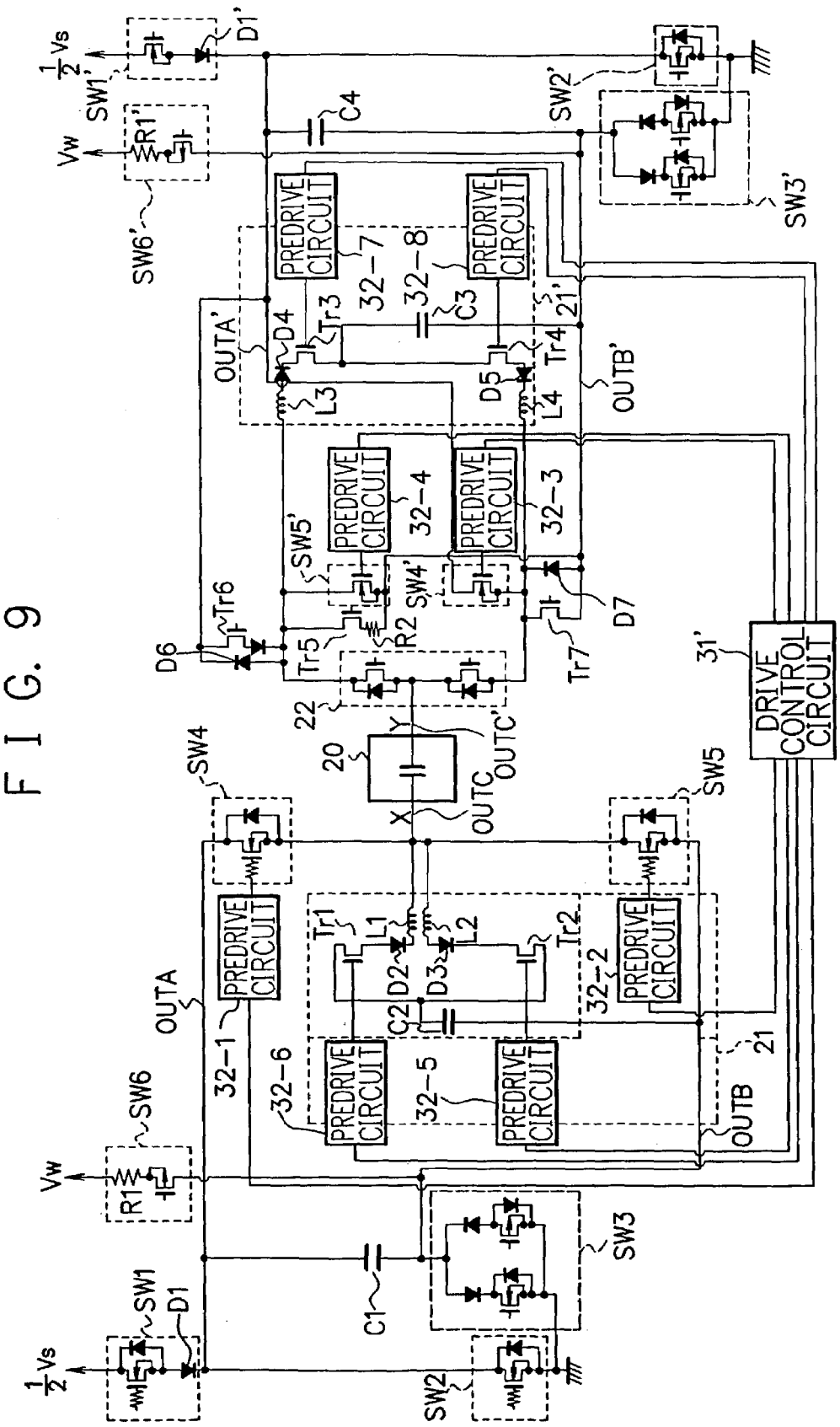
FIG. 9 is a diagram showing another configuration example of the driving system of the AC-PDP based on the first embodiment.
Figure 24:
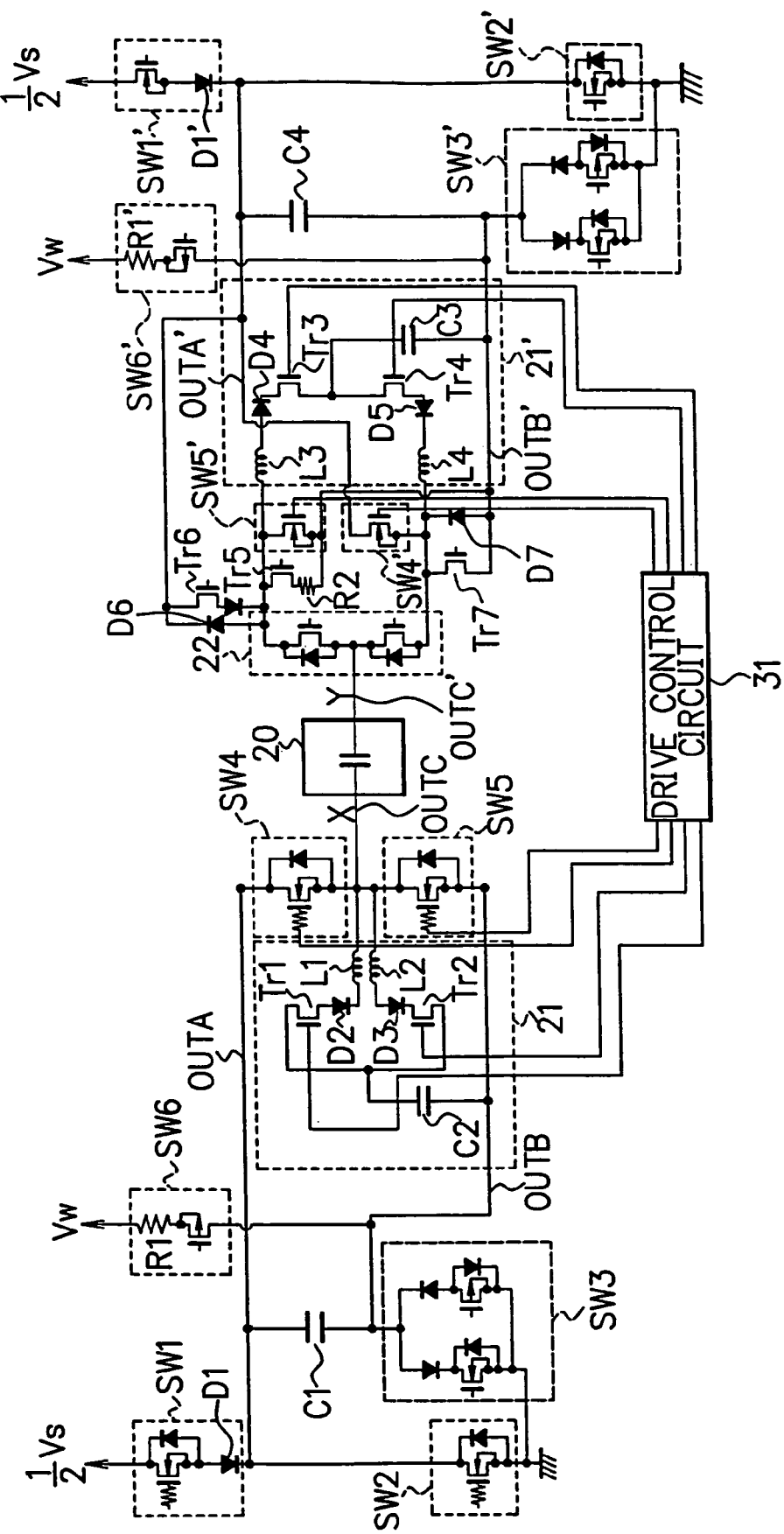
FIG. 24 is a diagram showing a circuitry example of a driving system of the conventional AC-PDP device.

FIG. 9 is a diagram showing another configuration example of the driving system of the AC-PDP based on the first embodiment. The driving system shown in FIG. 9 is based on a driving system shown in FIG. 24 to which the predrive circuits as this embodiment are installed. In FIG. 9, components which are identical to those in FIG. 24 are designated the same reference numerals, so that the repeated description will be omitted.

In FIG. 9, 32-1 to 32-8 are predrive circuits which convert voltage levels of control signals, respectively supplied from the drive control circuit 31, to reference potentials of switches SW4, SW5, SW4', and SW5', and the transistors Tr1 to Tr4 and supply the control signals accordingly. In other words, similarly to the predrive circuits shown in FIG. 1, the predrive circuits 32-1 to 32-8 convert reference potentials of the control signals, which are respectively supplied from the drive control circuit 31', from the reference potential GND of the drive control circuit 31 to the reference potential Vss of the output elements, thereby supplying the control signals to these output elements.

In the driving system shown in this FIG. 9, the switches SW4, SW5, SW4', and SW5' and the transistor Tr1 to Tr4 are the ones with reference potentials which change according to drive operation, so that the predrive circuits 32-1 to 32-8 are respectively installed for each of them.

As described above, by installing the predrive circuits 32-1 to 32-8 to each of the switches SW4, SW5, SW4', and SW5' and transistors Tr1 to Tr4, the control signals with suitable reference potentials are respectively provided to the switches SW4, SW5, SW4', and SW5' and transistors Tr1 to Tr4, so that the each output element will be operated stably.

In addition, any of the above described predrive circuits can be used as the predrive circuits 32-1 to 32-8 in FIG. 9.

As described in detail above, according to this embodiment, the signal transmit circuit 41 in the predrive circuit converts the reference potential GND of the control signals supplied from the drive control circuit 31' to the reference potential Vss of the output elements (switches SW4, SW5, SW4', SW5', and transistors Tr1 to Tr4). Then the signal amplification circuit 42 amplifies these control signals and supplies them to the output elements.

Accordingly, even if the reference potentials of the drive control circuit 31' and the control signals are different from the reference potentials of the output elements, it is possible to insulate the reference potentials and supply the control signals to the output elements. If the voltage variation of the output elements occurred, it can be prevented from causing effect to the drive control circuit 31'. Therefore, the plasma display device can be driven stably, and the reliability of the plasma display device will be improved.

In addition, for example, in a case installing the phase control circuit 49 in the predrive circuit, the delay of phase which occurs when the control signals are converted to the reference potentials of the output elements by the signal transmit circuit 41 and the signal amplification circuit 42 can be adjusted, so that an operation timing of each output element can be synchronized, and the plasma display device can be stably driven.

Second Embodiment

Next, a second embodiment of the present invention will be explained.

Figure 10:
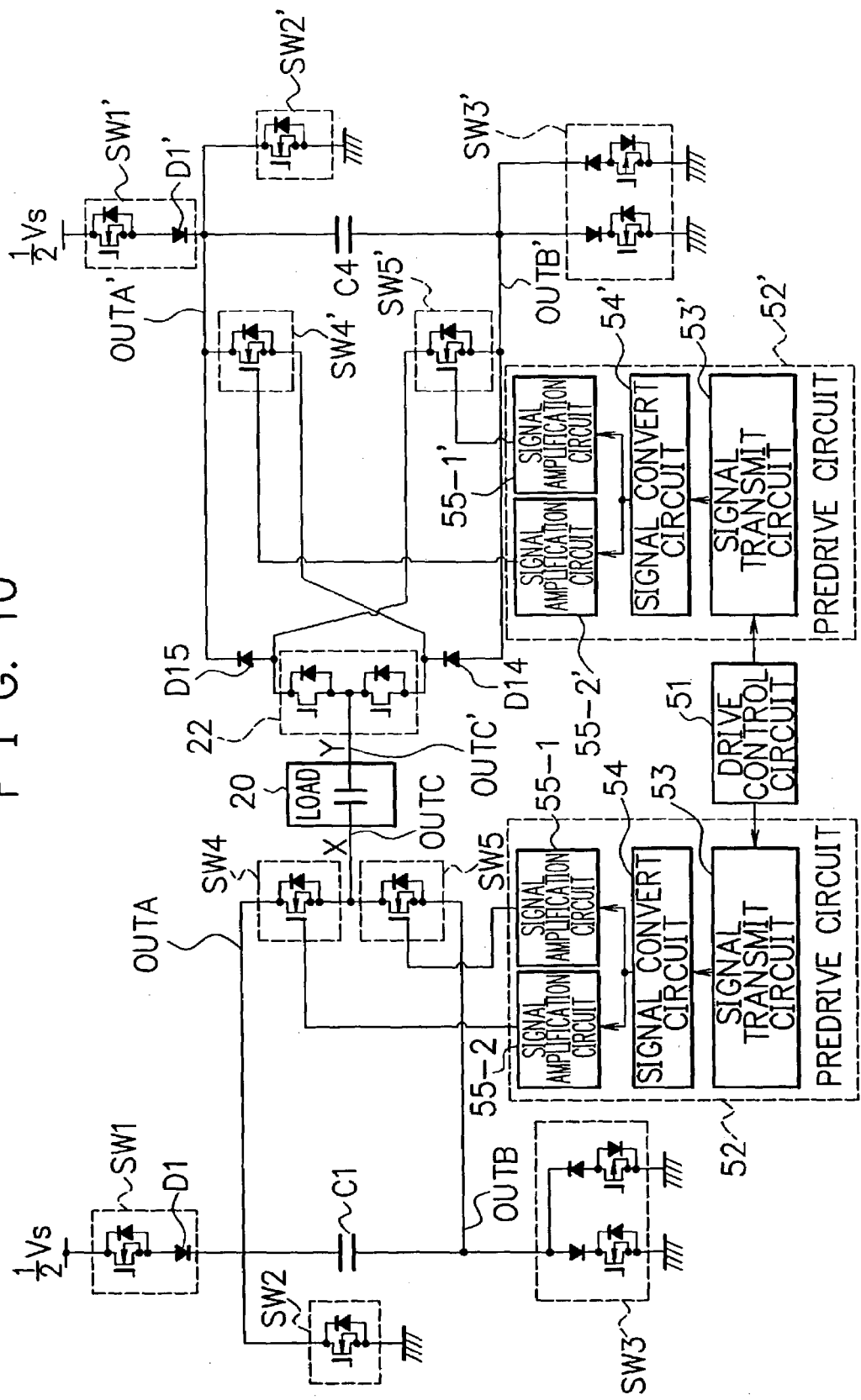
FIG. 10 is a diagram showing a configuration example of a driving system of an AC-PDP based on a second embodiment.

FIG. 10 is a diagram showing a configuration example of a driving system of an AC-PDP based on a second embodiment. Further, the driving system of this embodiment shown in FIG. 10, can be applied to, for example, the AC-PDP device with the overall configuration shown in FIG. 22, and a configuration of one cell which configures one pixel shown in FIG. 23A to FIG. 23C Additionally, in this FIG. 10, the same components as those shown in FIG. 1 are designated the same reference numerals, so that the repeated description will be omitted.

In the driving system of the second embodiment, while the predrive circuit is installed to each of the output elements in the driving system of the first embodiment, one predrive circuit is installed respectively to the common electrode X side and the scan electrode Y side. In these predrive circuits, the control signals for each output elements are converted, generated, and supplied to each of the output elements.

In FIG. 10, 51 is the drive control circuit, and 52 and 52' are the predrive circuits. One control signal is respectively supplied to predrive circuit 52 and 52' from the drive control circuit 51. This control signal is for controlling all output elements (switches SW4, SW5, SW4', and SW5') connected downstream of the predrive circuits 52 and 52'.

The predrive circuit 52 is configured with one signal transmit circuit 53, one signal convert circuit 54, and signal amplification circuits 55-1 and 55-2 for each of the output elements (in FIG. 10, two for the common electrode X side).

The signal transmit circuit 53 is a circuit which converts the reference potential of the control signals, which are supplied from the drive control circuit 51, to the reference potentials of the output elements and outputs these converted control signals. Namely, the signal transmit circuit 53 converts the voltage level of the control signals, which are supplied from the drive control circuit 51 and based on the reference potential (GND) of the drive control circuit 51, to the reference potential Vss of the output elements connected downstream the predrive circuit 52. The signal transmit circuit 53 can be configured using the circuits shown in FIGS. 4 and 5.

The signal convert circuit 54 generates control signals for the output elements connected downstream the predrive circuit 52, according to the control signals whose voltage levels are converted to the reference potentials of the output elements by the signal transmit circuit 53, and supplies them to the signal amplification circuits 55-1 and 55-2 by appropriate timing. In other words, the signal convert circuit 54 generates two control signals for the switches SW4 and SW5 connected downstream thereof, which is based on the control signals whose voltage levels are converted to the reference potentials of the output elements by the signal transmit circuit 53, and supplies them respectively to the signal amplification circuit 55-1 and 55-2.

The signal amplification circuit 55-1 and 55-2 amplify the control signals, which are separated and supplied by the signal convert circuit 54, to the driving level of the output elements, and supply these control signals to each of the switches SW4 and SW5.

Since the predrive circuit 52' on the scan electrode Y side has an identical configuration to the predrive circuit 52 of the common electrode X side, the description of which is omitted.

Figure 11:
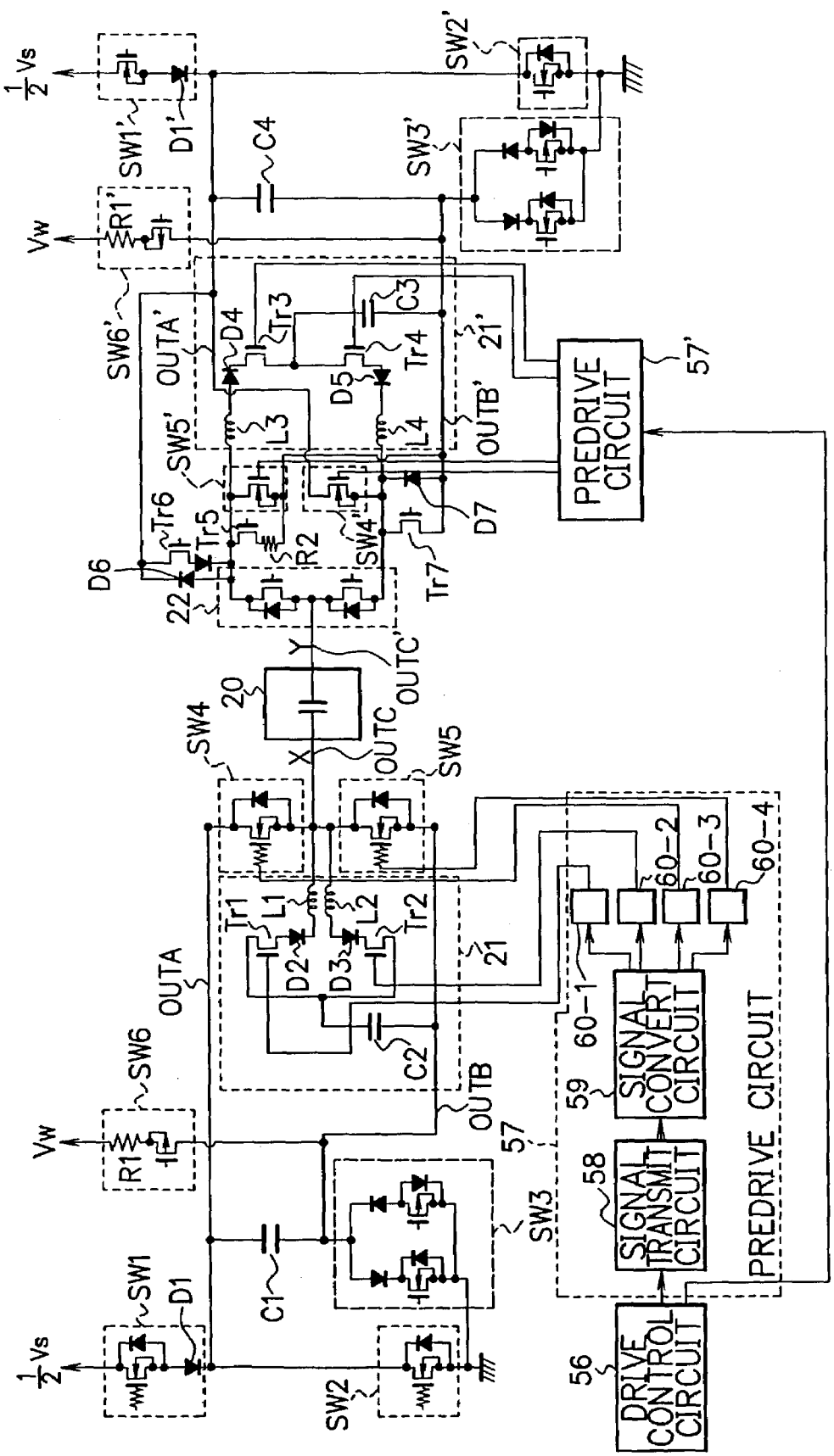
FIG. 11 is a diagram showing another configuration example of the driving system of the AC-PDP based on the second embodiment.

FIG. 11 is a diagram showing another configuration example of the driving system of the AC-PDP based on the second embodiment. Additionally, in this FIG. 11, the same components as those shown in FIGS. 9 and 24 are designated the same reference numerals, so that the repeated description will be omitted.

The driving system shown in FIG. 11 is a driving system comprising the power recovery circuit 21 and 21' to which, similarly to the driving system shown in FIG. 10, one predrive circuit is installed respectively to the common electrode X side and the scan electrode Y side. In these predrive circuits, the control signals for each output elements are converted, generated, and further supplied to each of the output elements.

In FIG. 11, 56 is the drive control circuit, and 57 and 57' are the predrive circuits, and each of which have the same function as the drive control circuit 51 and the predrive circuits 52 and 52' shown in FIG. 10.

The predrive circuit 57 is configured with one signal transmit circuit 58, one signal convert circuit 59, and signal amplification circuits 60-1, 60-2, 60-3, and 60-4 for each of the output elements (in FIG. 11, four for the common electrode X side).

The signal transmit circuit 58 is a circuit which, similarly to the signal transmit circuit 53 shown in FIG. 10, converts the reference potentials of the control signals, which are supplied from the drive control circuit 56, to the reference potentials of the output elements and outputs these converted control signals to the signal convert circuit 59.

The signal convert circuit 59, similarly to the signal convert circuit 54 shown in FIG. 10, generates control signals for the output elements connected downstream the predrive circuit 57, based on the control signals whose voltage levels are converted to the reference potentials of the output elements by the signal transmit circuit 58, and supplies them to the signal amplification circuits 60-1 to 60-4 by appropriate timing. In other words, the signal convert circuit 59 generates four control signals, based on the control signals whose voltage levels are converted to the reference potentials of the output elements by the signal transmit circuit 58, for the switches SW4, SW5 and transistors Tr1, Tr2 connected downstream the predrive circuit 57, and supplies them to each of the signal amplification circuits 60-1 to 60-4.

The signal amplification circuits 60-1 to 60-4 amplify the control signals, which are separated and supplied by the signal convert circuit 59, to the driving level of the output elements, and supply these control signals to each of the switches SW4, SW5 and transistors Tr1, Tr2.

In addition, the predrive circuit 57' on the scan electrode Y side has an identical configuration to the predrive circuit 57 of the common electrode X side described above.

As has been descried above, in accordance with the second embodiment, one predrive circuit is installed to each of the common electrode X side and the scan electrode Y side, and the signal convert circuit, installed downstream the signal transmit circuit inside the predrive circuit, separates the control signals for each of the output elements connected to the predrive circuit from the supplied control signals and supplies them to each of the output elements.

Therefore, by smaller number of the signal transmit circuit than installing the predrive circuit for each of the output elements, the reference potentials of the control signals can be insulated from the reference potentials of the output elements, and then the control signals are supplied to each of the output elements. As a result, by adding just a few circuits, the plasma display device can be driven stably, and the reliability of the plasma display device will be improved.

Third Embodiment

Next, another schematic configuration of the predrive circuit 32-2 which is shown in FIG. 1 will be explained with reference to the drawings.

Figure 12:
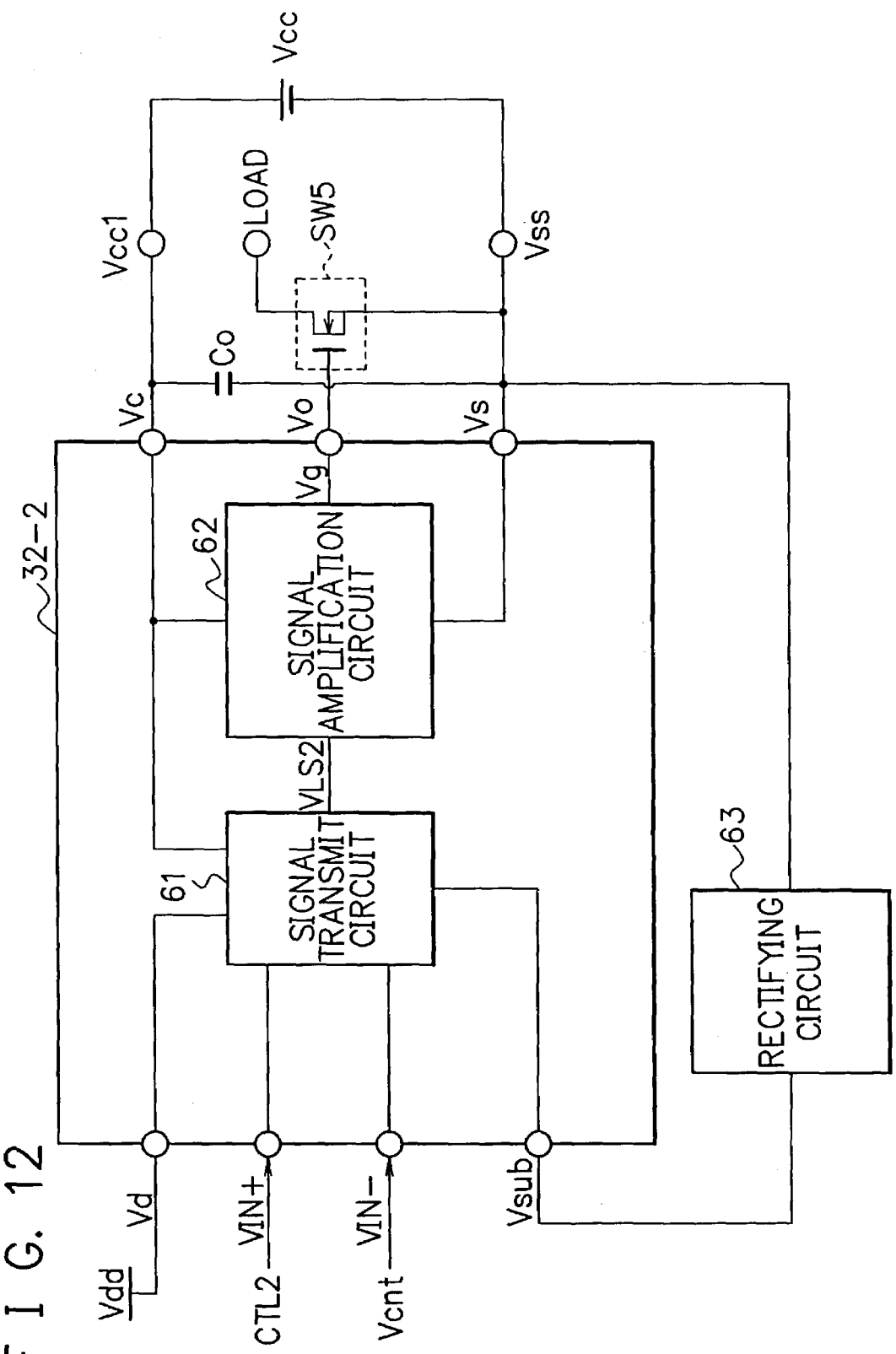
FIG. 12 is a block diagram showing a schematic configuration of the predrive circuit 32-2 shown in FIG. 1.

FIG. 12 is a block diagram showing a schematic configuration of the predrive circuit 32-2 shown in FIG. 1. The predrive circuit 32-2 shown in FIG. 12 inputs CTL2, as a control signal whose reference potential is GND (first reference potential), which is output from the drive control circuit 31 shown in FIG. 1. Then the predrive circuit 32-2 outputs a drive signal Vg to drive a switch SW5 (output element) whose reference potential Vss (second reference potential) is different from the reference potential GND of CTL2.

First, the switch SW5 which is driven by the predrive circuit 32-2 will be explained. The switch SW5 as an output element is an n-channel power MOSFET which applies a voltage to the load 20. A gate terminal of this n-channel power MOSFET is connected to an output line (through an output terminal "Vo" of the predrive circuit) of an aftermentioned signal amplification circuit 62, and inputs the drive signal Vg output from the signal amplification circuit 62. A drain terminal of the switch SW5 is connected to an output line OUTC shown in FIG. 1 to which the voltage to be applied to the load 20 are output. A source terminal of the switch SW5 is connected to a Vss supply line which supplies the reference potential Vss. One terminal of a capacitor Co is connected to a Vcc supply line, and the other terminal of the capacitor Co is connected to the Vss supply line. The voltage Vcc is supplied to capacitor Co. Accordingly, a voltage Vcc1 (output power supply voltage), which equals Vcc+Vss, occurs at the one terminal side of the capacitor Co.

Next, terminals which are comprised in the predrive circuit 32-2 will be explained. In FIG. 12, the predrive circuit 32-2 comprises input terminals "VIN+" and "VIN−", an output terminal "Vo", power supply terminals "Vd" and "Vc", and reference terminals "Vsub" and "Vs". The input terminal "VIN+" inputs the control signal CTL2 from the drive control circuit 31. The input terminal "VIN−" inputs a reference voltage Vcnt (2.5 V, for example) which will be the reference for comparison with the control signal CTL2. In this embodiment, amplitude of the CTL2 is GND to 5 V.

To the power supply terminal "Vd", the power supply voltage Vdd (5V, for example) for the control signal CTL2 will be supplied. To the reference potential terminal "Vs", the reference potential Vss for the switch SW5 will be supplied from the second signal line OUTB shown in FIG. 1. To the reference potential terminal "Vsub", a reference potential Vsub will be supplied. The Vsub is a rectified reference potential Vss, which is rectified through an aftermentioned rectifying circuit (substrate potential generating circuit) 63. The output terminal "Vo" is connected to the gate terminal of the SW5 and outputs the signal Vg for driving the switch SW5. To the power supply terminal "Vc", the power supply voltage Vcc1 is supplied. The power supply voltage Vcc1 is based on the reference potential Vss of the switch SW5, to which the power supply voltage Vcc (+15 to 20 V) is added.

Next, an internal configuration of the predrive circuit 32-2 will be explained. As shown in FIG. 12, the predrive circuit 32-2 is configured with a signal transmit circuit 61, which compares the control signal CTL2 with the reference voltage Vcnt and outputs a flow signal VLS2, which is level shifted according to the power supply voltage Vcc1 and the substrate potential Vsub based on the comparison result, and a signal amplification circuit 62, which amplifies the flow signal VLS2.

Next, the signal transmit circuit 61 will be explained. The signal transmit circuit 61 comprises a first input line which is connected to the input terminal "VIN+". To this first input line, the control signal CTL2 will be input. The signal transmit circuit 61 comprises a second input line which is connected to the input terminal "VIN−". To this second input line, the reference voltage Vcnt will be input. The signal transmit circuit 61 comprises a first power supply line which is connected to the power supply terminal "Vd". To this first power supply line, the power supply voltage Vdd will be supplied. The signal transmit circuit 61 comprises a first reference potential line which is connected to the reference potential terminal "Vsub". To this first reference potential line, the substrate potential Vsub will be supplied. The signal transmit circuit 61 comprises a second power supply line which is connected to the power supply terminal "Vc". To this second power supply line, the power supply voltage Vcc1 will be supplied. The signal transmit circuit 61 comprises an output line to output the flow signal VLS2 which is based on the CTL2, whose reference potential is level shifted by the substrate potential Vsub and the power supply voltage Vcc1.

Through the above configuration, the signal transmit circuit 61 compares the CTL2, which is input to the input terminal "VIN+", with the reference voltage Vcnt, which is input to the input terminal "VIN−". If the CTL2 surpasses the reference voltage Vcnt, the signal transmit circuit 61 generates a flow signal VSL1 shown in FIG. 13, which is level shifted by the substrate potential Vsub input to the reference potential terminal Vsub. Further, the VLS1 is level shifted by the power supply voltage Vcc1 and the substrate potential Vsub, and the generated flow signal VLS2 will be output from the output line.

Next, the signal amplification circuit 62 will be explained. The signal amplification circuit 62 comprises an input line which is connected to the output line of the signal transmit circuit 61. To this input line, the flow signal VLS2 will be input. The signal amplification circuit 62 comprises a power supply line which is connected to the power supply terminal "Vc". To this power supply line, the power supply voltage Vcc1 will be supplied. The signal amplification circuit 62 comprises a reference potential line which is connected to the reference potential terminal "Vs". To this reference potential line, the reference potential Vss will be input. The signal amplification circuit 62 comprises an output line which is connected to the gate terminal of the switch SW5. From this output line, the drive signal Vg, which is an amplified signal VLS2 input from the signal transmit circuit 61, will be output. Through the above configuration, the signal amplification circuit 62 amplifies the flow signal VLS2, which is output from the signal transmit circuit 61, and outputs the drive signal Vg to the gate terminal of the switch SW5.

Next, a rectifying circuit 63 will be explained. The rectifying circuit 63 comprises an input terminal which is connected to the Vss supply line. To this input line, the reference potential Vss will be supplied. The rectifying circuit 63 comprises an output line which is connected to the reference potential terminal "Vsub". From this output line, the substrate potential Vsub will be supplied. As described above, the rectifying circuit 63 rectifies the reference potential Vss, which periodically changes from −Vs/2 to Vs/2, to generate the substrate potential Vsub, whose potential is constant at −Vs/2.

If the amplitude of the flow signal VLS2, which is output from the flow signal circuit 61, is adequate amplitude to drive the switch SW5, the signal amplification circuit 62 can be elided.

Next, an example of input/output signals for the predrive circuit 32-2 will be explained. The CTL2 which is input to the input terminal "VIN" is a rectangular pulse signal (amplitude is 5 V) whose reference potential is GND (0(zero) V). The reference voltage Vcnt which is input to the input terminal "VIN–" is based on the GND as a reference potential and whose voltage value is constant at 2.5 V. The substrate potential Vsub, which is input to the reference potential terminal "Vsub", is constant at potential –Vs/2, the lowest value of the reference potential Vss.

As mentioned above, the reference potential Vss takes one of the three values GND (0(zero) V), –Vs/2 (negative voltage), and Vs/2 (positive voltage). The reference potential Vss changes periodically to any of the above three values. Then, the predrive circuit 32-2 outputs the drive signal Vg, whose reference potential will be Vss according to the input control signal CTL2. Accordingly, the outputs of the output elements (SW4, SW5) shown in FIG. 1 will form the waveforms shown in FIG. 25.

In the predrive circuit 32-2, while CTL2=0(zero) V is input to the input terminal "VIN+", the drive signal Vg exhibits the same potential as the reference potential Vss. When the CTL2 which is input to the input terminal "VIN+" with prescribed pulse width has the higher voltage value than the reference voltage Vcnt which is input to the input terminal "VIN–", the drive signal Vg which is output from the predrive circuit 32-2 exhibits higher potential than the reference potential Vss by the power supply voltage Vcc and the same pulse width as CTL2.

Next, a schematic configuration of the signal transmit circuit 61 and a circuitry example of the rectifying circuit 63 which are configured in the predrive circuit 32-2 will be explained.

Figure 13:
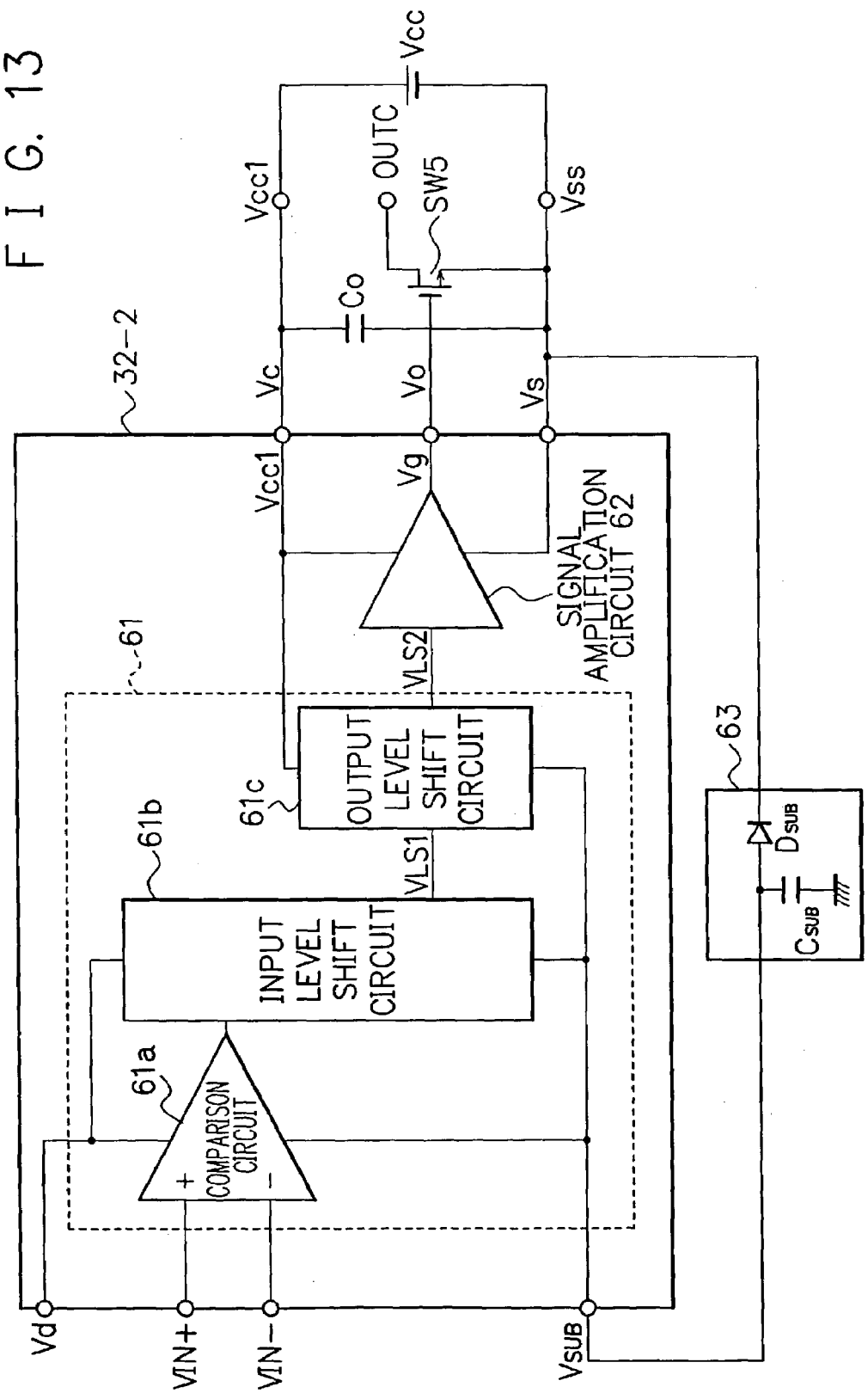
FIG. 13 is a block diagram showing a schematic configuration of a signal transmit circuit 61 shown in FIG. 12.

FIG. 13 is a block diagram showing the schematic configuration of the signal transmit circuit 61 shown in FIG. 12. As shown in FIG. 13, the signal transmit circuit 61 is configured with a comparison circuit 61a, an input level shift circuit 61b, and an output level shift circuit 61c. A power supply terminal of the comparison circuit 61a and a power supply terminal of the input level shift circuit 61b are connected to the power supply terminal "Vd" (first power supply line) of the predrive circuit 32-2, which supplies the power supply voltage Vdd. An input terminal "+" of the comparison circuit 61a is connected to the input terminal "VIN+" (first input line) of the predrive circuit 32-2, which inputs the control signal CTL2. An input terminal "–" of the comparison circuit 61a is connected to the input terminal "VIN–" (second input line) of the predrive circuit 32-2, which inputs the reference voltage Vcnt (reference voltage signal) for comparison with the control signal CTL2.

Reference potential terminals of the comparison circuit 61a, the input level shift circuit 61b, and the output level shift circuit 61c are connected to the reference potential terminal "Vsub" (first reference potential line) of the predrive circuit 32-2, which supplies the substrate potential Vsub. An output terminal of the comparison circuit 61a is connected to an input terminal of the input level shift circuit 61b (output line), to which a signal showing a comparison result is output. An output terminal of the input level shift circuit 61b is connected to an input terminal of the output level shift circuit 61c (output line), to which the flow signal VSL1 is output. The power supply terminal of the output level shift circuit 61c is connected to the power supply terminal "Vc" of the predrive circuit 32-2 (second power supply line), which supplies the power supply voltage Vcc1. An output terminal of the output level shift circuit 61c is connected to an input terminal of the signal amplification circuit 62, to which the flow signal VLS2 is output.

Through the above configuration, the comparison circuit 61a compares the CTL2, which is input to the input terminal "VIN+", with the reference voltage Vcnt, which is input to the input terminal "VIN–". In a case that the CTL2 surpasses the reference voltage Vcnt, an H level signal will be output. In a case that the CTL2 does not surpass the reference voltage Vcnt, an L level signal will be output. According to the output signal from the comparison circuit 61a, the input level shift circuit 61b generates the flow signal VLS1, which is level shifted according to the substrate potential Vsub input to the reference potential terminal "Vsub", and outputs this flow signal VLS1. Then, the output level shift circuit 61c level shifts the VLS1, output from the input level shift circuit 61b, according to the power supply voltage Vcc1 and the substrate potential Vsub, and outputs the flow signal VLS2 to the output line.

Next, a circuitry example of the rectifying circuit 63 shown in FIG. 13 will be explained. As shown in FIG. 13, the rectifying circuit 63 is configured with a diode Dsub and a capacitor Csub. A cathode terminal of the diode Dsub is connected to the Vss supply line, which supplies the reference potential Vss. An anode terminal of the diode Dsub is connected to one terminal of the capacitor Csub. The other terminal of the capacitor Csub is connected to the GND. A point of interface between the diode Dsub and the capacitor Csub is connected to the reference potential terminal "Vsub" of the predrive circuit 32-2, to which the substrate potential Vsub is output.

Through the above configuration, the rectifying circuit 63 rectifies the reference potential Vss which periodically changes from –Vs/2 to Vs/2, to generate the substrate potential Vsub, whose potential is approximately constant at –Vs/2. For example, if the potential of the capacitor Csub is GND (0(zero) V) in an initial condition, the diode Dsub will not let through the potential changes of 0(zero) to Vs/2 of the reference potential Vss to the capacitor Csub, whereas the changes from 0(zero) to Vs/2 will be supplied to the capacitor Csub. When the potential of the capacitor Csub reaches –Vs/2, the electric current through the diode Dsub will be stopped. Consequently, an electric charge according to the potential –Vs/2 is stored in the capacitor Csub, so that the rectifying circuit 63 outputs the substrate potential Vsub which is constant at voltage –Vs/2.

As described above, through the configuration with the comparison circuit 61a, the input level shift circuit 61b, and the output level shift circuit 61c, the signal transmit circuit 61 generates the flow signal VLS2, which is level shifted to the power supply voltage Vcc1 and the substrate potential Vsub, according to the change of the control signal CTL2 whose reference potential is GND, and outputs this flow signal VLS2. In addition, configurations of the signal amplification 62 and the switch SW5 as an output element are identical to those shown in FIG. 12. Accordingly, the signal amplification circuit 62 amplifies the flow signal VLS2, which is output from the signal transmit circuit 61, to the enough amplitude to drive the SW5, and outputs the amplified signal as drive signal Vg. Then, the switch SW5 will be turned on and/or off by the drive signal Vg to output a voltage to the output line OUTC which is connected to the drain terminal, thereby the voltage will be applied to the load 20.

Next, a circuitry example of the predrive circuit 32-2 described above will be explained with reference to the drawings.

FIG. 14 is a diagram showing the circuitry example of the predrive circuit 32-2 shown in FIG. 13. First, circuitries of the comparison circuit 61a, the input level shift circuit 61b, and the output level shift circuit 61c which are configured in the signal transmit circuit 61 will be explained. As shown in FIG. 14, the comparison circuit 61a is configured with a pnp transistor Q1 and a pnp transistor Q2. A base connector of the pnp transistor Q1 is connected to the input terminal "VIN+", which inputs the control signal CTL2. An emitter terminal of the pnp transistor Q1 is connected to the power supply terminal "Vd" through the resistor R1, which supplies power supply voltage Vdd. A collector terminal of the pnp transistor Q1 is connected to the reference potential terminal "Vsub", which supplies the substrate potential Vsub.

A base terminal of the pnp transistor Q2 is connected to the input terminal "VIN−", which inputs the reference voltage Vcnt. An emitter terminal of the transistor Q2 is connected to a point of interface between the emitter terminal of the transistor Q1 and the resistor R1, which supplies the power supply voltage Vdd. A collector terminal of the pnp transistor Q2 is connected to a collector terminal of a npn transistor Q3.

As shown in FIG. 14, the input level shift circuit 61b is configured with the pnp transistor Q2, a npn transistor Q3, the resistor R1, and a resistor R2. Further, the input level shift circuit 61b and the comparison circuit 61a share the pnp transistor Q2. Here, pnp transistor Q2 and the resistor R1 are connected as described above, and a base terminal of the npn transistor Q3 is connected to a base terminal of a npn transistor Q4. A point of interface between the collector terminal of the pnp transistor Q2 and the collector terminal of the npn transistor Q3 is connected to a point of interface of the base terminal of the npn transistor Q3 and the base terminal of the npn transistor Q4. Accordingly, the input level shift circuit 61b outputs the flow signal VLS1. An emitter terminal of the npn transistor Q3 is connected to the reference potential terminal "Vsub" through the resistor R2, which supplies the substrate potential Vsub.

As shown in FIG. 14, the output level shift circuit 61c is configured with the npn transistor Q4, a pnp transistor Q5, and resistors R3 and R4. An emitter terminal of the npn transistor Q4 is connected to the reference potential terminal "Vsub" through the resistor R3, which supplies the substrate potential Vsub. A collector terminal of the npn transistor Q4 is connected to a collector terminal of the pnp transistor Q5. A base terminal of the pnp transistor Q5 is connected to a base connector of a pnp transistor Q6. A point of interface between the collector terminal of npn transistor Q4 and the collector terminal of pnp transistor Q5 is connected to a point of interface between the base terminal of the pnp transistor Q5 and the base terminal of the pnp transistor Q6. Through the configuration above, the output level shift circuit 61c outputs the flow signal VLS2. Additionally, the emitter terminal of the pnp transistor Q5 is connected to the power supply terminal "Vc" through the resistor R4, which supplies the power supply voltage Vcc1.

Next, a circuitry of the signal amplification terminal 62 will be explained. As shown in FIG. 14, the signal amplification circuit 62 is configured with resistors R5 and R6, the pnp transistor Q6, an inverter INV, an n-channel MOSFET Q7 and an n-channel MOSFET Q8. An emitter terminal of the pnp transistor Q6 is connected to the power supply terminal "Vc" through the resistor R5, which supplies the power supply voltage Vcc1. A collector terminal of the pnp transistor Q6 is connected to the reference potential terminal "Vs" through the resistor R6, which supplies the reference potential Vss. A point of interface between the collector terminal of the pnp transistor Q6 and the resistor R6 is connected to an input terminal of the inverter INV and a gate terminal of the n-channel MOSFET Q7.

A drain terminal of the n-channel MOSFET Q7 is connected to the power supply terminal "Vc", which supplies power supply voltage Vcc1. A source terminal of the n-channel MOSFET Q7 is connected to a drain terminal of the n-channel MOSFET Q8. A gate terminal of the n-channel MOSFET Q8 is connected to an output terminal of the inverter INV. A source terminal of the n-channel MOSFET Q8 is connected to the reference potential terminal "Vs", which supplies reference potential Vss. A point of interface between the source terminal of the n-channel MOSFET Q7 and the drain terminal of the n-channel MOSFET Q8 is connected to the output terminal "Vo", which outputs the drive signal Vg to drive the switch SW5. Through the above configuration, the flow signal VLS2, which is supplied from the signal transmit circuit 61, is amplified, and the drive signal Vg is output to the gate terminal of the switch SW5.

Next, an operation of the predrive circuit 32-2 described above will be explained.

Figure 15:
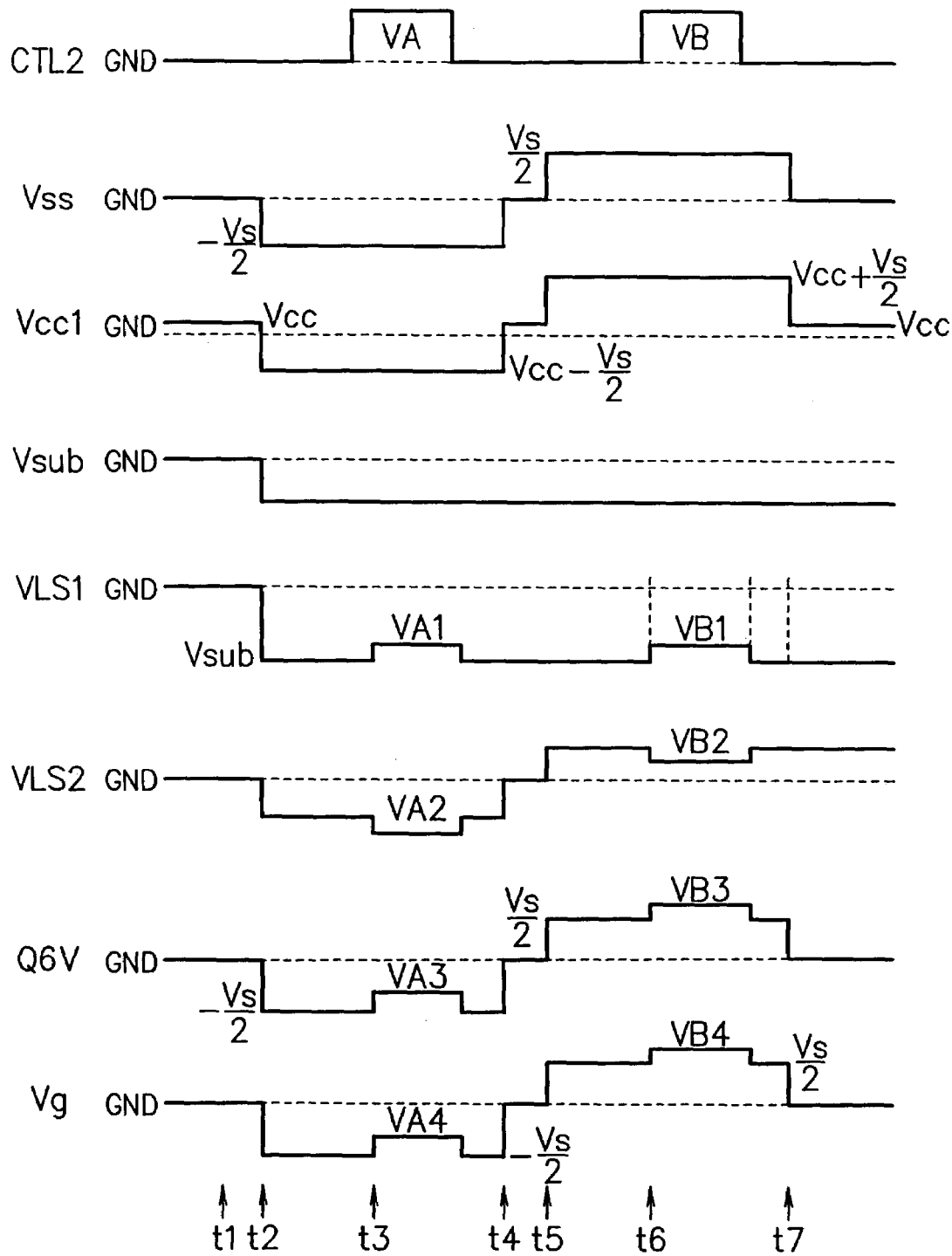
FIG. 15 is a diagram showing an example of input signals and output signals of the predrive circuit 32-2 shown in FIG. 14.

FIG. 15 is a diagram showing an example of input signals and output signals of the predrive circuit 32-2 shown in FIG. 14. As shown in FIG. 15, for a case as of the control signal CTL2 whose reference potential is GND, a pulse VA and a pulse VB (amplitude is 3 V to 5 V) are supplied to the input terminal "VIN+" of the predrive circuit 32-2, and the reference potential Vss with changes from GND (0(zero) V) to −Vs/2 (−80 V) or Vs/2 (80 V) is also supplied to the predrive circuit 32-2, an operation of the predrive circuit 32-2 will be explained as follows.

Here, the purpose of the changes of the reference potential Vss shown in FIG. 15 will be explained. In the display device shown in FIG. 1, during the sustain discharge period, the sustaining discharge is needed to be conducted by alternatively applying the voltages of different polarity (+Vs/2, −Vs/2) to the common electrode X and the scan electrode Y for each display line. Thus, the positive voltage +Vs/2 and the negative voltage −Vs/2 are alternatively applied to the common electrode X on the load 20. In other words, the reference potential Vss of the switch SW5 as an output element is changed from −Vs/2 to Vs/2. On the other hand, the reference potentials of the switch SW5' as an output element and the scan driver 22 are changed from −Vs/2 to Vs/2, so that they alternatively apply the positive voltage +Vs/2 and the negative voltage −Vs/2 to the scan electrode Y on the load 20.

At this time, the reference potentials Vss which are respectively applied to the switches SW5 and SW5' are applied in the way that the phase of the voltage is reversed to each other. Namely, when the positive voltage (Vs/2) is applied to the switch SW5, the negative voltage (−Vs/2) is applied to the switch SW5'. Therefore, the outputs of the switches SW5 and SW5' maintain the potential difference between the common electrode X and the scan electrode Y at a level which the sustaining discharge can be conducted between the common electrode X and the scan electrode Y. For the purpose described above, the reference potential Vss will be changed by the timing shown in FIG. 15.

Next, in FIG. 15, for the operation of the predrive circuit 32-2 according to the changes of CTL2 and Vss, the changes of the signal Vsub, VLS1, VLS2, Q6V, and Vg which are shown in the circuitry in FIG. 13 or FIG. 14 will be explained in a sequential order for time t1 to t7 with reference to FIG. 15. Hereafter, unless described as to be seen in FIG. 13, explanations refer to the circuits shown in FIG. 14.

First, at the time t1 and the Vss=0(zero) V, the output of the rectifying circuit 63 shown in FIG. 13 is Vsub=0(zero) V, and the Vcc1 equals Vcc due to the capacitor Co shown in FIG. 13. Since the time is t1 and CTL2 is 0(zero) V, the pnp transistor Q1 will be turned on, and the transistor Q2 remains off. Consequently, the npn transistor Q3 remains off, and the flow signal VLS1, which is output from the input level shift circuit 61b, is 0(zero) V. Then, the npn transistor Q4 remains off, and the pnp transistor Q5 also remains off. Therefore, the flow signal VLS2, which is output from the signal transmit circuit 61, will be approximate to Vcc1 that equals Vcc.

Since the flow signal VLS2 is approximate to the Vcc, pnp transistor Q6 remains off. Then, Q6V which is an output signal of the pnp transistor Q6 equals the potential of the Vss which is 0(zero) V. Accordingly, the n-channel MOSFET Q7 remains off, and the n-channel MOSFET Q8 turns on, so that the output signal Vg from the signal amplification circuit 62 will be 0(zero) V.

Next, at the time t2 and in a case that the Vss changes to −Vs/2, the capacitor C2 in the rectifying circuit 63 will be charged with voltage −Vs/2, so the Vsub will be approximate to −Vs/2. The Vcc1 equals Vcc−Vs/2. Since the time is t2 and the CTL2 is still 0(zero) V, the pnp transistor Q1 remains on, and the pnp transistor Q2 remains off. Because the Vsub is approximate to −Vs/2, there are formed a potential difference between the base terminal and the emitter terminal of the npn transistor Q3, so that the npn transistor Q3 will be turned on temporarily. When the voltage of the base terminal of the npn transistor Q3 becomes the same voltage as Vsub, the npn transistor Q3 will be turned off. Consequently, the flow signal VLS1 which is output from the input level shift circuit 61b will be the same voltage as Vsub. Similarly, the npn transistor Q4 will be turned on temporarily to make the collector terminal of the npn transistor Q4 as approximately the same voltage as Vsub. Then, the npn transistor Q4 will be tuned off simultaneously with the npn transistor Q3.

Next, the potential of the base terminal of the pnp transistor Q5 becomes Vsub which is approximate to −Vs/2. Then, due to the potential difference Vcc1=Vcc−Vs/2 between the base terminal and the emitter terminal of the pnp transistor Q5, the pnp transistor Q5 is turned on temporarily. When the potential of the base terminal of the pnp transistor Q5 becomes approximate to Vcc1=Vcc−Vs/2, the pnp transistor Q5 will be turned off. Then, the signal transmit circuit 61 outputs the flow signal VLS2 which is approximate to Vcc−Vs/2. Since the flow signal VLS2 is approximate to Vcc−Vs/2, the pnp transistor Q6 remains off. The output signal Q6V of the pnp transistor Q6 will be the same potential as Vss, which is −Vs/2. As a result, the n-channel MOSFET Q7 will be turned off, and the n-channel MOSFET Q8 will be turned on, so that the output signal of the signal amplification circuit 62 will be Vg=−Vs/2.

Next, at the time t3, the CTL2 rises with the pulse VA. In the comparison circuit 61a, since the voltage value of the pulse VA surpasses the constant voltage Vcnt input to the input terminal "VIN−", the pnp transistor Q1 will be turned off, and the pnp transistor Q2 will be turned on. Consequently, the npn transistor Q3 will be turned on, and the voltage value of the flow signal VLS1, which is output from the input level shift circuit 61b, changes to the voltage value between Vsub and Vdd which corresponds to a voltage drop across the resistor R2 to form the pulse VA1 (rise signal) shown in FIG. 15.

Since the npn transistor Q3 is turned on, the npn transistor Q4 will be turned on. Then, the pnp transistor Q5 will be turned on. Consequently, the voltage value of the flow signal VSL2, which is output from the signal transmit circuit 61, changes to the voltage value between Vsub and Vcc1 (−Vs/2 and Vcc−Vs/2) which corresponds to a voltage drop across the resistor R3 to form the pulse VA2 (fall signal) shown in FIG. 15. Since the pnp transistor Q5 is turned on, the pnp transistor Q6 will be turned on. Accordingly, the Q6V which is an output signal of the pnp transistor Q6 changes to the voltage value between Vsub and Vcc1 (−Vs/2 and Vcc−Vs/2) which is divided by the resistors R5 and R6 to form the pulse VA3 shown in FIG. 15.

Consequently, the n-channel MOSFET Q7 will be turned on, and the n-channel MOSFET Q8 will be turned off, so that the output signal of the signal amplification circuit 62 changes to Vg=Vcc−Vs/2 to form the pulse V4 as shown in FIG. 15. When the pulse VA shown in FIG. 15 falls (CTL2 returned to 0(zero) V), each pulse VA1 to VA4 will fall, too, and the predrive circuit 32-2 returns to the state between t2 and t3.

Next, at the time t4, the Vss will be returned to 0(zero) V. In the rectifying circuit 63 in FIG. 13, due to the function of the diode Dsub, the voltage of the capacitor Csub is maintained at −Vs/2, so the Vsub is maintained at −Vs/2. At the time t4, Vcc1 equals Vcc. Since the time is t4 and the control signal CTL2 is still 0(zero) V, the pnp transistor Q1 remains on, and the pnp transistor Q2 remains off. The npn transistor Q3 also remains off. Accordingly, the voltage value of the flow signal VLS1, which is output from the input level shift circuit 61b, remains as Vsub which is approximate to −Vs/2. Similarly, the npn transistor Q4 remains off.

Next, the pnp transistor Q5 will be turned on temporarily, due to the potential difference formed between its emitter terminal whose potential is Vcc1=Vcc and its base terminal whose potential is Vcc−Vs/2. The pnp transistor Q5 will be turned off when the potential of its base terminal becomes approximate to Vcc1=Vcc. Then, the flow signal VLS2, which is output from the signal transmit circuit 61, will be approximate to Vcc. Since the flow signal VLS2 is approximate to Vcc, the pnp transistor Q6 remains off. The output signal Q6V of the pnp transistor Q6 is the same potential as Vss which is 0(zero) V. As a result, the n-channel MOSFET Q7 will be turned off, and the n-channel MOSFET Q8 will be turned on, so that the output signal of the signal amplification circuit 62 will be Vg=0(zero) V.

Next, at the time t5, the reference potential Vss will be increased to Vs/2. In the rectifying circuit 63 in FIG. 13, due to the function of the diode Dsub, the voltage of the capacitor Csub is maintained at Vs/2, so the Vsub is maintained at −Vs/2. At the time t5, the Vcc1 equals Vcc+Vs/2. Since the time is t5 and the control signal CTL2 is still 0(zero) V, the pnp transistor Q1 remains on, and the pnp transistor Q2 remains off. The npn transistor Q3 also remains off. Accordingly, the voltage value of the flow signal VLS1, which is output from the input level shift circuit 61b, remains as Vsub which is approximate to −Vs/2. Similarly, the npn transistor Q4 remains off.

Next, the pnp transistor Q5 will be turned on temporarily, due to the potential difference formed between its emitter terminal whose potential is Vcc1=Vcc+Vs/2 and its base terminal whose potential is Vcc. The pnp transistor Q5 will be turned off when the potential of its base terminal becomes approximately Vcc1=Vcc+Vs/2. Then, the flow signal VLS2, which is output from the signal transmit circuit 61, will be approximate to Vcc+Vs/2. Since the flow signal VLS2 is approximate to Vcc+Vs/2, the pnp transistor Q6 remains off. The output signal Q6V of the pnp transistor Q6 is the same potential as Vss which is +Vs/2. As a result, the n-channel MOSFET Q7 will be turned off, and the n-channel MOSFET Q8 will be turned on, so that the output signal Vg of the signal amplification circuit 62 will be +Vs/2.

Next, at the time t6, the CTL2 rises with the pulse VB. In the comparison circuit 61a, since the voltage value of the pulse VB surpasses the constant voltage Vcnt input to the input terminal "VIN−", the pnp transistor Q1 will be turned off, and the pnp transistor Q2 will be turned on. Consequently, the npn transistor Q3 will be turned on, and the voltage value of the flow signal VLS1, which is output from the input level shift circuit 61b, changes to the voltage value between Vsub and Vdd which surpasses the resistance value of resistor the R2 to form the pulse VB1 (rise signal) shown in FIG. 15.

Since the npn transistor Q3 is turned on, the npn transistor Q4 will be turned on. Then, the npn transistor Q5 will be turned on, too. Consequently, the voltage value of the flow signal VSL2, which is output from the signal transmit circuit 61, changes to the voltage value between Vsub and Vcc1 (−Vs/2 and Vcc+Vs/2) which surpasses the resistance value of the resistor R3 to form the pulse VB2 (fall signal) shown in FIG. 15. Since the pnp transistor Q5 is turned on, the pnp transistor Q6 will be turned on. Accordingly, the Q6V which is an output signal of the pnp transistor Q6 changes to the voltage value between Vsub and Vcc1 (+Vs/2 to Vcc+Vs/2) which is divided by the resistors R5 and R6 so as to form the pulse VB3 shown in FIG. 15.

Consequently, the n-channel MOSFET Q7 will be turned on, and the n-channel MOSFET Q8 will be turned off, so that the output signal of the signal amplification circuit 62 changes to Vg=Vcc+Vs/2 to form the pulse VB4. When the pulse VA shown in FIG. 15 falls (CTL2 returned to 0(zero) V), each pulse VB1 to VB4 will fall, too, and the predrive circuit 32-2 returns to the state between t5 and t6.

Next, at the time t7, the Vss will be returned to 0(zero) V. In the rectifying circuit 63 in FIG. 13, due to the function of the diode Dsub, the voltage of the capacitor Csub is maintained at −Vs/2, so the Vsub is maintained at −Vs/2. At the time t7, Vcc1 equals Vcc. Since the time is t7, and the control signal CTL2 is still 0(zero) V, the pnp transistor Q1 remains on, and the pnp transistor Q2 remains off. The npn transistor Q3 also remains off. Accordingly, the voltage value of the flow signal VLS1, which is output from the input level shift circuit 61b, remains as Vsub which is approximate to −Vs/2. Similarly, the npn transistor Q4 remains off.

Next, the pnp transistor Q5 remains off since the potential of its base terminal is approximate to Vcc+Vs/2. Then, the flow signal VLS2, which is output from the signal transmit circuit 61, remains approximate to Vcc+Vs/2, so the pnp transistor Q6 is turned off. The output signal Q6V of the pnp transistor Q6 is the same potential as Vss which is 0(zero) V. As a result, the n-channel MOSFET Q7 will be turned off, and the n-channel MOSFET Q8 will be turned on, so that the output signal of the signal amplification circuit 62 will be Vg=0(zero) V.

As described above, the display device shown in FIG. 1 can be stably driven by using the predrive circuit as the embodiment of the present invention, while preventing an overcurrent charge to a parasitic diode, which occurs between the substrate that provides the substrate potential as a reference potential and the transistors, even when the reference potentials GND of the input signals CTL1, CTL2, CTL3, and CLT4, which are input from the drive control circuit 31, are different from the reference potentials of signal lines OUTB and OUTB' for driving the output elements SW4, SW5, SW4', and SW5', and further the reference potentials of signal lines OUTB and OUTB' turns to negative voltage value.

Figure 16:
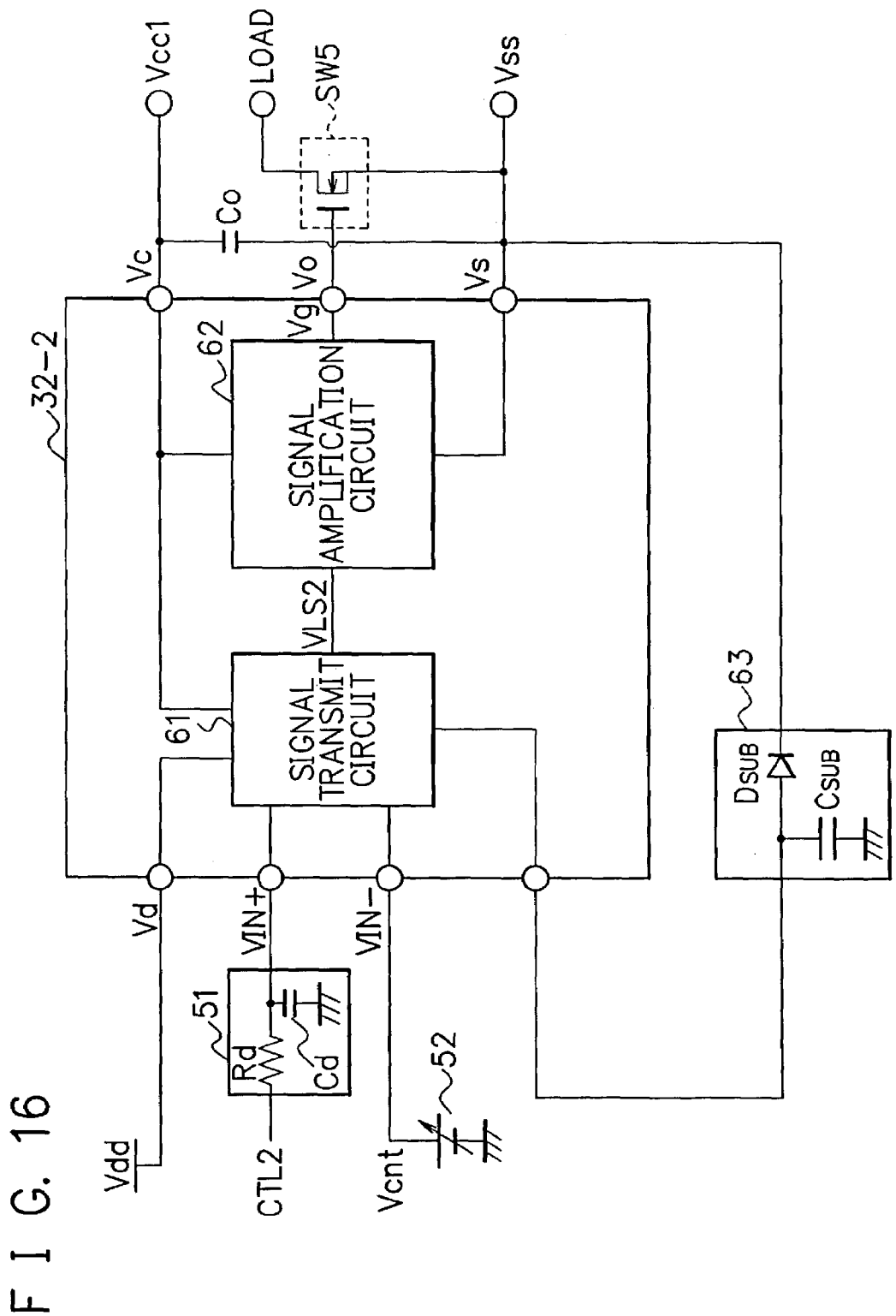
FIG. 16 is a block diagram showing another configuration example of the predrive circuit 32-2.

FIG. 16 is a block diagram showing another configuration example of the predrive circuit 32-2.

The predrive circuit 32-2 shown in FIG. 16 is a predrive circuit shown in FIG. 12 to which a time constant circuit 51 and a constant voltage circuit 52 are further installed.

In FIG. 16, the time constant circuit 51 and the constant voltage circuit 52 are for adjusting a delay of phase, which occurs when the control signals supplied form the drive control circuit 31 through the predrive circuit 32-2 and further supplied to the output elements, between the predrive circuits 32-1 to 32-4. In addition, the circuitry configurations of the predrive circuits 32-1, 32-2, and 32-4 are identical to that of the predrive circuit 32-2.

Namely, when the control signals supplied from the drive control circuit 31 are converted whose reference potentials by the signal transmit circuit 61 or amplified by the signal amplification circuit 62, the delay of phase occurs to these control signals which are output from the predrive circuit, due to the dispersion of elements which configures the signal transmit circuit 61 and signal amplification circuit 62.

The time constant circuit 51 and the constant voltage circuit 52 adjust the delay of phase caused by the signal transmit circuit 61 and the signal amplification circuit 62, synchronizing the phase between the predrive circuits 32-1 and 32-4, and supply the control signals to each of the output element.

As shown in FIG. 16, the time constant circuit 51 can be configured with a capacitor Cd and a resistor Rd. In the time constant circuit 51, the resistor Rd is inserted serially to the signal line which inputs the output signal CTL2 to the input terminal "VIN+". One terminal of the capacitor Cd is connected to a point of interface between the resistor Rd and the input terminal "VIN+". The other terminal of the capacitor Cd is connected to the ground. According to the above configuration, the control signal CTL2 to be input to the predrive 32-2 will be adjusted its delay of phase by controlling a capacity value of the capacitor Cd and a resistance value of the resistor Rd.

The constant voltage circuit 52 is a circuit which outputs a constant voltage, and whose voltage value can be controlled. An output voltage Vcnt of this constant voltage circuit 52 will be supplied to the input terminal "VIN−". Accordingly, a random voltage value of the CTL2 signal which gradually rises from the time constant circuit 51 can be used as a voltage value of the Vcnt for comparison. Namely, the timing to convert the output of the comparison circuit 61a can be adjusted, so that the output timing of the predrive circuit 32-2 can be controlled. Additionally, reference potentials of the time constant circuit 51 and the constant voltage circuit 52 are the same as the control signal, which is GND (0(zero) V).

Figure 17A:
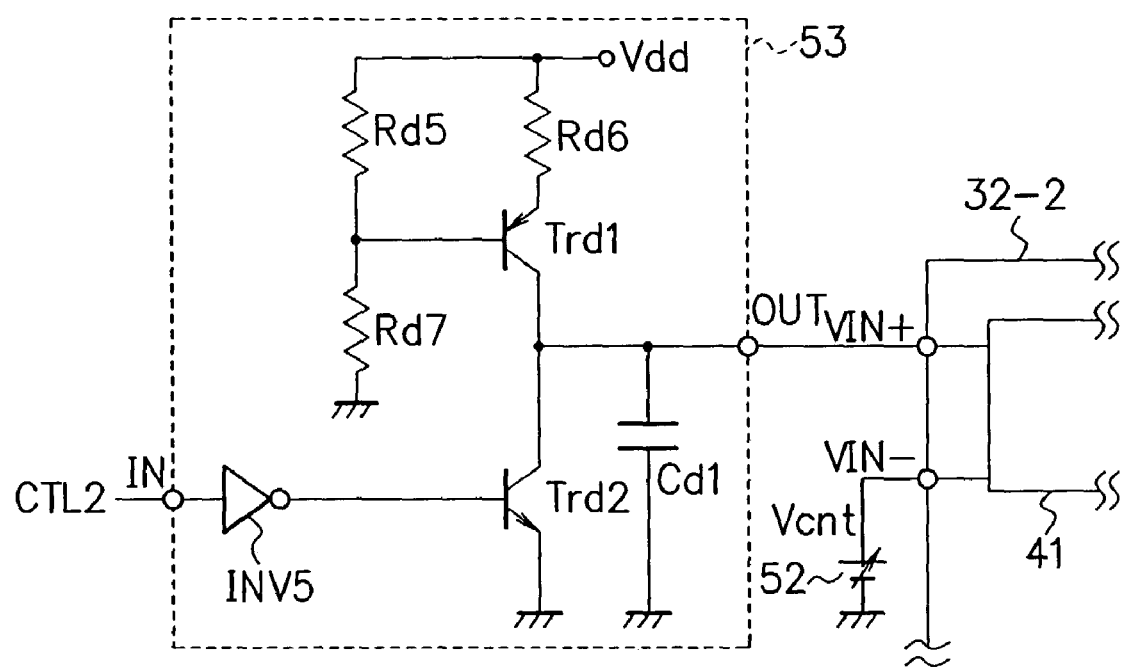
FIG. 17A is a diagram showing a configuration example in which a ramp wave generating circuit 53 is installed, instead of a time constant circuit 51 shown in FIG. 16.
Figure 17B:
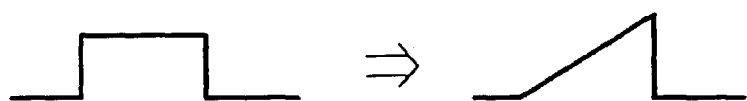
FIG. 17B is a diagram showing waveforms of input/output signals of a ramp wave generating circuit 53 shown in FIG. 17A.

FIG. 17A is a diagram showing a configuration example in which a ramp wave generating circuit 53 is installed, instead of the time constant circuit 51 shown in FIG. 16. As shown in FIG. 17B, the ramp wave generating circuit 53 is a circuit which generates and outputs a ramp wave when a rectangular wave is input. Accordingly, any voltage value of the ramp wave which increases in proportion as time can be set as a voltage value Vcnt as a reference for comparison, so that the delay time in predrive circuit 32-2 can by adjusted by the voltage value Vcnt.

Here, a circuitry of the ramp wave generating circuit 53 shown in FIG. 17A will be explained. The ramp wave generation circuit 53 is configured with an inverter INV5, a pnp transistor Trd1, a npn transistor Trd2, resistors Rd5, Rd6, and Rd7, and a capacitor Cd1. In addition, the ramp wave generation circuit comprises an input terminal IN to which the control signal CTL2 will be input, and an output terminal OUT which outputs the ramp wave.

A base terminal of the npn transistor Trd2 is connected to the input terminal IN through the inverter INV5, which inputs the inverted CTL2. An emitter terminal of the npn transistor Trd2 is connected to the GND. A collector terminal of the npn transistor Trd2 is connected to an emitter terminal of the pnp transistor Trd1, which inputs output signals from the emitter terminal of the pnp transistor Trd1. A collector terminal of the pnp terminal Trd1 is connected to a power supply terminal through the resistor Rd5, which supplies the power supply voltage Vdd. The resistors Rd5 and Rd7 are connected in series between the power supply terminal and the GND to divide the power supply voltage Vdd.

A base terminal of the pnp transistor Trd1 is connected to a point of interface between the resistor Rd5 and Rd7, which supplies a divided voltage of the power supply voltage Vdd. A point of interface between the collector terminal of the npn transistor Trd2 and the emitter terminal of the pnp transistor Trd1 is connected to the output terminal OUT and one terminal of the capacitor Cd1. The other terminal of the capacitor Cd1 is connected to the GND.

Through the above configuration, the ramp wave generating circuit 53 outputs a ramp wave whose voltage gradually increases with rising of the CTL2. An operation of the ramp wave generating circuit 53 will be explained below. First, when the CTL2 rises, the output of the inverter INV5 will fall. Then, the npn transistor Trd2 is turned off, and the capacitor Cd1 starts storing the output of the npn transistor Trd1 as electric charge. Consequently, a voltage generated in the capacitor Cd1 gradually increases, and its voltage value will be output through the output terminal OUT as a ramp wave voltage.

Therefore, the delay of phase due to the dispersion of elements which configures the signal transmit circuit 61 and the signal amplification circuit 62 can be adjusted by installing the time constant control circuit 51 or the ramp wave generating circuit 53 and the constant voltage circuit 52, in the input side of the predrive circuit 32-2, thus stabilizing the operation of the output elements. In addition, the circuitry of the time constant circuit 51 and the ramp wave generating circuit 53 are not limited to the above configuration, and other circuits with identical functions may be used.

Further, another configuration example of the driving system of the AC-PDP as the first embodiment which is shown in FIG. 9 may be used for this embodiment.

Fourth Embodiment

Next, a schematic configuration of a predrive circuit 32a as a fourth embodiment which includes combined functions of the predrive circuit 32-1 and the predrive circuit 32-2 shown in FIG. 1 will be explained with reference to the drawings. This predrive circuit 32a also comprises a simultaneous-on preventing function which prevents the switches SW4 and SW5 from being turned on simultaneously.

FIG. 18 is a diagram showing a schematic configuration of the predrive circuit 32a as the fourth embodiment which includes combined functions of the predrive circuit 32-1 and the predrive circuit 32-2.

First, terminals which are comprised in the predrive circuit 32a will be explained. In FIG. 18, the predrive circuit 32a comprises input terminals "VIN1+", "VIN1−", "VIN2+", and "VIN2−", output terminals "Vo1" and "Vo2", power supply terminals "Vd", "Vc1", and "Vc2", reference potential terminals "Vsub", "Vs1", and "Vs2", and a control signal terminal "CONT". The input terminal "VIN1+" inputs a control signal CTL1 from the drive control circuit 31. The input terminal "VIN2+" inputs the control signal CTL2 from the drive control circuit 31. The input terminals "VIN1−" and "VIN2−" inputs reference voltages Vcnt1 and Vcnt2 which will be the reference for comparison with the CTL1 and CTL2. In addition, amplitudes of the control signals CTL1 and CTL2 are GND (0(zero) V) to 5 V.

To the power supply terminal "Vd", the power supply voltage Vdd (5 V, for example) depending on the amplitudes of the control signals CTL1 and CTL2 will be supplied. To the reference potential terminal "Vs1", a reference potential Vss1 for the switch SW4 from the first signal line OUTA shown in FIG. 1 will be supplied. To the reference potential terminal "Vs2", a reference potential Vss2 for the switch SW5 from the second signal line OUTB shown in FIG. 1 will be supplied. To the reference potential terminal "Vsub", the substrate potential Vsub which is rectified to the minimum potential of the reference potentials Vss1 and Vss2 will be supplied.

The output terminal "Vo1" outputs a drive signal Vg1 which drives the switch SW4. The output terminal "Vo2" outputs a drive signal Vg2 which drives the switch SW5. To the power supply terminal "Vc1", power supply voltage Vcc1, which is based on the reference potential Vss1 for the switch SW4 to which +15V to +20V of the power supply voltage Vcc is added, will be supplied. To the power supply terminal "Vc2", power supply voltage Vcc2, which is based on the reference potential Vss2 for the switch SW5 to which +15V to +20V of the power supply voltage Vcc is added, will be supplied. To the control signal terminal "CONT", a control signal (H (High): activate a simultaneous-on preventing circuit 64, L (Low): deactivate a simultaneous-on preventing circuit 64) will be input.

Here, a simultaneous-on preventing circuit 64 will be explained. As shown in FIG. 18, the simultaneous-on preventing circuit 64 comprises two input terminals I1 and I2, and two output terminals O1 and O2. When two input signals which are input to the input terminals I1 and I2 are not simultaneously on (H level), the simultaneous-on preventing circuit 64 outputs the input signals from the output terminals O1 and O2 without any change. When two input signals which are input to the input terminals I1 and I2 are simultaneously on, the simultaneous-on preventing circuit 64 outputs L level signals from the output terminals O1 and O2.

Figure 19:
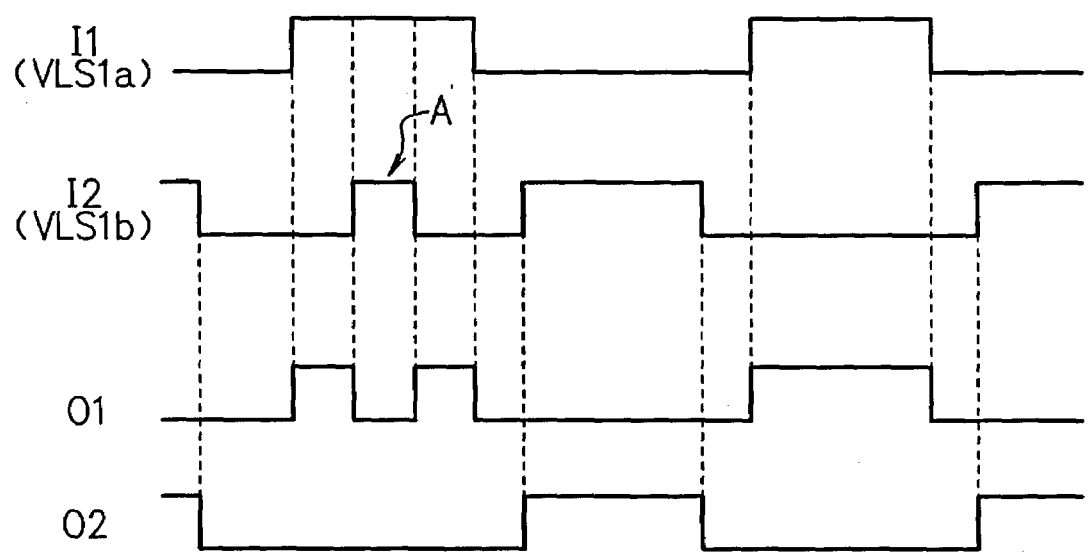
FIG. 19 is a diagram showing an example of input/output signals which shows an operation of a simultaneous-on preventing circuit 64.

FIG. 19 is a diagram showing an example of input/output signals which shows an operation of the simultaneous-on preventing circuit 64. As shown in FIG. 19, when the signal input to the input terminal I1 is in H level period, the signal input to the input terminal I2 should be in L level period. However, if a noise pulse A occurs in such period, the simultaneous-on preventing circuit 64 outputs L level signal to both output terminals O1 and O2. As described above, the simultaneous output of two H level signals from the output terminals O1 and O2 can be prevented when the input signals to the input terminals I1 and I2 both become H level.

The purpose of installing this simultaneous-on preventing circuit is to prevent the switches SW4 and SW5 from being simultaneously turned on.

Next, an internal configuration of the predrive circuit 32a will be explained. As shown in FIG. 18, the predrive circuit 32a is configured with a comparison circuit (first comparison circuit) 61a1, a comparison circuit (second comparison circuit) 61a2, a first input level shift circuit 61b1, a second input level shift circuit 61b2, a first output level shift circuit 61c1, a second output level shift circuit 61c2, a signal amplification circuit (first signal amplification circuit) 62a, a signal amplification circuit (second signal amplification circuit) 62b, and the simultaneous-on preventing circuit (simultaneous activation preventing circuit) 64. In addition, power supply terminals of the comparison circuit 61a1, the comparison circuit 61a2, the first input level shift circuit 61b1, and the second input level shift circuit 61b2 are connected to the power supply terminal "Vd" of the predrive circuit 32a, which supplies the power supply voltage Vdd.

An input terminal "+" of the comparison circuit 61a1 is connected to the input terminal "VIN1+" of the predrive circuit 32a, which inputs the control signal CTL1. An input terminal "−" of the comparison circuit 61a1 is connected to the input terminal "VIN1−" of the predrive circuit 32a, which inputs the reference voltage Vcnt1. An input terminal "+" of the comparison circuit 61a2 is connected to the input terminal "VIN2+" of the predrive circuit 32a, which inputs the control signal CTL2. An input terminal "−" of the comparison circuit 61a2 is connected to the input terminal "VIN2−" of the predrive circuit 32a, which inputs the reference voltage Vcnt2.

An output terminal of the comparison circuit 61a1 is connected to the first input level shift circuit 61b1, to which signals showing comparison results will be output. An output terminal of the first input level shift circuit 61b1 is connected to the input terminal II of the simultaneous-on preventing circuit 64, to which a flow signal VLS1a will be output. The output terminal O1 of the simultaneous-on preventing circuit 64 is connected to an input terminal of the first output level shift circuit 61c1, to which the flow signal VLS1a will be output without any change when it is not simultaneously on. A power supply terminal of the first output level shift circuit 61c1 is connected to the power supply terminal "Vc1" of the predrive circuit 32a, which supplies the power supply voltage Vcc1. An output terminal of the first output level shift circuit 61c1 is connected to an input terminal of the signal amplification circuit 62a, to which the flow signal VLS2a will be supplied.

An output terminal of the comparison circuit 61a2 is connected to the second input level shift circuit 61b2, to which signals showing comparison results will be output. An output terminal of the second input level shift circuit 61b2 is connected to the input terminal I2 of the simultaneous-on preventing circuit 64, to which a flow signal VLS1b will be output. The output terminal $O_2$ of the simultaneous-on preventing circuit 64 is connected to an input terminal of the second output level shift circuit 61c2, to which the flow signal VLS1b will be output without any change when it is not simultaneously on. A power supply terminal of the second output level shift circuit 61c2 is connected to the power supply terminal "Vc2" of the predrive circuit 32a, which supplies the power supply voltage Vcc2. An output terminal of the second output level shift circuit 61c2 is connected to an input terminal of the signal amplification circuit 62b, to which the flow signal VLS2b will be supplied.

Reference potential terminals of the comparison circuit 61a1, the comparison circuit 61a2, the first input level shift circuit 61b1, the second input level shift circuit 61b2, the first output level shift circuit 61c1, and the second output level shift circuit 61c2 are connected to the reference potential terminal "Vsub" of the predrive circuit 32a, which supplies the substrate potential Vsub.

The reference potential terminal "Vsub" and the reference potential terminal "Vs1" are connected through a diode Dsub1 in the predrive circuit 32a. A cathode terminal of the diode Dsub1 is connected to the reference potential terminal "Vs1", and an anode terminal of the diode Dsub1 is connected to the reference potential terminal "Vsub". Similarly, the reference potential terminal "Vsub" and the reference potential terminal "Vs2" are connected through a diode Dsub2 in the predrive circuit 32a. A cathode terminal of the diode Dsub2 is connected to the reference potential terminal "Vs2", and an anode terminal of the diode Dsub2 is connected to the reference potential terminal "Vsub". In addition, the other side of the reference potential terminal "Vsub" is connected to one side of a capacitor Csub, and the other side of the capacitor Csub is connected to the ground.

Accordingly, a reference potential of the anode terminal side of the diode Dsub1 and the diode Dsub2 will be Vsub, and the reference potential of the cathode terminal side of the diode Dsub1 will be Vss1, while the reference potential of the cathode terminal side of the diode Dsub2 will be Vss2. Namely, reference potential terminals of the comparison circuit 61a1, the comparison circuit 61a2, the first input level shift circuit 61b1, the second input level shift circuit 61b2, the first output level shift circuit 61c1, and the second output level shift circuit 61c2, which are operated by the reference potential Vsub are connected to a point of interface between the anode terminals of the diode Dsub1 and Dsub2, and the reference potential terminal Vsub. A reference potential terminal of the signal amplification circuit 62a is connected to the point of interface between the cathode terminal of the diode Dsub1 and the reference potential terminal "Vs1", which supplies the reference potential Vss1. A reference potential terminal of the signal amplification circuit 62b is connected to the point of interface between the cathode terminal of the diode Dsub2 and the reference potential terminal "Vs2", which supplies the reference potential Vss2.

A power supply terminal of the signal amplification circuit 62a is connected to the power supply terminal "Vc1", which supplies the power supply voltage Vcc1. A power supply terminal of the signal amplification circuit 62a is connected to the power supply terminal "Vc2", which supplies the power supply voltage Vcc2. An output terminal of the signal amplification circuit 62a is connected to the output terminal "Vo1", to which a drive signal Vg1, which is amplified from the flow signal VLS2a, will be output. An output terminal of the signal amplification circuit 62b is connected to the output terminal "Vo2", to which a drive signal Vg2, which is amplified from the flow signal VLS2b, will be output.

Through the above configuration, the comparison circuit 61a1 compares the CTL1, which is input to the input terminal "VIN1+", with the reference voltage Vcnt1 which is input to the input terminal "VIN1−". In a case that the CTL1 surpasses the reference voltage Vcnt1, an H level signal will be output. In a case that the CTL1 does not surpass the reference voltage Vcnt1, an L level signal will be output. Based on the output signal from the comparison circuit 61a1, the first input level shift circuit 61b1 generates a flow signal VLS1a, which is level shifted according to the substrate potential Vsub input to the reference potential terminal "Vsub", and outputs this flow signal VLS1a. Then, the first output level shift circuit 61c1 level shifts the VLS1a, output from the first input level shift circuit 61b1 and passed through the simultaneous-on preventing circuit 64, according to the power supply voltage Vcc1 and the substrate potential Vsub, and outputs the flow signal VLS2a. Subsequently, the signal amplification 62a amplifies the flow signal VLS2a, which is output from the first output level shift circuit 61c1, and outputs the drive signal Vg1, which is based on the power supply voltage Vcc1 and the reference potential Vss1, to the output terminal "Vo1". This drive signal Vg1 will be input to a gate terminal of the switch SW4.

Similarly, the control signal CTL2 which is input from the input terminal "VIN2+" will be processed through the comparison circuit 61a2, the second input level shift circuit 61b2, the simultaneous-on preventing circuit 64, the second output level shift circuit 61c2, and the signal amplification circuit of the predrive circuit 32a, and the drive signal Vg2, which is based on the power supply voltage Vcc2 and the reference potential Vss2, will be output.

As mentioned above, in a case that there are combinations of switches SW1 to SW5 and/or transistors Tr1 to Tr7 shown in FIG. 1 or FIG. 9 which should not be turned on simultaneously, the simultaneous-on can be prevented by using the above described predrive circuit 32a.

Next, a case that the predrive circuit 32a is configured as IC (Integrated Circuit) as the fourth embodiment shown in FIG. 18, and this IC-configured predrive circuit 32a is used to configure a circuit equivalent to a part (X-side driving system) of the display device shown in FIG. 9, will be explained below. In addition, integrated circuits used in this embodiment are semiconductor substrates (p-type substrate) to which a p-type impurity is added.

Figure 20:
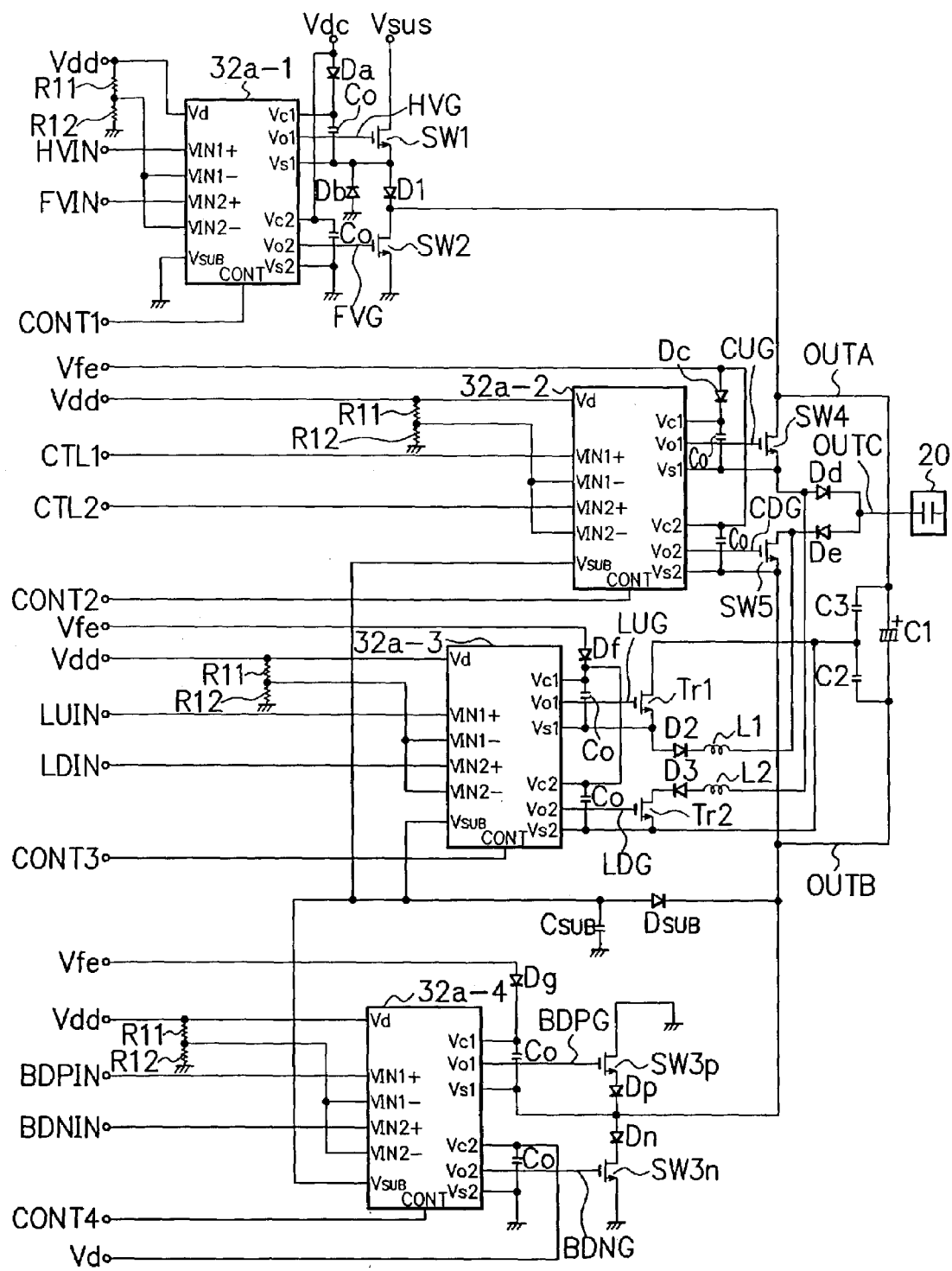

FIG. 20 is a diagram showing a schematic configuration of a driving system which is configured with the IC-configured predrive circuit 32a. The driving system shown in FIG. 20 is equivalent to the X-side driving system which is a part of the driving system shown in FIG. 9. In FIG. 20, predrive circuits 32a-1 to 32a-4 are IC-configured circuits of the predrive circuit 32a shown in FIG. 18. In FIG. 20, the same signals as those shown in FIGS. 9 and 18 are designated the same reference numerals, so that the repeated description will be omitted. The driving system shown in FIG. 20 has some different configuration from the driving system shown in FIG. 9, but its functions are equivalent.

First, input signals and their input destination shown in FIG. 20 will be explained. Vdc is a DC power supply voltage which is approximate to 10 V to 12 V, whose signal line is connected to the power supply terminals "Vc2" of the predrive circuit 32a-1 and 32a-4. The signal line of the Vdc is connected to the power supply terminal "Vc1" of the predrive circuit 32a-1 through a diode Da, where an anode terminal of the diode Da is on the power supply side. HVIN is a control signal to control the switch SW1, whose signal line is connected to the input terminal "VIN1+" of the predrive circuit 32a-1. FVIN is a signal to drive the switch SW2, whose signal line is connected to the input terminal "VIN2+" of the predrive circuit 32a-1. CONT1 to CONT4 are control signals which control whether or not to activate the simultaneous-on preventing circuit, whose signal lines are connected to control signal terminals "CONT" of each of the predrive circuits 32a-1 to 32a-4.

Vfe is a signal which is higher than a potential of the signal line OUTB by the power supply voltage Vcc, whose signal line is connected to the power supply terminal "Vc2" of the predrive circuit 32a-2. Further, the signal line of Vfe is connected to a power supply terminal "Vc1" of the predrive circuit 32a-2 through a diode Dc, power supply terminals "Vc1" and "Vc2" of the predrive circuit 32a-3 through a diode Df, and a power supply terminal "Vc1" of the predrive circuit 32a-3 through a diode Dg. Here, anode terminals of the diode Dc, Df, and Dg are on the power supply side.

CTL1 is the control signal which drives the switch SW4 as described above, whose signal line is connected to the input terminal "VIN1+" of the predrive circuit 32a-2. CTL2 is the control signal which drives the switch SW5 as described above, whose signal line is connected to the input terminal "VIN2+" of the predrive circuit 32a-2. LUIN is a control signal which controls the Tr1, whose signal line is connected to the input terminal "VIN1+" of the predrive circuit 32a-3. LDIN is a control signal which controls the Tr2, whose signal line is connected to the input terminal "VIN2+" of the predrive circuit 32a-3. BDPIN is a control signal which controls a switch SW3p, whose signal line is connected to the input terminal "VIN1+" of the predrive circuit 32a-4. BDNIN is a control signal which controls a switch SW3n, whose signal line is connected to the input terminal "VIN2+" of the predrive circuit 32a-4.

The control signals HVIN, FVIN, LUIN, LDIN, BDPIN, BDNIN, CONT1 to CONT4, CTL1, and CTL2 are signals which are output from the drive control circuit 31' shown in FIG. 9. The sustain source voltage Vsus is a DC voltage connected to a drain terminal of the switch SW1. In each of the predrive circuit 32a-1 to 32a-4, the power supply terminal "Vc1" and the reference potential terminal "Vs1" are connected through a capacitor Co, and the power supply terminal "Vc2" and the reference potential terminal "Vs2" are also connected through another capacitor Co. The power supply voltage Vdd is respectively connected to power supply terminals "Vd" of each of the predrive circuits 32a-1 to 32a-4.

Next, each of the elements and its point of connection which configures the driving system will be explained. Resistors R11 and R12 are connected in series between the power supply voltage Vdd and the GND. Accordingly, a divided voltage of the Vdd is generated at a point of interface between the resistor R11 and R12, which will be a reference of comparison (reference voltage signal) for the comparison circuits 61a1 and 61a2. The point of interface between the resistors R11 and R12 is connected to the input terminals "VIN1−" and "VIN2−" in each of the predrive circuits 32a-1 to 32a-4.

A gate terminal of the switch SW1 is connected to an output terminal "Vo1" of the predrive circuit 32a-1, and this signal line is designated as HVG. A source terminal of the switch SW1 is connected to the reference potential terminal "Vs1" of the predrive circuit 32a-1. The source terminal of the switch SW1 is also connected to a drain terminal of the switch SW2 through a diode D1. An anode terminal of the diode D1 is on the switch SW1 side. A gate terminal of the switch SW2 is connected to the output terminal "Vo2" of the predrive circuit 32a-1, and this signal line is designated as FVG. A source terminal of the switch SW2 and a reference potential terminal "Vs2" of the predrive circuit 32a-1 are connected to the GND.

A point of interface between the source terminal of the switch SW1 and the drain terminal of the switch SW2 are connected to a positive polarity terminal of an electrolytic capacitor C1, and this signal line is designated as OUTA. The signal line OUTA is connected to a drain terminal of the switch SW4. A gate terminal of the switch SW4 is connected to an output terminal "Vo1" of the predrive circuit 32a-2, and this signal line is designated as CUG. A source terminal of the switch SW4 is connected to the reference potential terminal "Vs1" of the predrive circuit 32a-2. The source terminal of the switch SW4 is also connected to a drain terminal of the switch SW5 through diodes Dd and De. Anode terminals of the diodes Dd and De are on the switch SW4 side. A point of interface between a cathode terminal of the diode Dd and the anode terminal of the diode De is connected to the load 20, and this signal line is designated as OUTC.

A gate terminal of the switch SW5 is connected to the output terminal "Vo2" of the predrive circuit 32a-2, and this signal line is designated as CDG. A source terminal of the switch SW5 is connected to a reference potential terminal "Vs2" of the predrive circuit 32a-2, a reference potential terminal "Vs1" of the predrive circuit 32a-4, and a negative polarity terminal of the electrolytic capacitor C1, and this signal line is designated as OUTB. The signal lines OUTA and OUTB are connected through capacitors C2 and C3 in series. The signal lines OUTA and OUTB are also connected through the electrolytic capacitor C1, so the electrolytic capacitor C1, the capacitors C2 and C3 connected in series are in a relation of parallel connection.

The signal line OUTB and the reference potential terminal "Vsub" of the predrive circuits 32a-2 to 32a-4 are connected through a diode Dsub. The cathode terminal of the diode Dsub is connected to the signal line OUTB, and a point of interface between the cathode terminal of the diode Dsub and the reference potential terminal "Vsub" of the predrive circuit 32a-2 to 32a-4 are connected to the GND through a capacitor Csub. The substrate potential Vsub is formed by the capacitor Csub and the diode Dsub.

A point of interface between the source terminal of the switch SW4 and the anode terminal of the diode Dd is connected to a source terminal of the Tr1 through a coil L1 and a diode D2. A point of interface between the source terminal of the Tr1 and an anode terminal of the diode D2 is connected to a reference potential terminal "Vs1" of the predrive circuit 32a-3. A gate terminal of the Tr1 is connected to an output terminal "Vo1" of the predrive circuit 32a-3, and this signal line is designated as LUG. A drain terminal of the Tr1 is connected to a source terminal of the Tr2 and the reference potential terminal "Vs2" of the predrive circuit 32a-3.

A point of interface between the drain terminal of the Tr1 and the source terminal of the Tr2 is connected to a point of interface between the capacitor C2 and the capacitor C3 connected in series. A point of interface between a drain terminal of the switch SW5 and a cathode terminal of the diode De is connected to a drain terminal of the Tr2 through a coil L2 and a diode D3. A gate terminal of the Tr2 is connected to an output terminal "Vo2" of the predrive circuit 32a-3, and this signal line is designated as LDG.

A gate terminal of the switch SW3p is connected to an output terminal "Vo1" of the predrive circuit 32a-4, and this signal line is designated as BDPG. A source terminal of the switch SW3p is connected to a drain terminal of the switch SW3n through diodes Dp and Dn. A gate terminal of the switch SW3n is connected to an output terminal "Vo2" of the predrive circuit 32a-4, and this signal line is designated as BDNG. A drain terminal of the switch SW3p, a source terminal of the switch SW3n, and the reference potential terminal "Vs2" of the predrive circuit 32a-4 are connected to GND. A point of interface between a cathode terminal of the diode Dp and an anode terminal of the diode Dn is connected to the signal line OUTB.

The above-mentioned switches SW1, SW2, SW3p, SW3n, SW4, SW5, Tr1, and Tr2 are n-channel power MOSFETs. However, the switches are not limited to this type, so the IGBT, etc., can be used. In FIG. 9, the switch SW3 is configured with an n-channel power MOSFET and a p-channel power MOSFET, whereas the switches SW3p and SW3n are both n-channel power MOSFETs in FIG. 20. By using the n-channel power MOSFET for the switch SW3p whose on-resistance is lower than the p-channel power MOSFET, power consumption can be reduced.

Next, an operation of the driving system which has been described with reference to FIG. 20 will be explained.

Figure 21:
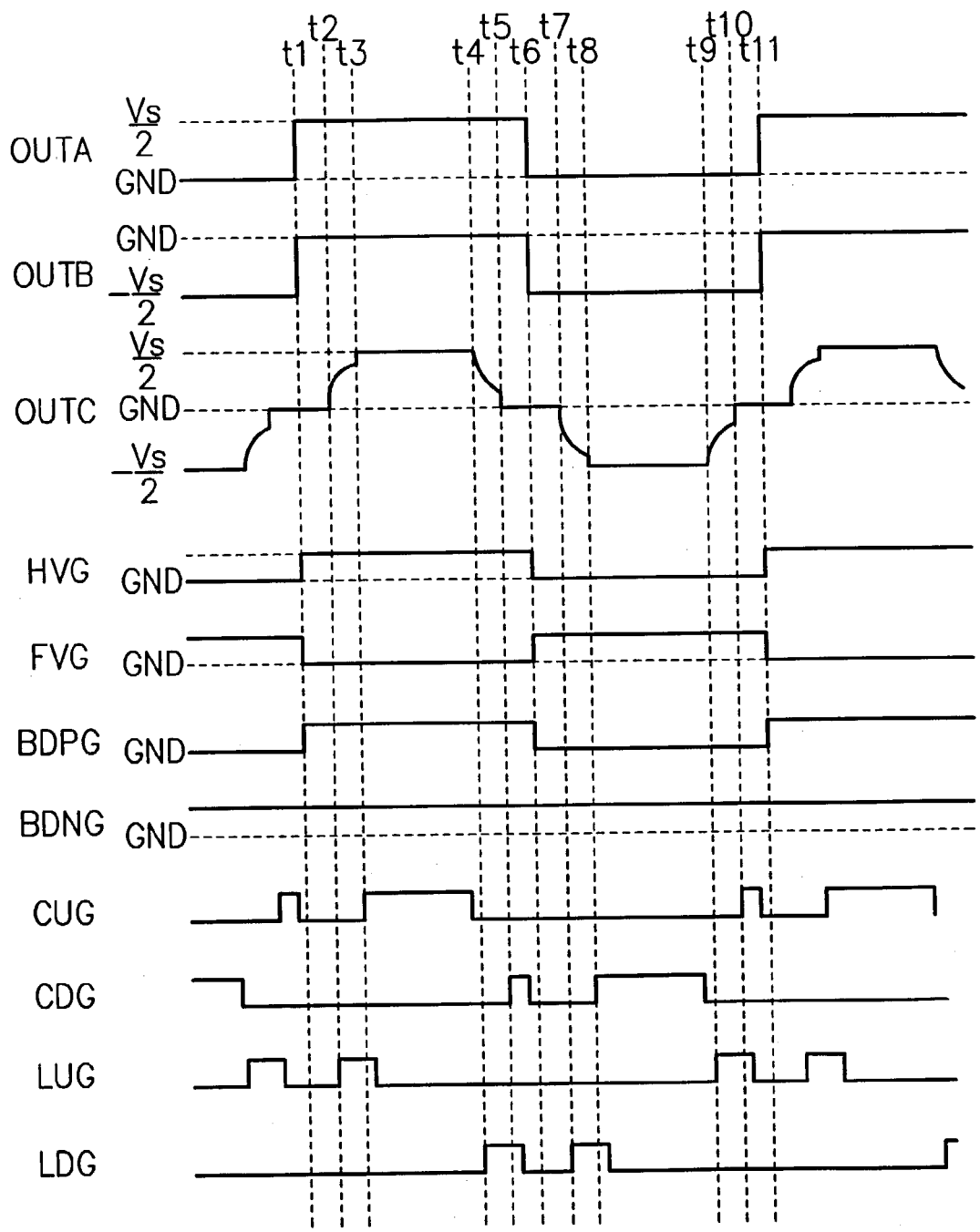
FIG. 21 is a diagram showing operational waveforms for explaining an operation of the driving system shown in FIG. 20 during a sustain discharge period.

FIG. 21 is a diagram showing operational waveforms for explaining the operation of the driving system shown in FIG. 20 during the sustain discharge period. During the sustain discharge period, the driving system shown in FIG. 20 repeatedly conducts sustaining discharge, applying voltage (+Vs/2 to −Vs/2) to the common electrode X, by operations of t1 through t11 shown in FIG. 21 as one cycle. FIG. 21 is showing signal waveforms of the signal lines OUTA, OUTB, OUTC, HVG, FVG, BDPG, BDNG, CUG, CDG, LUG, and LDG.

First, as a control signal HVIN, a signal identical to the signal waveform of the signal line HVG shown in FIG. 21 will be input to the input terminal "VIN1+" of the predrive circuit 32a-1. Then, a signal shown in FIG. 21 corresponding to the power supply voltage Vdc and the reference potential Vss will be output to the signal line HVG, which is connected to the output terminal "Vo1" of the predrive circuit 32a-1. Consequently, the switch SW1 will be turned on at t1 and turned off at t6. Additionally, as a control signal FVIN, a signal identical to the signal waveform of the signal line FVG shown in FIG. 21 will be input to the input terminal "VIN2+" of the predrive circuit 32a-1. Then, a signal shown in FIG. 21 corresponding to the power supply voltage Vdc and the reference potential GND will be output to the signal line FVG which is connected to the output terminal "Vo2" of the predrive circuit 32a-1. Consequently, the switch SW2 will be turned off at t1 and turned on at t6. By turning on/off the switches SW1 and SW2 as just described, the signal line OUTA rises to Vs/2 at t1 and falls from Vs/2 to GND at t6.

As a control signal CTL1, a signal identical to the signal waveform of the signal line CUG shown in FIG. 21 will be input to the input terminal "VIN1+" of the predrive circuit 32a-2. Then, a signal shown in FIG. 21 corresponding to the power supply voltage Vfe will be output to the signal line CUG which is connected to the output terminal "Vo1" of the predrive circuit 32a-2. Consequently, the switch SW4 will be turned on at t3 and turned off just before t4, and then it will be turned on at t10 and turned off just before t11. Additionally, as a control signal CTL2, a signal identical to the signal waveform of the signal line CDG shown in FIG. 21 will be input to the input terminal "VIN2+" of the predrive circuit 32a-2. Then, a signal shown in FIG. 21 corresponding to the power supply voltage Vfe will be output to the signal line CDG which is connected to the output terminal "Vo2" of the predrive circuit 32a-2. Consequently, the switch SW5 will be turned on at t3 and turned off just before t4, and then it will be turned on at t10 and turned off just before t11.

As a control signal LUIN, a signal identical to the signal waveform of the signal line LUG shown in FIG. 21 will be input to the input terminal "VIN1+" of the predrive circuit 32a-3. Then, a signal shown in FIG. 21 corresponding to the power supply voltage Vfe will be output to the signal line LUG which is connected to the output terminal "Vo1" of the predrive circuit 32a-3. Consequently, the Tr1 will be turned on at t2 and turned off just after t3, and then it will be turned on at t9 and turned off just after t10. Additionally, as a control signal LDIN, a signal identical to the signal waveform of the signal line LDG shown in FIG. 21 will be input to the input terminal "VIN2+" of the predrive circuit 32a-3. Then, a signal shown in FIG. 21 corresponding to the power supply voltage Vfe will be output to the signal line LDG which is connected to the output terminal "Vo2" of the predrive circuit 32a-3. Consequently, the Tr2 will be turned on at t4 and turned off just after t5, and then it will be turned on at t7 and turned off just after t8. In addition, the above-mentioned "just before" and "just after" means 0.1 µs to 1 µs.

As a control signal BDPIN, a signal identical to the signal waveform of the signal line BDPG shown in FIG. 21 will be input to the input terminal "VIN1+" of the predrive circuit 32a-4. Then, a signal shown in FIG. 21 corresponding to the power supply voltage Vfe will be output to the signal line BDPG which is connected to the output terminal "Vo1" of the predrive circuit 32a-4. Consequently, the switch SW3p will be turned on at t1 and turned off at t6. Additionally, as a control signal BDNIN, a signal identical to the signal waveform of the signal line BDNG shown in FIG. 21 will be input to the input terminal "VIN2+" of the predrive circuit 32a-4. Then, the signal shown in FIG. 21 corresponding to the power supply voltage Vdc and reference potential GND will be output to the signal line BDNG which is connected to the output terminal "Vo2" of the predrive circuit 32a-4. Consequently, the switch SW3n will be turned on all the time.

By turning on/off the switches SW4, SW5, Tr1, Tr2, SW3p, and SW3n, the signal line OUTB rises from −Vs/2 to GND at t1 and falls from GND to −Vs/2 at t6. The signal line OUTC rises from GND to Vs/2 between t2 and t3 and falls from Vs/2 to GND between t4 and t5, and then it falls from GND to −Vs/2 between t7 and t8 and rises from −Vs/2 to GND between t9 and t10. The sustaining discharge is conducted by applying these signals to the common electrode X.

In the above embodiment, the potential Vsub which is supplied to the reference potential terminal "Vsub" of each of the predrive circuits 32a-1 to 32a-4 is the minimum potential (−Vs/2) of the potential Vss (second reference potential), but the Vsub is not limited to this potential. In other words, the potential Vsub which is supplied to the reference potential terminal "Vsub" of each of the predrive circuits 32a-1 to 32a-4 from the rectifying circuit 63 is controlled to be lower than a potential which is supplied to the reference potential terminal "Vs1" and "Vs2". Accordingly, abnormal current flows to the parasitic diode existing between a p-type substrate and elements such as switches SW4, SW5, etc., can be prevented. In addition, the time constant circuit 51 and the ramp wave generating circuit 53 are configured outside of the predrive circuit 32a in the above described embodiment, but they can be configured inside the predrive circuit as well.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As described hitherto, the predrive circuit according to the present invention is so characterized as to drive an output element having a second reference potential which is different from a first reference potential of an input signal. The predrive circuit comprises a signal transmit circuit which converts the input signal having the first reference potential to a signal corresponding to the second reference potential and outputs the signal to the output element. Consequently, when the reference potential of the input signal is different from the reference potential of the output element as an object to be driven, the predrive circuit can output a signal having the reference potential corresponding to the second reference potential, which is the reference potential of the output element, by processing through the signal transmit circuit.

Therefore, by adopting the predrive circuit of the present invention, when the reference potential of the input signal is different from the reference potential of the output element, the input signal can be stably transmit to the output element. Namely, even if the input signal having the reference potential of 0V with 3V to 5V amplitude turns to high voltage, the predrive circuit can stably transmit the input signal for driving the output element.

In addition, the drive circuit of the present invention comprises the output element having the second reference potential which is different from the first reference potential of the input signal, and the signal transmit circuit which converts the input signal having the first reference potential to the signal corresponding to the second reference potential and outputs the signal to the output element. Consequently, when the reference potential of the input signal is different from the reference potential of the output element as the object to be driven, the predrive circuit can output the signal having the reference potential corresponding to the second reference potential, which is the reference potential of the output element, by processing through the signal transmit circuit.

Further, the display device of the present invention can stably drive the driving circuit, when the input signal of the driving circuit comprising the predrive circuit is different from the reference potential of the output element side. Accordingly, the driving voltage can be appropriately configured, and the image quality will be improved.

Furthermore, the predrive circuit according to the present invention is so characterized as to drive the output element having the second reference potential which is different from the first reference potential of the input signal. The predrive circuit comprises a comparison circuit which compares the input signal with a reference voltage signal as a reference for comparison, an input level shift circuit which converts the input signal having the first reference potential, according to a result of comparison, to a second signal corresponding to the substrate potential and outputs this second signal, an output level shift circuit which converts the second signal output from the input level shift circuit to a third signal corresponding to the output power supply voltage and outputs this third signal, and a signal amplification circuit which amplifies the third signal output from the output level shift circuit to a drive signal for driving the output element. Consequently, when the reference potential of the input signal is different from the reference potential of the output element, such as a negative voltage, the first reference potential of the input signal is not necessary to be the substrate potential of the input side on the predrive circuit since the input signal will be processed by the comparison circuit.

Therefore, the substrate potential of the input side on the predrive circuit can be converted to the potential which is corresponding to the second reference potential of the output side, so that the orthodromic potential would not occur to the parasitic diode of the predrive circuit. In other words, the abnormal current to the parasitic diode can be prevented, so that the probability of the predrive circuit malfunction can be decreased.

What is claimed is:

1. A predrive circuit for driving an output element having a second reference potential which is different from a first reference potential of an input signal, comprising:
   a flow signal transmit circuit converting the input signal having the first reference potential to a signal corresponding to the second reference potential and transmitting the signal to said output element, said flow signal transmit circuit comprising:
      a level shift power supply circuit supplying a level shift potential based on a prescribed power supply voltage and the second reference potential;
      a first level shift circuit outputting a first flow signal based on the input signal, the first flow signal corresponding to the level shift potential output from said level shift power supply circuit; and
      second level shift circuit outputting a second flow signal based on the first flow signal output from said first level shift circuit, the second flow signal corresponding to the second reference potential.

2. The predrive circuit according to claim 1, said level shift power supply circuit comprising:
   a level shift switch comprising a first terminal connected to a constant voltage to supply the prescribed power supply voltage and a second terminal connected to potential supply terminals which are provided in said first level shift circuit and said second level shift circuit; and
   a level shift capacitor, wherein one terminal is connected to a point of interface between said level shift switch and the potential supply terminals which are provided in said first level shift circuit and said second level shift circuit, and another terminal is connected to a reference potential line to supply the second reference potential.

3. The predrive circuit according to claim 2, wherein said level shift switch is a diode, whose anode terminal is the first terminal, and whose cathode terminal is the second terminal.

4. The predrive circuit according to claim 2, wherein said level shift switch is turned on when the level shift potential is lower than the prescribed power supply voltage thereby charging said level shift capacitor, and said level shift switch is turned off when the level shift potential is higher than the prescribed power supply voltage thereby sustaining charged voltage in said level shift capacitor.

5. A drive circuit, comprising:
   an output element having a second reference potential which is different from a first reference potential of an input signal; and
   a signal transmit circuit converting the input signal having the first reference potential to a signal corresponding to the second reference potential and transmitting the signal to said output element, said signal transmit circuit comprising:
      a level shift power supply circuit supplying a level shift potential based on a prescribed power supply voltage and the second reference potential;
      a first level shift circuit outputting a first signal based on the input signal, the first signal corresponding to the level shift potential output from said level shift power supply circuit; and
      a second level shift circuit outputting a second signal based on the first signal output from said first level shift circuit, the second signal corresponding to the second reference potential.

6. A predrive circuit for driving an output element having a second reference potential which is different from a first reference potential of an input signal, comprising:
   a comparison circuit comparing the input signal having the first reference potential with a reference voltage signal having a voltage value as a reference for comparison;
   an input level shift circuit converting the input signal having the first reference potential, based on a result of comparison from said comparison circuit, to a second signal corresponding to a substrate potential generated from the second reference potential, thereby outputting the second signal;
   an output level shift circuit converting the second signal output from said input level shift circuit to a third signal corresponding to an output power supply voltage, thereby outputting the third signal; and
   a signal amplification circuit amplifying the third signal output from said output level shift circuit, thereby outputting a drive signal driving said output element.

7. The predrive circuit according to claim 6, wherein the substrate potential is lower than the second reference potential.

8. The predrive circuit according to claim 6, wherein the output power supply voltage is a voltage value having a constant potential difference from the second reference potential.

9. The predrive circuit according to claim 6, wherein said signal amplification circuit amplifies the third signal output from said output level shift circuit, according to the second reference potential.

10. The predrive circuit according to claim 6, further comprising a substrate potential generating circuit generating the substrate potential when the second reference potential varies, by rectifying the second reference potential to a minimum potential of variations of the second reference potential.

11. The predrive circuit according to claim 6, wherein the first reference potential is 0(zero) V, and the voltage value of the reference voltage signal is between a maximum value of the input signal and 0(zero) V.

12. The predrive circuit according to claim 6, further comprising a time constant circuit on an input side of said comparison circuit adjusting a propagation delay time of the input signal, when the input signal is supplied through said time constant circuit, by adjusting a time constant of said time constant circuit or the voltage value of the reference voltage signal.

13. The predrive circuit according to claim 6, further comprising a ramp wave generating circuit generating ramp wave on the input side of said comparison circuit, thereby adjusting a propagation delay time of the input signal, when the input signal is supplied through said ramp wave generating circuit, by adjusting a slope of the ramp wave or the voltage value of the reference voltage signal.

14. The predrive circuit according to claim 6, wherein said comparison circuit, said input level shift circuit, said output level shift circuit, and said signal amplification circuit are formed on one integrated circuit.

15. The predrive circuit according to claim 14, wherein said integrated circuit is formed on a semiconductor substrate to which a p-type impurity is added.

16. A predrive circuit for driving a first output element having a second reference potential against a first reference potential of a first input signal, and a second output element having a third fourth reference potential against the first third reference potential of a second input signal, comprising:
- a first comparison circuit comparing the first input signal having the first reference potential with a first reference voltage signal having a voltage value as a reference for comparison;
- a first input level shift circuit converting the first input signal having the first reference potential, based on a result of comparison from said first comparison circuit, to a second signal corresponding to a substrate potential generated from the second reference potential and the third reference potential, thereby outputting the second signal;
- a first output level shift circuit converting the second signal output from said first input level shift circuit to a third signal corresponding to a first output power supply voltage for said first output element, thereby outputting the third signal;
- a first signal amplification circuit amplifying the third signal output from said first output level shift circuit, thereby outputting a drive signal for driving said first output element;
- a second comparison circuit comparing the second input signal having the first reference potential with a second reference voltage signal having a voltage value as a reference for comparison;
- a second input level shift circuit converting the second input signal having the first reference potential, based on a result of comparison from said second comparison circuit, to a fourth signal corresponding to the substrate potential, thereby outputting the fourth signal;
- a second output level shift circuit converting the fourth signal output from said second input level shift circuit to a fifth signal corresponding to the a second power supply voltage for said second output element, thereby outputting the fifth signal; and
- a second signal amplification circuit amplifying the fifth signal output from said second output level shift circuit, thereby outputting a drive signal driving said second output element.

17. The predrive circuit according to claim 16, wherein the substrate potential is lower than the second reference potential and the third reference potential.

18. The predrive circuit according to claim 16, wherein the first output power supply voltage is a voltage value which is constant from the second reference potential, and the second output power supply voltage is a voltage value which is constant from the third reference potential.

19. The predrive circuit according to claim 16, wherein said first signal amplification circuit amplifies the third signal output from said first output level shift circuit according to the second reference potential, and said second signal amplification circuit amplifies the fifth signal output from said second output level shift circuit according to the third reference potential.

20. The predrive circuit according to claim 16, further comprising a substrate potential generating circuit generating the substrate potential when the second reference potential and the third reference potential vary, by rectifying the second reference potential and the third reference potential to minimum potentials of variations of the second reference potential and the third reference potential.

21. The predrive circuit according to claim 16, wherein the first reference potential is 0(zero) V, the voltage value of the first reference voltage signal is between a maximum value of the first input signal and 0(zero) V, and the voltage value of the second reference voltage signal is between a maximum value of the second input signal and 0(zero) V.

22. The predrive circuit according to claim 16, wherein propagation delay times of the first input signal and the second input signal are adjusted, when the first input signal and the second input signal are supplied through a time constant circuit, by adjusting a time constant of said time constant circuit or the voltage values of the first reference voltage signal and the second reference voltage signal.

23. The predrive circuit according to claim 16, wherein propagation delay times of the first input signal and the second input signal, when the first input signal and the second input signal are supplied through a ramp wave generating circuit, by adjusting a slope of the ramp wave or the voltage values of the first reference voltage signal and the second reference voltage signal.

24. The predrive circuit according to claim 16, further comprising a simultaneous activation preventing circuit preventing an overlap between a timing of outputting a signal from said first signal amplification circuit to activate said first output element and a timing of outputting a signal from said second signal amplification circuit to activate said second output element.

25. The predrive circuit according to claim 24, wherein said simultaneous activation preventing circuit has two input terminals respectively connected to output terminals of said first input level shift circuit and said second input level shift circuit, and two output terminals respectively connected to input terminals of said first output level shift circuit and said second output level shift circuit.

26. The predrive circuit according to claim 16, wherein said first comparison circuit, said second comparison circuit, said first input level shift circuit, said second input level shift circuit, said first output level shift circuit, said second output level shift circuit, said first signal amplification circuit, and said second signal amplification circuit, are formed on one integrated circuit.

27. The predrive circuit according to claim 26, wherein said integrated circuit is formed on a semiconductor substrate to which a p-type impurity is added.

28. A display device, comprising:
- plural electrodes applying voltages in display cells;
- plural output elements supplying voltages, which change for each of said electrodes;
- a drive control circuit outputting a control signal which has a first reference potential; and
- plural predrive circuits comprising
    - a comparison circuit comparing the control signal having a first reference potential with a reference voltage signal having a voltage value as a reference for comparison when the first reference potential is different from second reference potentials of said output elements,
    - an input level shift circuit converting the control signal having the first reference potential, based on a result of comparison from said comparison circuit, to a second signal corresponding to a substrate potential generated from the second reference potential, thereby outputting the second signal,
    - an output level shift circuit converting the second signal output from said input level shift circuit to a third signal corresponding to an output power supply voltage, thereby outputting the third signal, and
    - a signal amplification circuit amplifying the third signal output from said output level shift circuit, thereby outputting signals driving said output elements.

29. A display device, comprising:
- a sustain circuit comprising a first output element for outputting a sustain pulse of positive voltage, and a second output element for outputting a sustain pulse of negative voltage;
- a drive control circuit outputting a control signal which has a first reference potential; and
- plural predrive circuits comprising
    - a comparison circuit comparing the control signal having the first reference potential with a reference voltage signal having a voltage value as a reference for comparison when the first reference potential is different from second reference potentials of said first output element and said second output element,
    - an input level shift circuit converting the control signal having the first reference potential, based on a result of comparison from said comparison circuit, to a second signal corresponding to a substrate potential generated from the second reference potential, thereby outputting the second signal,
    - an output level shift circuit converting the second signal output from said input level shift circuit to a third signal corresponding to an output power supply voltage, thereby outputting the third signal, and
    - a signal amplification circuit amplifying the third signal output from said output level shift circuit, thereby outputting signals driving said first output element and said second output element.

30. A display device for driving plural electrodes as capacitive loads to apply voltages in display cells, comprising:
- a first switch whose one terminal is connected to a power supply voltage, which changes from positive voltage to negative voltage;
- a second switch connecting said first switch to ground;
- a third switch connecting a point of interface between said first switch and said second switch to said capacitive load;
- a fourth switch whose one terminal is connected to ground;
- a fifth switch connecting another terminal of said fourth switch to said capacitive load;
- a drive control circuit outputting a control signal which has a first reference potential; and
- plural predrive circuits comprising
    - a comparison circuit comparing the control signal having the first reference potential with a reference voltage signal having a voltage value as a reference for comparison, in a state that said third switch and said fifth switch are configured by field effect transistors, when the first reference potential is different from second reference potentials of said third switch and said fifth switch,
    - an input level shift circuit converting the control signal having the first reference potential, based on a result of comparison from said comparison circuit, to a second signal corresponding to a substrate potential generated from the second reference potential, thereby outputting the second signal,
    - an output level shift circuit converting the second signal output from said input level shift circuit to a third signal corresponding to an output power supply voltage, thereby outputting the third signal, and
    - a signal amplification circuit amplifying the third signal output from said output level shift circuit, thereby outputting signals driving said third switch and said fifth switch.

31. The display device according to claim 30, further comprising:
- a sixth switch connected to a point of interface between said capacitive load and said third switch through a first coil;
- a seventh switch connected to a point of interface between said capacitive load and said fifth switch through a second coil; and
- plural predrive circuits comprising
    - a comparison circuit comparing the control signal having the first reference potential with a reference voltage signal having a voltage value as a reference for comparison, in a state that said sixth switch and said seventh switch are configured by field effect transistors, when the first reference potential is different from second reference potentials of said sixth switch and said seventh switch,
    - an input level shift circuit converting the control signal having the first reference potential, based on a result of comparison from said comparison circuit, to a second signal corresponding to a substrate potential generated from the second reference potential, thereby outputting the second signal,
    - an output level shift circuit converting the second signal output from said input level shift circuit to a third signal corresponding to an output power supply voltage, thereby outputting the third signal, and
    - a signal amplification circuit amplifying the third signal output from said output level shift circuit, thereby outputting signals driving said sixth switch and said seventh switch.

* * * * *